(12) United States Patent
Sherrill et al.

(10) Patent No.: US 11,718,526 B2
(45) Date of Patent: Aug. 8, 2023

(54) SYSTEMS AND METHODS FOR HIGH YIELD AND HIGH THROUGHPUT PRODUCTION OF GRAPHENE

(71) Applicant: General Graphene Corporation, Knoxville, TN (US)

(72) Inventors: Vig Sherrill, Kingston, TN (US); Mira Baraket, Oak Ridge, TN (US); Richard Philpott, Cambridge (GB)

(73) Assignee: General Graphene Corporation, Knoxville, TN (US)

( * ) Notice: Subject to any disclaimer, the term of this patent is extended or adjusted under 35 U.S.C. 154(b) by 0 days.

(21) Appl. No.: 18/008,457

(22) PCT Filed: Jun. 27, 2022

(86) PCT No.: PCT/US2022/035043
§ 371 (c)(1),
(2) Date: Dec. 6, 2022

(65) Prior Publication Data
US 2023/0192494 A1 Jun. 22, 2023

Related U.S. Application Data

(60) Provisional application No. 63/292,533, filed on Dec. 22, 2021.

(51) Int. Cl.
*C01B 32/182* (2017.01)
(52) U.S. Cl.
CPC .................................. *C01B 32/182* (2017.08)
(58) Field of Classification Search
CPC ... C01B 32/182; C01B 32/184; C01B 32/186; C01B 32/188; C01B 32/19;
(Continued)

(56) References Cited

U.S. PATENT DOCUMENTS 10,533,264 B1 * 1/2020 Sherrill .................. C30B 25/14
2012/0258311 A1 10/2012 Hong et al.
(Continued)

FOREIGN PATENT DOCUMENTS

| CN | 106693893 A | 5/2017 |
|---|---|---|
| CN | 109112499 A | 1/2019 |

(Continued)

OTHER PUBLICATIONS

Jennifer Chu, "A graphene roll-out", Apr. 17, 2018, 5 Pages.
(Continued)

*Primary Examiner* — Daniel C. McCracken
(74) *Attorney, Agent, or Firm* — EcoTech Law Group, P.C.

(57) ABSTRACT

Systems and method for producing graphene on a substrate are described. Certain types of exemplar systems include lateral arrangements of a substrate gas scavenging environment and an annealing environment. Certain other types of exemplar systems include lateral arrangements of a graphene producing environment and a cooling environment, which cools the graphene produced on the substrate. Yet other types of exemplar systems include lateral arrangements of a localized annealing environment, localized graphene producing environment and a localized cooling environment inside the same enclosure.

Certain type of exemplar methods for producing graphene on a substrate include scavenging a first portion of the substrate and preferably, contemporaneously annealing a second portion of the substrate. Certain other type of exemplar methods for producing graphene include novel annealing techniques and/or implementing temperature profiles and gas flow rate profiles that vary as a function of lateral distance and/or cooling graphene after producing it.

20 Claims, 22 Drawing Sheets

(58) Field of Classification Search
CPC ... C01B 32/192; C01B 32/194; C01B 32/196; C01B 32/198; C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23

See application file for complete search history.

(56) References Cited

U.S. PATENT DOCUMENTS

| | | | | |
|---|---|---|---|---|
| 2013/0071565 | A1* | 3/2013 | Malecki | C23C 16/455 118/712 |
| 2013/0122220 | A1* | 5/2013 | Won | C01B 32/184 118/724 |
| 2013/0187097 | A1 | 7/2013 | Hong et al. | |
| 2014/0193574 | A1 | 7/2014 | Yeh | |
| 2015/0307358 | A1* | 10/2015 | Yoon | C01B 32/186 427/249.1 |
| 2016/0068397 | A1* | 3/2016 | Su | C23C 16/452 118/718 |
| 2016/0221828 | A1* | 8/2016 | Shibuya | C01B 32/15 |
| 2016/0289826 | A1* | 10/2016 | Boulanger | B01J 19/1862 |
| 2017/0175254 | A1 | 6/2017 | Jouvray et al. | |

FOREIGN PATENT DOCUMENTS

| | | |
|---|---|---|
| CN | 109970051 A | 7/2019 |
| CN | 212334600 U | 1/2021 |
| CN | 213446236 U | 6/2021 |
| GB | 2571573 A | 9/2019 |
| KR | 20130107117 A | 10/2010 |
| KR | 101938874 B1 | 1/2019 |
| WO | 2021168134 A1 | 8/2021 |

OTHER PUBLICATIONS

B. Gurzeda et al., "Graphene material prepared by thermal reduction of the electrochemically synthesized graphite oxide", RSC Adv., 2016, 6, 63058, 6 Pages.

International Search Report and Written Opinion dated Nov. 15, 2022 received for PCT Application No. PCT/US22/35043, 17 Pages.

* cited by examiner

SYSTEMS AND METHODS FOR HIGH YIELD AND HIGH THROUGHPUT PRODUCTION OF GRAPHENE

RELATED APPLICATION

This patent application is a National Stage Application of PCT/US22/35043 filed on Jun. 27, 2022, which claims the priority from U.S. provisional patent application No. 63/292,533, filed on Dec. 22, 2021, which are incorporated herein by reference for all purpose.

FIELD

The present teachings and arrangements relate generally to novel systems and methods for realizing high throughput and high yield for graphene formation. More particularly, the present teachings and arrangements relate to continuously, and in a controlled manner, realizing high throughput and high yield for graphene formation used in different types of commercial applications.

BACKGROUND

Graphene is an ultrathin material that provides the advantages of a material that enjoys a large surface for processing to volume ratio. In the energy storage industry, graphene is deemed as a desirable material for use in applications such as batteries, super-capacitors, and fuel-cells for its high storage capacity and ability to rapidly charge. Other applications involving graphene include membranes, sensors, anti-corrosion coatings and paint, flexible displays, faster and efficient electronics, solar panels, DNA sequencing and drug delivery.

Graphene may be grown batchwise or in a continuous mode of operation on a substrate. For commercial scale applications of graphene, however, the continuous mode of operation is considered promising as it has the potential to produce the requisite large amounts of graphene. Regardless of batchwise or continuous, conventional approaches to producing graphene rely upon multiple discrete treatment units, which are isolated from each other. Further, each discrete unit is dedicated to and/or optimized for carrying out a particular type of treatment involved in the graphene growing process. In the conventional arrangements of multiple discrete units, typically only one type of treatment carried out in one type of discrete unit does not negatively impact other types of treatment, which are better implemented or optimized in other types of discrete units.

Unfortunately, the conventional continuous graphene producing systems and processes suffer from several drawbacks. By way of example, an arrangement of multiple discrete units, deployed in a continuous mode of operation, represents a significant capital cost. Not only is each discrete unit specialized with unique features for a particular type of treatment, but also requires different types of input provisions and output provisions to create a desired processing environment. As another example, reaching steady state is an arduous and time-consuming task where multiple or single discrete units are involved. As yet another example, the graphene manufacturer is forced to deal with different equipment manufacturers for procuring, servicing and maintaining spare parts of the different specialized components involved in the different types of discrete units.

As a result, systems and processes are needed for effectively and continuously producing graphene without suffering from the drawbacks of their conventional counterparts.

SUMMARY

To achieve the foregoing, the present arrangements and teachings offer novel systems and methods for effectively and continuously producing graphene inside a single, continuous, and laterally extending chamber. During an assembled and operative state, this chamber relies upon repetitive components to create therewithin different localized treatment conditions, each dedicated to carrying out a particular type of treatment involved in graphene formation. In this configuration of the present arrangements, a physical barrier or use of multiple discrete treatment units is not necessary, thereby obviating the drawbacks associated therewith and encountered when using conventional continuous graphene producing systems and processes.

In one aspect, the present arrangements provide systems for forming graphene. One exemplar of such system comprises: (1) a substrate holder designed to hold a substrate sheet; (2) one or more tunnels disposed adjacent to the substrate holder; and (3) multiple processing sub-enclosures disposed laterally adjacent to one or more of the tunnels such that the substrate holder continuously laterally extends from inside one or more of the tunnels into the multiple processing sub-enclosures.

In this configuration, multiple scavenging gas outlets are disposed inside one or more of the tunnels. Further, at least some of the scavenging gas outlets (referred to herein as "angularly-oriented scavenging gas outlets") are oriented at an angle with respect to an axis that is perpendicular to the substrate holder. As a result, the angularly-oriented scavenging gas outlets are designed to provide an angular stream of a substrate gas scavenging composition to contact and scavenge substrate gas in and around the substrate sheet. Stated another way, the angularly-oriented scavenging gas outlets, in an operational state, create an incident flow rate of said substrate gas scavenging composition that is incident upon the substrate sheet. These and other types of scavenging gas outlets may be part of one or more scavenging gas distribution systems that deliver substrate gas scavenging composition inside one or more of the tunnels.

The exemplar arrangement also contemplates using multiple gas distribution subsystems in connection with at least one processing sub-enclosure. The multiple gas distribution subsystems are communicatively coupled, at one end, to one or more reservoirs having stored therein the same type of component gases that form an annealing gas composition. At another end, the multiple gas distribution subsystems are communicatively coupled to at least one processing sub-enclosure. In this arrangement, multiple gas distribution subsystems are designed to dispense the annealing gas composition from one or more reservoirs of component gases to locations inside at least one processing sub-enclosure. A sub-enclosure receiving an annealing gas may be thought of as an "annealing sub-enclosure."

The exemplar arrangement also envisions providing heat inside the "annealing sub-enclosure" or a processing sub-enclosure, which requires heat for implementing a particular type of processing of the substrate during graphene formation. Accordingly, the exemplar arrangement includes one or more heat sources disposed laterally adjacent to at least one of the processing sub-enclosures or one annealing sub-enclosure. This placement allows one or more of the heat sources to provide heat inside at least one of the adjacent processing sub-enclosures or the adjacent annealing sub-enclosure.

In absence of an effective gas or a mechanical barrier within and between one or more of the tunnels and at least one of the processing sub-enclosures (e.g., an annealing sub-enclosure proximate and adjacent to a tunnel), the exemplar arrangement for forming graphene allows heat and the annealing gas composition, present inside at least one of the processing sub-enclosures (e.g., an annealing sub-enclosure), to flow into and facilitate scavenging inside one or more of the tunnels. It is noteworthy that conventional systems of graphene formation, that typically include barriers or different types of discrete units, to attempt substrate processing, simply do not provide this advantage of the present systems.

Although not necessary, the present systems for forming graphene may further comprise one or more scavenging gas stream generating subsystems which includes the above-mentioned angularly oriented scavenging gas outlets. Each of the scavenging gas stream generating subsystems may also include multiple scavenging gas outlets that are oriented in a different direction. By way of example, some of the multiple scavenging gas outlets are oriented in a direction that is parallel to the substrate holder. These scavenging gas outlets may be thought of as "laterally-oriented scavenging gas outlets" and, as the name suggests, are designed to generate a laterally flowing substrate gas scavenging composition. One of the primary functions of the laterally flowing substrate gas scavenging composition is to evacuate undesired contents, such as heat and different type of contaminants, that may be present inside the tunnels. As a result, the present teachings recognize that multiple streams of such laterally flowing substrate gas scavenging composition may be more effective for contaminant removal.

To this end, the present arrangements contemplate another exemplar design in which a collection of some of the multiple scavenging gas outlets are arranged at corresponding locations inside one or more of the tunnels to form multiple sets of the correspondingly located scavenging gas outlets. Multiple sets of the correspondingly located and "laterally-oriented scavenging gas outlets" are designed to generate multiple continuously and longitudinally flowing substrate gas scavenging compositions in the direction that is parallel to the substrate holder. Further, the multiple streams of continuously and longitudinally flowing substrate gas scavenging composition span across and evacuate contents inside multiple tunnels. Moreover, the present teachings also recognize that these streams of substrate gas scavenging composition effectively serve as a protective barrier, preventing contaminants present inside the multiple tunnels from contacting the substrate sheet. Thus, the different orientations of the scavenging gas outlets discussed above are, preferably, part of one or more scavenging gas stream generating subsystems that, in an operative state, implement preventive measures, inside the tunnels, against contamination and thermal degradation of the substrate and components involved in scavenging of the substrate. This translates into not only high yield and high throughput for graphene formation, but also significantly reduces maintenance costs of the present graphene producing systems.

The present arrangements, similarly, offer alternate embodiments for multiple gas distribution subsystems that are used in connection with the processing sub-enclosures. In preferred embodiments, multiple gas distribution subsystems of the present arrangements are laterally disposed and are instrumental in creating different types of localized processing environments (e.g., localized annealing environment, localized producing graphene environment, and localized cooling environment). Specifically, inside the multiple processing sub-enclosures that are disposed in series, the different types of localized processing environments are created at different laterally disposed regions that correspond to the lateral locations of the multiple gas distribution subsystems.

In one exemplar approach of the present arrangements, each of the processing sub-enclosure has defined therewithin or is integrated with multiple nozzle-receiving inlets, each of which is communicatively coupled to a single gas nozzle. Under this approach, multiple gas nozzles through multiple nozzle-receiving inlets (i.e., each gas nozzle through their respective ones of nozzle-receiving inlets) provide a particular type of processing composition to a single processing sub-enclosure and accordingly facilitate formation of a particular type of localized processing environment therein.

In one embodiment of the present arrangements, a first set of the multiple gas nozzles are communicatively coupled, at one end, to one or more reservoirs having stored therein the same type of one or more component gases that comprise the annealing gas composition or the substrate gas scavenging composition. Regardless of the type of component gases they are connected to, at another end, the first set of multiple gas nozzles are communicatively coupled to at least one of the processing sub-enclosures serving as at least one "annealing sub-enclosure."

Further, a second set of the multiple gas nozzles are communicatively coupled, at one end, to one or more reservoirs having stored therein same type of one or more component gases or hydrocarbon (not necessarily in gaseous form) that comprise the producing composition (i.e., gas composition for producing graphene on the substrate inside the enclosure) and communicatively coupled, at another end, to at least one of the processing sub-enclosures serving as at least one "producing sub-enclosure."

Further still, a third set of the multiple gas nozzles are communicatively coupled, at one end, to one or more reservoirs having stored therein same type of one or more component gases that comprise the cooling gas composition (e.g., a substrate gas scavenging composition used for cooling the graphene deposited on the substrate surface) and communicatively coupled, at another end, to at least one of the processing sub-enclosures serving as at least one "cooling sub-enclosure."

In connection with one or more of the different types of processing (e.g., annealing or producing) of the substrate, the present teachings offer certain implementations that include changing one or more process parameters (e.g., a processing temperature and/or processing incident flow rate) as a function of lateral distance. By way of example, the present teachings recognize that during annealing of the substrate surface, some of the laterally arranged multiple gas nozzles within the first set of multiple gas nozzles are dedicated to pretreating the substrate surface and others, or some of the others, of the first set of multiple gas nozzles within the first set of multiple gas nozzles are dedicated to treating the substrate surface. In the pretreating step, the substrate surface is subjected to a substrate gas scavenging composition to produce a contaminant-depleted surface and in the treating step, the substrate surface is subjected to an annealing gas composition to produce an annealed surface. Consequently, the present arrangements contemplate a design in which the first set of multiple gas nozzles are structurally similar but a particular collection of the first set of multiple gas nozzles perform a different function than the other, or some of the other, collections of the first set of multiple gas nozzles.

By way of example, within the first set of laterally arranged multiple gas nozzles, a first collection of these laterally arranged multiple gas nozzles are communicatively coupled, at one end, to one or more reservoirs that have stored therein one or more component gases that comprise the substrate gas scavenging composition. Continuing with this example, within the first set of laterally arranged multiple gas nozzles, a second collection of these laterally arranged multiple gas nozzles are communicatively coupled, at one end, to one or more reservoirs that have stored therein one or more component gases that comprise the annealing gas composition.

In other embodiments, within a particular set of multiple gas nozzles of the present arrangements, one collection of the laterally arranged multiple gas nozzles are configured to deliver the same gas composition, but at one or more different incident flow rates, as a second collection of the laterally arranged multiple gas nozzles. As a result, the present teachings recognize that within a particular set of laterally arranged multiple gas nozzles, two or more different collections of laterally arranged multiple gas nozzles may deliver a different type of gas composition or different incident flow rates of a particular type of gas composition.

Regardless of the type of component gases they are connected to, at another end, the first set of multiple gas nozzles, which include at least the first collection and the second collection of multiple gas nozzles, are communicatively coupled to at least one of the processing sub-enclosures serving as at least one "annealing sub-enclosure." The present teachings recognize that at least one of the annealing sub-enclosures, which is communicatively coupled to the second collection of multiple gas nozzles and receives the annealing gas composition, is serially disposed to at least another one of the annealing sub-enclosures, which is communicatively coupled to the second collection of multiple gas nozzles and receives the substrate gas scavenging composition, to form at least a part of the multiple, laterally extending, annealing sub-enclosures.

The present arrangements also provide different embodiments that facilitate a particular type of gas composition delivery from the nozzle to locations inside the processing sub-enclosure. Certain gas distribution subsystems of the present arrangements include: (1) multiple gas conduits; (2) multiple sets of a plurality of gas dispensing apertures; and (3) a gas injection plate. In these arrangements, multiple gas conduits are disposed within each of the processing sub-enclosures. Each gas conduit includes the nozzle-receiving inlet and a conduit outlet. Further, multiple sets of a plurality of gas dispensing apertures are defined on a gas dispensing surface of each of the processing sub-enclosures. The gas dispensing surface is disposed adjacent to the substrate holder in an assembled state of the graphene producing system of the present arrangements. The gas injection plate may be disposed adjacent to or may be integrated with each of the processing sub-enclosures. The gas injection plate has, preferably, defined therein multiple gas flow networks, each of which includes a network inlet and a set of a plurality of network outlet apertures.

In an exemplar assembled state of the present gas distribution systems, the network inlet is coupled to the conduit outlet and each set of plurality of the network outlet apertures align with and are coupled to one set of plurality of the gas dispensing apertures to define multiple material flow paths inside each of the processing sub-enclosures. Preferably, however the gas injection plate is not disposed adjacent to the tunnels involved in scavenging of the gases present in and around the substrate.

In preferred embodiments of the present arrangements, the gas distribution subsystems further comprise: (1) a mass flow control; and (2) a control valve. The combination of these provisions represents an exemplar approach in conveying certain types of processing gases to a gas nozzle. By way of example, a mass flow control is communicatively coupled to one or more reservoirs having stored therein one or more types of component gases that comprise the annealing gas composition and/or the substrate gas scavenging composition. The mass flow control, in this configuration, is designed to control incident flow rates of one or more types of the component gases from one or more of the reservoirs. These flow rates are "incident" because they strike and are incident upon the substrate surface. The control valve is communicatively coupled, at one end, to one or more mass flow controls. At another end, the control valve is communicatively coupled to multiple gas nozzles that are laterally adjacent to each other and that are communicatively coupled to at least one processing sub-enclosure. In this example, a single processing sub-enclosure is configured to receive, from multiple locations therewithin, the same type of processing composition that diffuses a lateral distance inside the processing sub-enclosure to facilitate formation of a corresponding type of, laterally extending, localized processing environment.

During an operational state of one or more of the mass flow controls and one or more of the control valves, one or more types of the component gases that form the annealing gas composition are conveyed from one or more of the reservoirs through the multiple gas nozzles to a laterally extending location inside at least one of the processing sub-enclosure that serves as the annealing sub-enclosure.

Although the present arrangements provide for batchwise processing of the substrate for production of graphene, they offer certain structural provisions directed to implementing continuous processing of the same. A continuous graphene formation system may further comprise a linear track for laterally displacing an adjacently disposed substrate holder that includes a plurality of pallets disposed in series or a continuous belt. In this implementation, one or more of the tunnels may be disposed adjacent to and around the linear track forming a protective cover around the pallets or the continuous belt.

In certain preferred embodiments, the present system for producing graphene further comprises a chiller disposed between one of the processing sub-enclosures and one of the tunnels. In a more preferred embodiment, the chiller, which may be akin to a chiller block, that is sandwiched between one of the tunnels and one of the processing sub-enclosures. In this position, the chiller removes a certain amount of heat present inside the processing sub-enclosure that flows towards one or more of the tunnels. Thus, the chiller represents a provision to minimize or prevent thermal degradation of the substrate and component subsystems involved in the scavenging process of the substrate.

In certain embodiments of the present arrangements, a chilling plate is disposed adjacent to one side of at least one of the tunnels, which is positioned proximate to one the processing sub-enclosure. A tunnel that is proximate in distance to a first of the processing sub-enclosures, disposed in series, is directly subjected to an excessive amount of heat generated during graphene formation and flowing from the processing sub-enclosures. Therefore, the present arrangements provide a chilling plate at least on the tunnel that is positioned before the processing sub-enclosures. Further, the present teachings also contemplate using a chilling plate adjacent to one or more other tunnels.

Further, to ensure that, during a scavenging operation inside one or more of the tunnels, an appropriate amount of substrate gas, primarily oxygen, has been depleted from the substrate before the substrate enters the processing sub-enclosure, the present arrangements include an oxygen concentration detecting sensor. In one exemplar arrangement, this sensor is disposed at one or more different locations inside one or more tunnels to measure and/or monitor the oxygen concentration of the substrate and/or monitor the oxygen concentration inside one or more of the tunnels.

In more preferred embodiments of the present graphene producing systems, multiple processing sub-enclosures are contiguously arranged to form a laterally extending enclosure. The distance by which the enclosure laterally extends includes an annealing range of lateral distance. The annealing range of lateral distance may extend a lateral distance of at least one and/or a portion of the processing sub-enclosure serving as an annealing sub-enclosure. Further, the annealing sub-enclosure is communicatively coupled to one or more reservoirs having stored therein one or more of the component gases of the same type and that comprise the annealing gas composition.

To form the enclosure, an assembly of contiguously arranged processing sub-enclosures (e.g., annealing sub-enclosures, producing sub-enclosures and/or cooling sub-enclosures) may be facilitated by a number of different mechanisms. In one exemplar approach of the present teachings, however, each of the processing sub-enclosures comprises, on a first side, a slidable component, and on a second side that is opposite to the first side, a cavity defined in the processing sub-enclosure for receiving the slidable component.

In an assembled state of an exemplar enclosure, the slidable component of one of the processing sub-enclosures engages, at a coupling location, with the cavity for receiving the slidable component of another of the processing sub-enclosures to couple and contiguously assemble the two processing sub-enclosures disposed in series. In this manner, more than two processing sub-enclosures may be assembled to form the multiple processing sub-enclosures or the enclosure.

Further, in the assembled state of the multiple processing sub-enclosures or the enclosure, the coupling location may have defined therein an expansion gap that is at least partially occupied by the slidable component extending into the cavity (which is designed for receiving the slidable component). The unfilled portion of the expansion gap is designed to allow one or more of the tunnels to slide upon expansion (resulting from exposure to excessive heat) of the contiguously arranged processing sub-enclosures.

In more preferred embodiments, the present graphene producing systems further include multiple furnace sub-structures contiguously arranged to form a laterally extending furnace that has disposed therein the above-mentioned enclosure and one or more laterally extending heat sources comprising one or more laterally extending heating coils that are, preferably, positioned outside the enclosure.

The present graphene producing systems may further include one or more temperature sensors disposed inside the furnace. One or more of these temperature sensors are designed to measure temperature generated by one or more operational heat sources. Appropriately positioned thermocouples, as such sensors are commonly known, ensure that a requisite amount of high heat is being provided to a processing range of lateral distance inside the enclosure (e.g., annealing range of lateral distance, producing range of lateral distance or cooling range of lateral distance inside the enclosure) to facilitate the formation therein of a desired localized processing environment.

The present graphene producing systems, preferably, further comprise multiple scavenging sub-enclosures contiguously arranged to form a laterally extending infeed portion that includes one or more of the above-mentioned tunnels and preferably includes multiple tunnels. The infeed portion may include: (1) a substrate roll designed to laterally roll out the substrate sheet, and (2) a speed matching system designed to match speed of the substrate holder, in a laterally advancing state, with a linear amount of an unrolled portion of the substrate sheet around the substrate roll per unit time. In an alternate embodiment, the infeed portion includes the above-mentioned substrate roll and a servo motor communicatively coupled to the substrate roll and designed to facilitate lateral roll out of the substrate roll.

To maintain a desired tautness in a rolled-out portion from the substrate roll, the infeed portion further comprises a slack loop sensor that is coupled to the servo motor. The slack loop sensor is designed to detect a slack loop of the substrate sheet resulting from the unrolling motion of the substrate roll. In this capacity, the slack loop sensor is also designed to control operation of the servo motor and the unrolling motion of the substrate roll to dispense an appropriate amount of the substrate sheet and minimize or prevent a slack loop.

The infeed portion may include an exhaust pump for removing heat and/or the substrate gas scavenging composition present inside one or more of the tunnels. In one embodiment, one or more of the heat sources used in the present arrangements do not laterally extend adjacent to the laterally extending infeed portion. In the alternate, one or more of the heat sources that may laterally extend adjacent to the laterally extending infeed portion are not active, during an operational state of the infeed portion, to heat the infeed portion. As a result, during a scavenging operational state, the infeed portion uses the heat and annealing gas composition that flows from the annealing sub-enclosure to facilitate scavenging of the substrate.

The infeed portion of the present arrangements contemplates provisions for receiving and advancing the substrate holder. In one embodiment, the infeed portion of the present arrangements includes a drive system that is designed to continuously, laterally advance, a substrate holder, e.g., multiple pallets or a continuous belt, through at least a substantial portion of the graphene producing system. Further, this arrangement may include one or more rollers that are designed to feed the substrate holder, e.g., multiple pallets towards the drive system so that substrate processing for graphene formation may begin.

In another aspect, the present arrangements provide another type of graphene producing systems. One exemplar of such graphene producing systems comprises: (1) a substrate holder that is designed to hold a substrate sheet; (2) one or more outfeed tunnels, which are disposed adjacent to the substrate holder; and (3) multiple processing sub-enclosures disposed laterally adjacent to one or more of the outfeed tunnels. In this configuration, the substrate holder continuously laterally extends from inside one or more of the multiple processing sub-enclosures into the outfeed tunnels.

Outfeed tunnels continue a cooling process that may have started inside one or more processing sub-enclosures serving as one or more "cooling sub-enclosures." Multiple outfeed gas outlets are disposed inside one or more of the outfeed tunnels. At least some of these outfeed gas outlets are oriented in a direction that is parallel to the substrate holder and referred herein to as "laterally-oriented outfeed gas outlets." These laterally-oriented outfeed gas outlets are designed to generate a laterally flowing substrate gas scavenging stream towards an exit end of the outfeed tunnels and that removes contents, e.g., heat, producing composition and substrate gas scavenging composition, present inside one or more of the outfeed tunnels and forms a protective layer above the substrate surface undergoing cooling. The present teachings recognize that, during cooling, such preventive measures against degradation and/or contamination represent preferred embodiments of the present arrangements as they are instrumental in realizing high yield and high throughput for graphene formation.

The exemplar graphene producing systems also include multiple gas distribution subsystems that are communicatively coupled, at one end, to one or more reservoirs of the same type of component gases that form a producing composition and/or a substrate gas scavenging composition. At another end, the gas distribution systems are communicatively coupled to at least one of the processing sub-enclosures and, preferably, to multiple processing sub-enclosures. In this arrangement, multiple gas distribution subsystems are designed to dispense the producing composition and/or the substrate gas scavenging composition inside at least one of the processing sub-enclosures or preferably multiples of the processing sub-enclosures. When a producing composition is dispensed inside a processing sub-enclosure, then the sub-enclosure is serving as a "producing sub-enclosure" that produces graphene on the substrate surface.

When a substrate gas scavenging composition is dispensed inside a processing sub-enclosure, which operates in the absence of an active, adjacent heat source, then the sub-enclosure is deemed to be a "cooling sub-enclosure."

Further, in absence of an effective gas or a mechanical barrier within and between one or more of the outfeed tunnels and at least one of the processing sub-enclosures (e.g., producing sub-enclosure and/or cooling sub-enclosure), the system for forming graphene is designed to allow heat and the producing composition and/or the substrate gas scavenging composition present inside at least one of the processing sub-enclosures to laterally flow into and be removed from the outfeed tunnels.

The present graphene producing systems, preferably, further comprise multiple outfeed sub-enclosures contiguously arranged to form a laterally extending outfeed portion that includes one or more outfeed tunnels and preferably includes multiple outfeed tunnels. In those configurations where the infeed portion, the multiple processing sub-enclosures and the outfeed portion are assembled to form the graphene producing systems of the present arrangements, the multiple processing sub-enclosures are sandwiched between the infeed portion and the outfeed portion. Further, during an operational state of the graphene producing systems of the present arrangements, the substrate sheet travels a lateral distance extending from the infeed portion through the multiple processing sub-enclosures and to an end or near the end of the outfeed portion.

Like the infeed portion, the outfeed portion may include one or more outfeed gas streams generating subsystems. A collection of some of the multiple outfeed gas outlets, which are part of one or more of the outfeed gas streams generating subsystems, are arranged at corresponding locations inside each of the outfeed tunnels to form multiple sets of correspondingly located outfeed gas outlets. These multiple sets of correspondingly located outfeed gas outlets, preferably, include "laterally-oriented gas flow outlets." Further, the multiple sets of correspondingly located outfeed gas outlets have an orientation that is designed to generate multiple continuously longitudinally flowing substrate gas scavenging composition streams in the direction that is parallel to the substrate holder. These longitudinally flowing substrate gas scavenging composition streams are designed to span across and evacuate contents inside the multiple outfeed tunnels and to effectively serve as a protective barrier preventing contaminants present inside the multiple outfeed tunnels from contacting the substrate sheet.

In certain embodiments, each the processing sub-enclosure of the present arrangements have defined therewithin or integrated with multiple nozzle-receiving inlets, each of which is coupled to one of the gas nozzles. Further, a first set of the multiple gas nozzles, chosen from the multiple gas nozzles (mentioned above), are communicatively coupled, at one end, to one or more reservoirs having stored therein same type of one or more component gases that comprise the producing composition and/or the substrate gas scavenging composition and/or communicatively coupled, at one end, to one or more reservoirs having stored therein same type of hydrocarbon, not necessarily in gaseous state, but that forms a producing composition inside a processing sub-enclosure. In these embodiments, the first set of the multiple gas nozzles are communicatively coupled, at another end, to at least one of the processing sub-enclosures serving as at least one producing sub-enclosure.

The present teachings recognize that the cooling sub-enclosures may be arranged similarly. As a result, a second set of the multiple gas nozzles, chosen from the multiple gas nozzles, may be communicatively coupled, at one end, to one or more reservoirs having stored therein the same type of one or more component gases that comprise the cooling gas composition, e.g., the substrate gas scavenging composition. At another end, the second set of multiple gas nozzles may be communicatively coupled to at least another of the processing sub-enclosures serving as at least one cooling sub-enclosure. One or more of these different types of sub-enclosures may be contiguously arranged to create different types of localized processing environments that facilitate graphene formation. By way of example, at least one of the producing sub-enclosures and at least one of the cooling sub-enclosures are coupled to laterally extend and form part of the multiple processing sub-enclosures.

One of the gas distribution subsystems, used in connection with one of these processing sub-enclosures, may further comprise: (1) multiple gas conduits; (2) multiple sets of a plurality of gas dispensing apertures; and (3) a gas injection plate. Multiple gas conduits are defined inside each of the processing sub-enclosures. Further, each of the gas conduit includes the nozzle-receiving inlet and a conduit outlet. As mentioned before, multiple sets of a plurality of gas dispensing apertures are defined on a gas dispensing surface of each the processing sub-enclosures. In this arrangement, the gas dispensing surface is disposed adjacent to the substrate holder and the gas injection plate is disposed adjacent to each of the processing sub-enclosures.

The gas injection plate has defined therein multiple gas flow networks, each of which, in turn, includes a network inlet and a set of a plurality of network outlet apertures. To define multiple material flow paths inside each of the processing sub-enclosures, the network inlet is coupled to the conduit outlet and each of the sets of plurality of the network outlet apertures align with and are coupled to one of the sets of plurality of the gas dispensing apertures. The gas injection plate, preferably, is not disposed adjacent to or does not extend over the outfeed tunnels.

In preferred embodiments, the gas distribution subsystem of the present arrangements further includes: (1) a mass flow control; and (2) a control valve. The mass flow control is communicatively coupled to one or more reservoirs having stored therein one or more types of component gases that comprise the producing composition and/or the substrate gas scavenging composition and/or communicatively coupled, at one end, to one or more reservoirs having stored therein same type of hydrocarbon, not necessarily in gaseous state, but that forms a producing composition inside a producing sub-enclosure. The mass flow control is designed to control incident flow rates of one or more of the component gases, inside the producing sub-enclosure and/or the cooling sub-enclosure, from one or more of the reservoirs. The control valve is communicatively coupled, at one end, to one or more of the mass flow controls and communicatively coupled, at another end, to the multiple gas nozzles. In turn, the multiple gas nozzles are communicatively coupled to at least one the processing sub-enclosure, e.g., the producing sub-enclosure and the cooling sub-enclosure. During an operational state of one or more of the mass flow controls and one or more of the control valves, one or more of the component gases are conveyed from one or more of the reservoirs through the multiple gas nozzles to at least one of the processing sub-enclosure that is serving as the producing sub-enclosure or the cooling sub-enclosure.

The outfeed portion further comprises a linear track having disposed thereon a laterally extending heat sink for cooling off the adjacent substrate holder comprising a plurality of pallets disposed in series or a continuous belt. One or more of the tunnels, that are disposed adjacent to and around the linear track, form a protective cover around the substrate holder.

In the outfeed portion, a chiller (e.g., an outfeed chiller block) is disposed between one of the processing sub-enclosures and one of the outfeed tunnels, which is proximate to one of the processing sub-enclosures. In this configuration, the chiller is designed to remove a certain amount of heat present inside the processing sub-enclosure that flows towards one or more of the outfeed tunnels.

The present systems for producing graphene, preferably, include more provisions for cooling a substrate that has undergone high temperature treatment. In one embodiment, the present arrangements further comprise (1) a chilling plate disposed adjacent to at least one of the outfeed tunnels that is disposed proximate to one of the processing sub-enclosures; (2) a chilling plate disposed adjacent to at least one of the linear tracks that is disposed proximate to one of the processing sub-enclosures; and (3) an oxygen concentration detecting sensor disposed, at one or more different locations, inside one or more of the outfeed tunnels. One of the chilling plates is disposed adjacent to each of the outfeed tunnels and one of the chilling plates is disposed adjacent to the linear track.

The present systems of producing graphene, preferably, further comprises multiple furnace sub-structures contiguously arranged to form a laterally extending furnace that has disposed therein the enclosure and one or more laterally extending heat sources. In a more preferred embodiment, the heat sources deployed in the present arrangements comprise one or more laterally extending heating coils that are positioned outside the enclosure. In certain embodiments, such laterally extending heat sources, e.g., heating coils, may be disposed inside the enclosure. Regardless of whether they are inside or outside the enclosure, these heating coils, preferably, do not extend the entire portion of the furnace, allowing for cooling of the substrate before it exits the furnace. These heating coils, preferably, also do not extend adjacent to the infeed and the outfeed portions because high temperature treatment is not required for processing the substrate inside these portions.

The enclosure may include at least one processing sub-enclosure that is communicatively coupled to one or more of the reservoirs having stored therein one or more of the component gases of the same type and that comprise the producing composition and/or communicatively coupled, at one end, to one or more reservoirs having stored therein same type of hydrocarbon, not necessarily in gaseous state, but that forms a producing composition inside a portion of the enclosure. As will be explained later, presence of the producing composition facilitates forming a localized producing environment inside a portion of the enclosure. The localized producing environment facilitates production of graphene on the substrate surface.

Another portion of the enclosure includes at least one of the processing sub-enclosures serving as at least one cooling sub-enclosure. Each cooling sub-enclosure is communicatively coupled to one or more of the reservoirs one of or more of the component gases of same type that comprise the cooling gas composition, e.g., the substrate gas scavenging composition. As mentioned above, the cooling sub-enclosure, preferably, does not have, adjacently disposed, one or more active heat sources, allowing for cooling inside the cooling sub-enclosure.

As mentioned before, the present graphene producing system may further comprise multiple outfeed sub-enclosures contiguously arranged to form a laterally extending outfeed portion that includes one or more of the outfeed tunnels. The outfeed portion may use an exhaust pump for removing heat and/or the substrate gas scavenging composition present inside one or more of the outfeed tunnels.

In yet another aspect, the present arrangements provide yet other types of systems for forming graphene. One exemplar of these systems includes: (1) a laterally extending substrate holder for holding a substrate sheet; and (2) multiple processing sub-enclosures contiguously arranged to form a laterally extending enclosure, which encloses therewithin the substrate holder. In this arrangement, each of the processing sub-enclosure has defined therewithin or is integrated with multiple nozzle-receiving inlets. Further, the enclosure includes multiple sets of laterally positioned nozzle-receiving inlets. Also included in this arrangement are multiple sets of laterally positioned gas nozzles, each set of which is communicatively coupled to an associated set of the nozzle-receiving inlets.

These systems include provisions for providing certain types of processing gases inside a certain lateral range of distance inside the enclosure. By way of example, one or more reservoirs are provided. One or more reservoirs have stored therein one or more types of component gases that comprise different types processing compositions (e.g., substrate gas scavenging composition, annealing gas composition and producing composition). In the case of producing composition, the present teachings recognize that one or more reservoirs may have stored therein one or more different hydrocarbons, not necessarily in gaseous state, but that forms a producing composition a certain lateral range of distance inside the enclosure.

As another example, multiple sets of mass flow controls may also be part of the gas distribution system. Each set of mass flow controls is communicatively coupled to one or more of these reservoirs (i.e., having stored therein same type of one or more of component gases for forming a particular type of processing composition). Each set of mass flow controls is designed to control incident flow rates of the same type of component gas(es) inside at least one of the processing sub-enclosures.

As yet another example, multiple sets of control valves may also be involved in providing certain types of gas(es) inside the processing sub-enclosure. Each set of control valves is communicatively coupled, at one end, to an associated set of the mass flow controls and communicatively coupled, at another end, to an associated set of multiple gas nozzles.

These provisions define multiple sets of processing material flow paths for a single processing sub-enclosure. Each set of processing material flow paths extends from one or more of the reservoirs (having stored therein one or more component gases comprising the same type of the processing composition or in the case of producing composition, having stored therein one or more different types of hydrocarbon that are not necessarily in gaseous state, but that form a producing composition inside a processing sub-enclosure), through the associated set of the gas nozzles and the associated set of the nozzle-receiving inlets, to a particular range of lateral distance inside the enclosure for implementing a particular type of processing. More preferably, a set of processing material flow paths is designed to convey a particular type of processing composition to create a particular type of localized processing environment spanning a processing range of lateral distance inside the enclosure.

Inside the enclosure, a processing range of lateral distance may refer to, depending on the type of processing being carried out, an "annealing range of lateral distance," a "producing range of lateral distance," or a "cooling range of lateral distance."

The annealing range of lateral distance refers to a lateral distance along which the different processing conditions for annealing are implemented. The annealing range of lateral distance starts at or near one end of the enclosure (e.g., after the end of the infeed portion or the chiller). The producing range of lateral distance refers to another lateral distance along which the different processing conditions for producing (graphene) are implemented. The producing range of lateral distance starts at or near an end of the annealing range of lateral distance. The cooling range of lateral distance refers to yet another lateral distance along which the different processing conditions for cooling (graphene) are implemented. The cooling range of lateral distance starts at or near an end of the producing range of lateral distance. Further, the cooling range of lateral distance ends at or near other end of enclosure (e.g., before the beginning of the outfeed portion or the outfeed chiller).

In this arrangement, one or more heat sources laterally extend and are parallel to the laterally extending enclosure. One or more heat sources comprise one or more annealing heat sources, which are designed to provide heat inside the annealing range of lateral distance (inside the enclosure). Similarly, one or more heat sources comprise one or more producing heat sources designed to provide heat inside the producing range of lateral distance (inside the enclosure).

Consistent with the recognition that different provisions are required for different types of processing, multiple sets of mass flow controls comprise multiple annealing set of mass flow controls, multiple producing set of mass flow controls and multiple cooling set of mass flow controls. In this arrangement, the multiple annealing set of mass flow controls is coupled to one or more of the reservoirs having stored therein one or more types of component gases that comprise a substrate gas scavenging composition and an annealing gas composition. Similarly, the multiple producing set of mass flow controls is coupled to one or more of the reservoirs having stored therein one or more types of component gases that comprise a producing composition or and/or is coupled to one or more reservoirs having stored therein one or more different types of hydrocarbons, not necessarily in gaseous state, but that forms a producing composition along a producing range of lateral distance inside the enclosure. The multiple cooling set of mass flow controls is coupled to one or more of the reservoirs having stored therein one or more types of component gases that comprise a substrate gas scavenging composition, which is creates a localized processing environment in the absence of adjacent heating.

Building on this recognition of requiring different provisions for different types of processing of the substrate, the multiple sets of control valves comprise multiple annealing control valves, multiple producing control valves and multiple cooling control valves. The multiple annealing control valves are communicatively coupled, at one end, to the multiple annealing set of mass flow controls. At another end, the multiple annealing control valves are communicatively coupled to the multiple annealing gas nozzles that are in turn are communicatively coupled to at least one annealing sub-enclosure (which extends the annealing range of lateral distance inside the enclosure). In an operational state of the annealing gas nozzles and one or more of the annealing heat sources, the annealing gas composition, in presence of heat generated from the annealing heat sources, creates a localized annealing environment inside the annealing sub-enclosure.

Similarly, the multiple producing control valves are communicatively coupled, at one end, to the multiple producing set of mass flow controls. At another end, the multiple producing control valves are communicatively coupled to the multiple producing gas nozzles that are in turn are communicatively coupled to at least one producing sub-enclosure (which extends the producing range of lateral distance inside the enclosure). In an operational state of the producing gas nozzles and one or more of the producing heat sources, the producing composition, in presence of heat generated from the producing heat sources, creates a localized producing (graphene) environment inside the producing sub-enclosure.

The multiple cooling control valves are communicatively coupled, at one end, to the multiple cooling set of mass flow controls. At another end, the multiple cooling control valves are communicatively coupled to the multiple cooling gas nozzles that are in turn are communicatively coupled to at least one cooling sub-enclosure (which spans the cooling range of lateral distance inside the enclosure). In an operational state of the cooling gas nozzles and in absence of one or more active, adjacently disposed, heat sources, the substrate gas scavenging composition creates a localized cooling environment inside the cooling sub-enclosure.

The present arrangements, that realize the advantage of high yield and high throughput of graphene formation, may further comprise a processor, which is communicatively coupled to one or more of the heat sources, multiple sets of mass flow controls, multiple sets of control valves. In this configuration, the processor facilitates creation of one or more types of localized processing environments (e.g., localized annealing environment, localized producing (graphene) environment and localized cooling environment), each extending a processing range of lateral distance (e.g., annealing range of lateral distance, producing (graphene) range of lateral distance and cooling range of lateral distance, respectively) inside the enclosure.

In yet another aspect, the present teachings provide methods for forming graphene. One exemplar of these methods comprises: (1) disposing, on a laterally extending substrate holder, a laterally extending substrate sheet having located thereon a first surface for processing and a second surface for processing; (2) a step of scavenging, in presence of a substrate gas scavenging composition, a substrate gas present in and around the first surface for processing to produce a substrate gas depleted surface; (3) a step of annealing, in presence of an annealing gas composition and/or the substrate gas scavenging composition and at an annealing temperature, the second surface for processing to produce an annealed surface. The annealing temperature is produced using one or more heat sources being disposed adjacent to the second surface for processing. Further, some of the heat, resulting from the annealing temperature and the annealing gas composition and/or the substrate gas scavenging composition, flows towards the first surface for processing and facilitates production of the substrate gas depleted surface. The annealing gas composition and/or the substrate gas scavenging composition, preferably, flows backwards (i.e., a negative distance along the X-axis) because the second surface for processing is located a positive lateral distance (i.e., a positive distance along the X-axis) from the first surface for processing.

The step of scavenging is, preferably, carried out in absence of an active heating source positioned adjacent to the first surface for processing. In this embodiment, some of the heat flowing towards the first surface for processing provides the requisite temperature treatment and may range from about 50° C. to about 300° C. and more preferably range from about 50° C. to about 100° C.

In certain preferred embodiments, the step of scavenging of the present teachings includes using multiple gas outlets, e.g., using multiple laterally-oriented gas outlets and multiple angularly-oriented gas outlets. As mentioned before, the multiple laterally-oriented gas outlets are oriented in a direction that is parallel to the substrate holder and the multiple angularly-oriented gas outlets are oriented in a direction that is at an angle to an axis perpendicular to the substrate holder.

These preferred embodiments of the present teachings also include: (1) a step of protecting the substrate sheet from contaminants present around the substrate sheet, using a laterally flowing stream of the substrate gas scavenging composition generated from one or more of the laterally-oriented gas outlets; and (2) a step of contacting the substrate sheet with an angularly flowing stream of the substrate gas scavenging composition generated from one or more of the angularly-oriented gas outlets.

The substrate gas scavenging composition may be a mixture of an inert gas, preferably argon, and hydrogen gas at an inert gas to hydrogen ratio ranging from about 100:0.1 to about 100:5. The substrate gas includes oxygen, water and hydrocarbons.

In one approach, the step of disposing includes introducing the substrate sheet on the substrate holder at a feed rate ranging from about 1 mm/second to about 30 inches/second. Under this approach, a "reference point" refers to a location at which the substrate sheet first contacts the substrate holder. Further, a first distance extends between the reference point and the first surface for processing and a second distance extends between the reference point and the second surface for processing. By way of example, the second distance ranges from about 1.2 times of the first distance to about 3 times of the first distance.

Regardless of whether a substrate roll is used or the substrate sheet obtained is originally in an unrolled state, the step of scavenging, preferably comprises: (1) advancing the first surface for processing a scavenging range of lateral distance inside a scavenging sub-enclosure; (2) increasing, during the step of advancing and inside the scavenging sub-enclosure, an incident flow rate of the substrate gas scavenging composition from a relative low incident flow rate value to a relatively high incident flow rate value; (3) allowing some of the heat, resulting from the annealing temperature and the annealing gas composition and/or the substrate gas scavenging composition used during the annealing, to flow in an opposite direction to a direction of the laterally advancing first surface for processing. In the step of scavenging, the first surface for processing advances the scavenging range of lateral distance. By way of example, the scavenging range of lateral distance ranges from about $50|_{[MB1]}0$ mm to about 3000 mm, the relative low incident flow rate value of the substrate gas scavenging composition ranges from 0.5 liters/minute to 20 liters/minute and more preferably range from about 0.5 liters/minute to 4.5 liters/minute, and the relative high incident flow rate value of the substrate gas scavenging composition ranges from about 5 liters/minute to 100 liters/minute and more preferably range from about 5 liters/minute to 20 liters/minute. As another example, the scavenging range of lateral distance ranges from about 0.5% of the total lateral distance that the substrate surface extends to about 5% of the total lateral distance that the substrate surface extends.

The step of annealing, preferably, comprises: (1) mixing, using one or more mass flow controls, certain amounts of one or more types of component gases stored inside one or more reservoirs, to produce the substrate gas scavenging composition and/or the annealing gas composition; (2) activating an annealing control valve, that is communicatively coupled, at one end, to one or more of the mass flow controls, and communicatively coupled, at another end, to multiple sets of gas dispensing apertures disposed inside the processing sub-enclosure; and (3) conveying the substrate gas scavenging composition and/or the annealing gas composition formed from one or more component gases stored inside one or more of the reservoirs to the processing sub-enclosure. In preferred implementations of these methods and inside the processing sub-enclosure, one set of the gas dispensing apertures are separated a lateral separating distance from another set of the gas dispensing apertures. As a result, preferred embodiments of the present methods include creating an annealing environment by using heat generated from one or more heat sources (e.g., multiple annealing heat sources) and using the substrate gas scavenging composition and/or annealing gas composition that diffuses into a region, extending at least the lateral separating distance, inside the processing sub-enclosure. Moreover, the step of scavenging and the step of annealing are, preferably, carried out contemporaneously.

The present teachings, preferably, further comprise a step of initially scavenging, in presence of the substrate gas scavenging composition, the substrate gas present in and around an unprocessed surface of the substrate sheet to produce the second surface for processing. Further, the step of initially scavenging the unprocessed surface of the substrate sheet is carried out prior to the step of scavenging of the first surface for processing and the step of annealing of the second surface for processing.

The annealing temperature, produced using one or more heat sources (e.g., multiple annealing heat sources) that are positioned adjacent to the second surface for processing, is higher than a scavenging temperature resulting from some of the heat that flows towards the first surface for processing. By way of example, the annealing temperature ranges from about 500° C. to about 1100° C., and the scavenging temperature ranges from about 50° C. to about 500° C. and more preferably range from about 50° C. to about 100° C.

In yet another aspect, the present teachings provide yet other types of methods for producing graphene. One exemplar of these methods comprises: (1) a step of pretreating a surface for processing using one or more different pretreating incident flowrates of a substrate gas scavenging composition and/or an annealing gas composition, in presence of one or more different pretreating temperatures, to produce a contaminant-depleted surface; and (2) a step of treating the contaminant-depleted surface using one or more different treating incident flowrates of the annealing gas composition, in presence of one or more different treating temperatures, to produce an annealed surface.

The present teachings offer certain methods of forming graphene, including pretreating, that comprise displacing, inside an enclosure, a surface a pretreating range of lateral distance. In certain embodiments, the pretreating range of lateral distance of the present teachings may be thought of as including an initial pretreating lateral location or region and, disposed a lateral distance away therefrom, a subsequent pretreating lateral location or region.

These methods further comprise exposing, during the displacing of the surface inside the enclosure, a temperature profile that varies as a function of a lateral distance displaced within the pretreating range of lateral distance inside the enclosure. In certain embodiments, the step of exposing of the present teachings includes using one or more heat sources extending the pretreating range of lateral distance, preferably outside the enclosure, but disposed adjacent to the surface. In this configuration, the initial pretreating lateral location or region, inside the enclosure, is at a minimum temperature of an annealing temperature. Further, the subsequent pretreating lateral location or region, inside the enclosure, is at a maximum temperature of the annealing temperature.

These methods further still include subjecting, during the displacing of the surface inside the enclosure, the surface to a pretreating incident flow rate profile of a substrate gas scavenging composition that varies as a function of a lateral distance displaced within the pretreating range of lateral distance inside the enclosure. In certain embodiments, the step of subjecting of the present teachings includes using multiple gas distribution systems that deliver to lateral locations extending the pretreating range of lateral distance. In this configuration, a relatively low incident flow rate of the substrate gas scavenging composition is applied to the surface at the initial pretreating lateral location or region. Further, a relatively high incident flow rate of the substrate gas scavenging composition is applied to the surface at the subsequent pretreating lateral location or region. These steps of pretreating of the substrate surface are carried out contemporaneously.

The pretreating range of lateral distance may range from about 100 mm to about 3000 mm. The relatively low temperature value may range from about 150° C. to about 1000° C. The relatively high temperature value may range from about 1000° C. to about 1100° C. The relative low incident flow rate value may range from about 0.5 liters/minute to 20 liters/minute and more preferably range from about 0.5 liters/minute to 4.5 liters/minute, and the relative high incident flow rate value of the substrate gas scavenging composition ranges from about 5 liters/minute to 100 liters/minute and more preferably range from about 5 liters/minute to 20 liters/minute.

The present teachings offer other methods of forming graphene, including treating, that comprise displacing a surface, a treating range of lateral distance inside an enclosure. These methods further comprise exposing, during the displacing of the surface inside the enclosure, the surface to a temperature profile that remains substantially constant within the treating range of lateral distance inside the enclosure. In certain embodiments, the step of exposing includes using one or more heat sources extending the treating range of lateral distance, preferably outside the enclosure, but disposed adjacent to the surface. In this configuration, using heat generated from one or more of these heat sources, the treating range of lateral distance inside the enclosure is maintained at a substantially constant annealing temperature.

These methods further still include subjecting, during the displacing of the surface inside the enclosure, the surface to a treating incident flow rate profile of a substrate gas scavenging composition that varies as a function of a lateral distance displaced within the pretreating range of lateral distance inside the enclosure. In certain embodiments, the subjecting step of the present teachings includes using one or more gas distribution systems that deliver a substantially uniform incident flow rate of the annealing gas composition to locations that extend the treating range of lateral distance inside the enclosure. These treating steps are carried out contemporaneously.

The treating range of lateral distance may range from about 100 mm to about 3000 mm. The treating temperature may range from about 500° C. to about 1100° C. The treating incident flow rate may range from about 0.5 liters/minute to about 100 liters/minute and in a more preferred embodiment from 0.5 to 20 liters/minute.

In many exemplar methods for forming graphene, the annealing gas composition includes trace amounts of oxygen. After annealing or treating, a residual amount (trace) of oxygen remains on the substrate surface. The present teachings recognize that removal of residual oxygen prior to production of graphene on the substrate surface is necessary for producing graphene suited for certain commercial applications.

To this end, the present methods include passivating the substrate and further comprise displacing a surface, a passivating range of lateral distance inside an enclosure. In certain embodiments, the passivating range of lateral distance of the present teachings includes an initial passivating lateral location or region and, disposed a lateral distance away therefrom, a subsequent passivating lateral location or region.

These methods further include exposing, during the displacing of the surface inside the enclosure, a temperature profile that remains substantially constant within the passivating range of lateral distance inside the enclosure. In certain embodiments, the step of exposing includes using one or more heat sources extending a passivating range of lateral distance, preferably outside the enclosure, but disposed adjacent to the surface. In this configuration, a substantially constant annealing temperature is provided in locations extending the passivating range of lateral distance inside the enclosure.

These methods further still include exposing, during the displacing of the surface inside the enclosure, subjecting, the surface to a passivating incident flow rate profile of a substrate gas scavenging composition that varies as a function of a lateral distance displaced within the passivating range of lateral distance inside the enclosure. In certain embodiments of the present teachings, the step of subjecting of the present teachings includes using one or more of the gas distribution systems for applying a relatively high incident flow rate of the substrate gas scavenging composition to the surface at the initial passivating lateral location or region. Further, a relatively low incident flow rate of the substrate gas scavenging composition is applied to the surface at the subsequent passivating lateral location or region. These passivating steps carried out contemporaneously.

In these embodiments of the present teachings, the substrate gas scavenging composition, in the presence of an appropriate annealing temperature, reacts with the trace amounts of oxygen to produce a passivated surface. Elimination of free oxygen from the substrate surface, by implementing this passivating step, ensures that a subsequent step of producing graphene on the substrate surface is not negatively impacted by the presence of contaminants such as oxygen on the substrate surface. The passivating range of lateral distance may range from about 100 mm to about 3000 mm. The passivating temperature may range from about 500° C. to about 1100° C. The passivating incident flow rate may range from about 0.5 liters/minute to about 100 liters/minute and in a more preferred embodiment from about 0.5 liters/minute to about 20 liters per minute.

The present teachings recognize that, in those circumstances when the annealing gas composition includes trace amounts of oxygen, the step of passivating is carried out in a batchwise operation and need not be carried out during the step of displacing the annealed surface the passivating range of lateral distance. In a batchwise operation and after annealing has concluded, the methods of forming graphene further comprise passivating the annealed surface using a stream of the substrate gas scavenging composition at a passivating incident flow rate, in presence of a passivating temperature, to react with the trace amounts of oxygen to produce a passivated surface.

In those circumstances when the annealing gas composition does not include trace amounts of oxygen or trace amounts of oxygen are of no consequence to the ultimately produced graphene on the substrate surface, the present methods do not include the step of passivating. Further, the present teachings recognize that there may be incidental passivation from oxygen present (e.g., trace amounts of oxygen present) in the substrate. In these embodiments, after the step of treating, the methods of forming graphene advance to a step of producing graphene on the treated surface. This step of producing uses one or more different incident flow rates of a producing composition, in presence of a producing temperature, to produce graphene on the substrate sheet.

After the step of producing, the present methods then include a step of cooling the graphene, deposited on the substrate sheet. This step of cooling uses a cooling incident flow rate of the substrate gas scavenging composition in absence of heat generated from one or more adjacent heat sources (e.g., one or more heating coils adjacent to the substrate surface) or presence of a cooling temperature to produce a relatively cool graphene deposited on the substrate sheet.

In yet another aspect, the present teachings offer yet other types of methods. One exemplar of such methods comprises a step of disposing, on a laterally extending substrate holder, a laterally extending substrate sheet having located thereon a first surface for processing and a second surface for processing. In the step of disposing, the second surface for processing is located a positive lateral distance from the first surface for processing.

The exemplar method further includes a step of annealing, in presence of an annealing gas composition and/or the substrate gas scavenging composition and at an annealing temperature, the first surface for processing to produce an annealed surface. The annealing temperature is produced using one or more heat sources being disposed adjacent to the first surface for processing.

The exemplar method further still includes a step of producing graphene, in presence of a producing composition and at a producing temperature, on the second surface for processing to produce a graphene deposited surface. The step of annealing and the step of producing are, preferably, carried out contemporaneously. By way of example, the producing composition comprises Ar and a hydrocarbon, e.g., $CH_4$, and the producing temperature ranges from about 600° C. to about 1100° C. and in a more preferred embodiment from 900° C. to about 1100° C. Representative hydrocarbons in the producing composition include methane, ethane, ethene (ethylene), ethyne (acetylene), propane, butane, pentane, hexane, heptane, octane, and decane.

In preferred embodiments, the step of annealing of the present teachings comprises mixing, using one or more producing mass flow controls, certain amounts of one or more types of component gases stored inside one or more reservoirs, to produce the annealing gas composition. The step of annealing, preferably, then involves activating an annealing control valve, that is communicatively coupled, at one end, to one or more of the annealing mass flow controls, and communicatively coupled, at another end, to multiple sets of gas dispensing apertures disposed inside one of a processing sub-enclosure. As a result, the step of annealing, preferably, includes conveying the annealing gas composition from one or more of the reservoirs to the processing sub-enclosure to carry out the step of annealing. In this arrangement, one set of gas dispensing apertures are separated a lateral separating distance from another set of gas dispensing apertures. Further, the step of annealing then includes creating an annealing environment by using heat generated from one or more heat sources and using the annealing gas composition that diffuses into a region, extending at least the lateral separating distance, inside the processing sub-enclosure.

In one exemplar assembly of components in the step of producing, at least one of the producing mass controls is communicatively coupled to one of the reservoirs of argon gas and communicatively coupled to another of the reservoirs of methane gas and/or hydrocarbon that is not necessarily in gaseous state, but that forms a producing composition inside a processing sub-enclosure. In this configuration, the producing control valve is communicatively coupled, at one end, to the producing mass flow control, and communicatively coupled, at another end, to multiple sets of gas dispensing apertures. Further, the gas dispensing apertures are disposed inside the processing sub-enclosure serving as a producing (graphene) sub-enclosure. In an operational state of the exemplar assembly of components involved, at least one of the producing mass controls—effectively controls an incident flow rate of the producing composition inside the processing sub-enclosure.

The present teachings contemplate that prior to the step of producing, the second surface, preferably undergoes annealing. To this end, the present methods, preferably, further comprise a step of initially annealing, in presence of the annealing gas composition, a non-annealed surface of the substrate sheet to produce the second surface for processing. The step of initially annealing of the non-annealed surface of the substrate sheet is carried out prior to the step of annealing of the first surface for processing and the step of producing of the second surface for processing.

In yet another aspect, the present teachings provide yet other types of methods for producing graphene. One exemplar of such methods comprises displacing a surface, a producing range of lateral distance inside an enclosure. In certain embodiments, the producing range of lateral distance of the present teachings includes an initial producing lateral location or region, disposed a lateral distance away therefrom, an intermediate producing lateral location or region and, disposed a lateral distance away therefrom, a subsequent producing lateral location or region.

These methods further include exposing, during the displacing of the surface inside the enclosure, the surface to a substantially constant temperature along with the producing range of lateral distance. In certain embodiments, the exposing step of the present teachings includes using multiple heat sources, extending the producing range of lateral distance, preferably, disposed outside the enclosure, but adjacent to the surface. In this configuration, the surface is exposed to a substantially constant temperature along the producing range of lateral distance inside the enclosure.

These methods further include subjecting, during the displacing of the surface inside the enclosure, the surface to a producing incident flow rate profile of a substrate gas scavenging composition that varies as a function of a lateral distance displaced within the producing range of lateral distance inside the enclosure. In certain embodiments, the subjecting step includes using multiple gas distribution systems delivering the producing composition to the producing range of lateral distance inside the enclosure. In this configuration, a substantially constant incident flow rate is applied to the surface when it is positioned at the initial producing lateral location or region. Further, a first maximum incident flow rate is applied to the surface when it is positioned at the intermediate producing lateral location or region. Further still, a second maximum incident flow rate is applied to the surface when it is positioned at the subsequent producing lateral location or region. In one implementation of the present teachings, the second maximum is greater than the first maximum. These producing steps are carried out contemporaneously.

The producing range of lateral distance may range from about 100 mm to about 4000 mm. The producing temperature may range from about 600° C. to about 1100° C. and in a more preferred embodiment from about 900° C. to about 1100° C. The substantially constant incident flow rate of the producing composition, e.g., $CH_4$ gas, at the initial producing lateral location or region may range from about 0.5 liters/minute to about 4.5 liters/minute. The first maximum incident flow rate of the producing composition at the intermediate producing lateral location or region may range from about 5 liters/minute to about 20 liters/minute. The second maximum incident flow rate of the producing composition at the subsequent producing lateral location or region may range from about 5 liters/minute to about 20 liters/minute.

In preferred embodiments of the present teachings, at least three or four producing gas distribution subsystems are laterally disposed within each of the initial producing location or region, the intermediate producing location or region and the third producing location or region.

The exemplar method further comprises, prior to the step of producing, a step of initially annealing the surface for processing. During the step of displacing an annealing range of lateral distance, the step of initially annealing the surface of processing is carried out. The producing range of lateral distance preferably starts at an end of the annealing range of lateral distance inside the enclosure.

In yet another aspect, the present teachings provide methods for forming graphene. One exemplar of such methods comprises: (1) a step of scavenging, in presence of a substrate gas scavenging composition and a scavenging temperature, a substrate sheet to produce a partially contamination-depleted surface; (2) a step of annealing, in presence of the substrate gas scavenging composition and/or an annealing gas composition and an annealing temperature, the substrate sheet to produce an annealed surface; (3) a step of producing graphene, in presence of an producing composition and an annealing temperature, the substrate sheet to produce a graphene deposited surface; and (4) a step of cooling, in absence of an active heat source disposed adjacent to the substrate sheet and in presence of the substrate gas scavenging composition, the substrate sheet to produce a relatively cool surface.

In preferred implementations, the step of scavenging, the step of annealing, the step of producing and the steps of cooling are carried out on a same surface for processing on the substrate sheet. In these implementations, the step of cooling is carried out after the step of producing, which is carried out after the step of annealing, which in turn, is carried out after the step of scavenging.

In certain embodiments of the present teachings, the step of scavenging is carried out on a first surface for processing, the step of annealing is carried out on a second surface for processing, the step of producing is carried out on a third surface for processing and the step of cooling is carried out on a fourth surface for processing. In these embodiments, the first, the second, the third and the fourth surfaces for processing are different (locations and/or regions) from each other. Further, the step of scavenging, the step of annealing, the step of producing and the step of cooling are, preferably, carried out contemporaneously to realize high yield and high throughput for graphene formation.

The exemplar method, preferably, contemplates that the substrate sheet laterally extends within a laterally extending enclosure. In an exemplar continuous mode of operation, the exemplar method further comprises a step of displacing the substrate sheet inside a laterally extending infeed portion that is positioned upstream from the enclosure, and the step of scavenging includes, during the step of displacing of the substrate sheet, using a substrate gas scavenging composition on a surface for processing to at least remove substrate gas in around the substrate sheet. In other words, as the substrate sheet undergoes displacement inside the infeed portion, it contemporaneously undergoes scavenging to remove substrate gases that are present therewithin and therearound.

The present teachings recognize that other steps may be similarly carried out in this continuation mode of operation to realize high yield and high throughput for graphene formation. By way of example, the exemplar method comprises a step of moving the surface for processing an annealing range of lateral distance, and the step of annealing includes, during the step of moving of the substrate sheet or contemporaneous with the step of moving of the surface of processing, using a localized annealing environment produced within the annealing range of lateral distance inside the enclosure and the annealing range of lateral distance starts at an end of the scavenging range of lateral distance.

As another example, the exemplar method comprises a step of advancing the surface for processing a producing range of lateral distance, and the step of producing includes, during the step of advancing of the substrate sheet or contemporaneous with the step of advancing of the surface for processing, using a localized producing environment formed within the producing range of lateral distance inside the enclosure and the producing range of lateral distance starts at an end of the annealing range of lateral distance.

As yet another example, the exemplar method comprises a step of conveying the surface for processing a cooling range of lateral distance, and the step of cooling includes, during the step of conveying or contemporaneous with the step of conveying of the surface for processing, cooling the surface for processing using a localized cooling environment within the producing range of lateral distance inside the enclosure, and the cooling range of lateral distance starts at an end of the annealing range of lateral distance.

The exemplar method may contemplate a step of relocating the surface for processing from the enclosure to a laterally extending outfeed portion located downstream from the enclosure. In this circumstance, the exemplar method may comprise additionally cooling, during the step of relocating to the laterally extending outfeed portion or contemporaneous with the step of relocating of the surface for processing, the surface for processing using one or more heat sinks that remove heat from the surface for processing.

The construction and method of operation of the invention, however, together with additional objects and advantages thereof, will be best understood from the following descriptions of specific embodiments when read in connection with the accompanying figures.

BRIEF DESCRIPTION

Figure 6B:
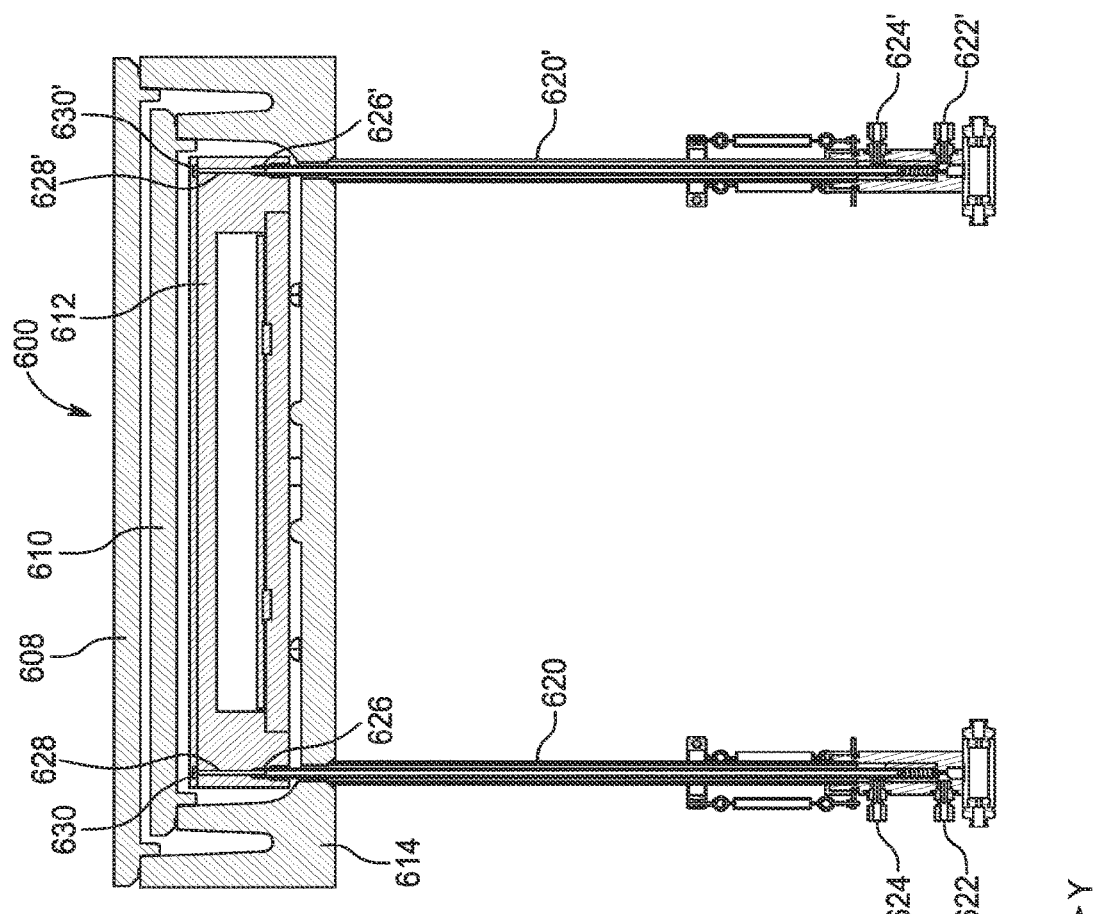
FIG. 6A shows a side view of the single furnace sub-structure of FIG. 4B and an assembly of components including a portion of an enclosure (e.g., an assembly of muffles in series) having defined therewithin an opening, through which a substrate is conveyed for producing graphene thereon.
Figure 6A:
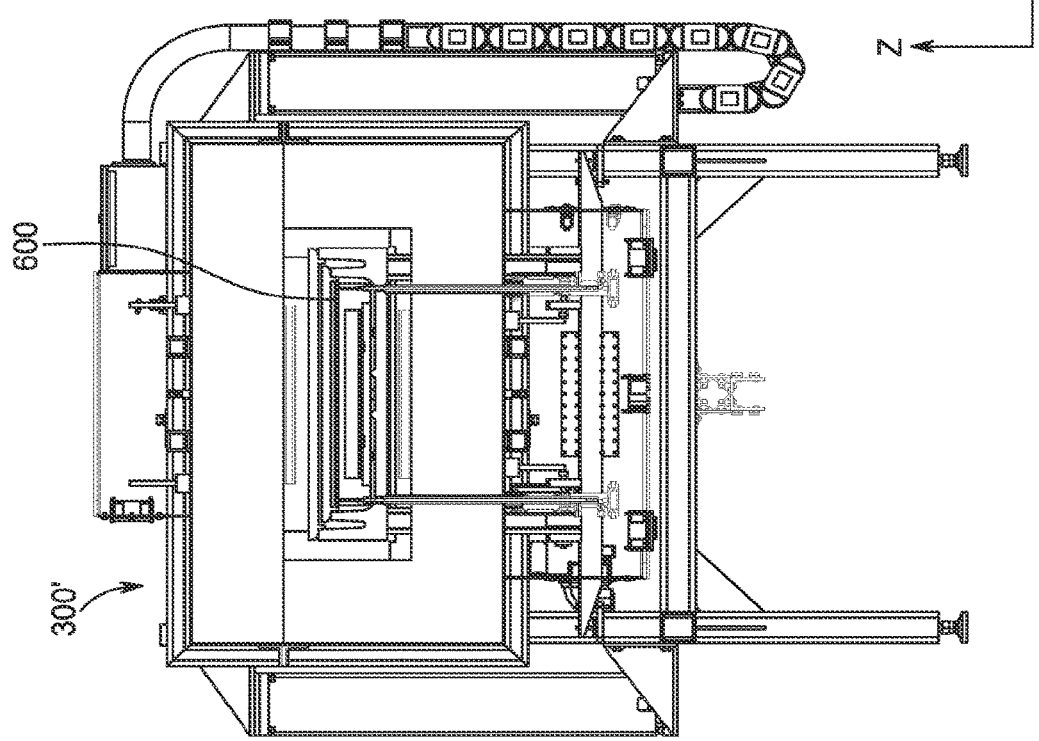

FIG. 6B shows a side view of a sub-enclosure, which is part of the enclosure of FIG. 6A (certain details not shown to simplify illustration), being fitted with multiple gas nozzles, each of which is part of a gas distribution system that provides a processing gas, e.g., annealing gas composition or producing composition including a hydrocarbon that is not necessarily gaseous, inside the sub-enclosure.

Figure 4A:
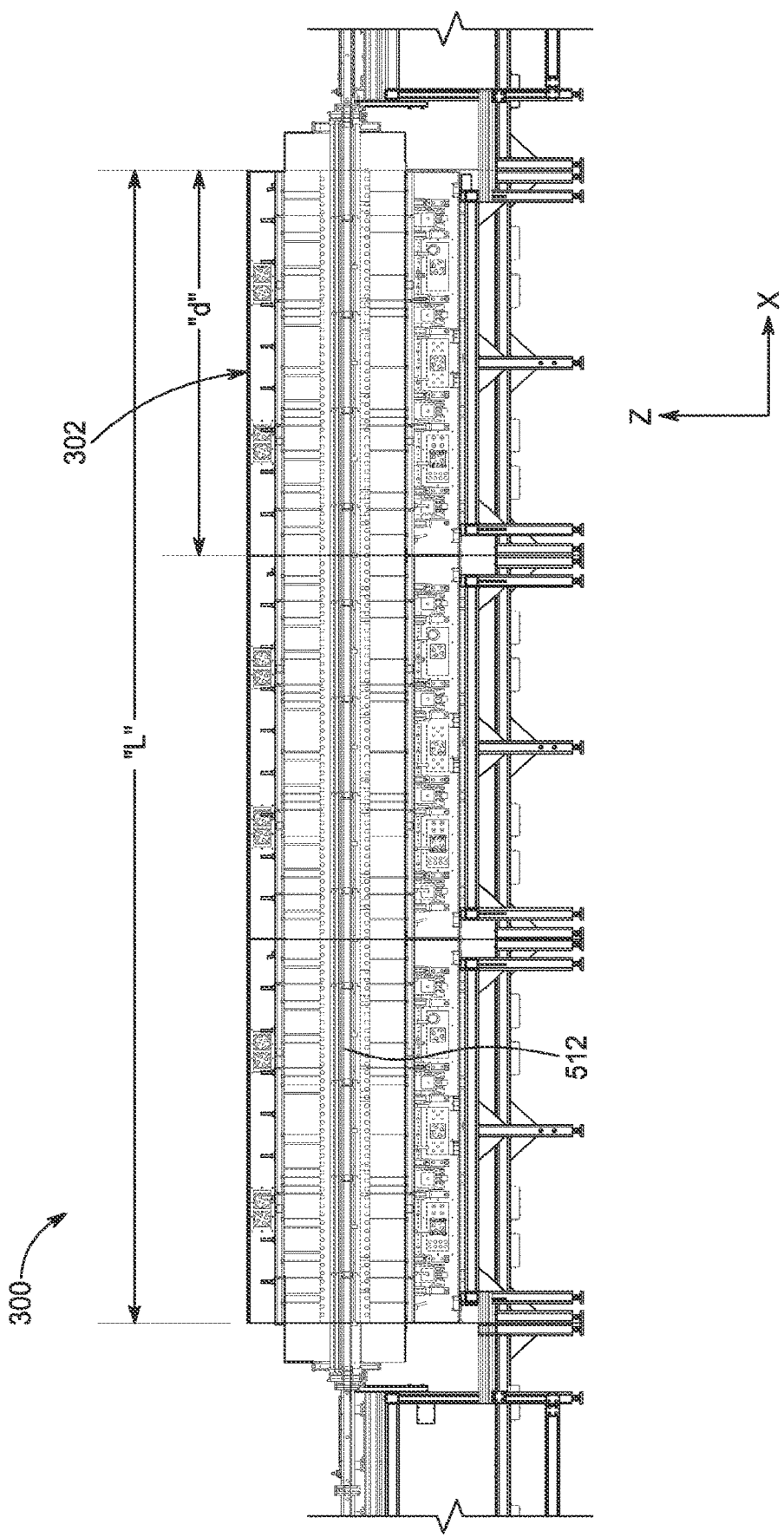
FIG. 4A shows a side cross-sectional view of the furnace of FIG. 1 and assembled using repeating furnace sub-structures.
Figure 7:
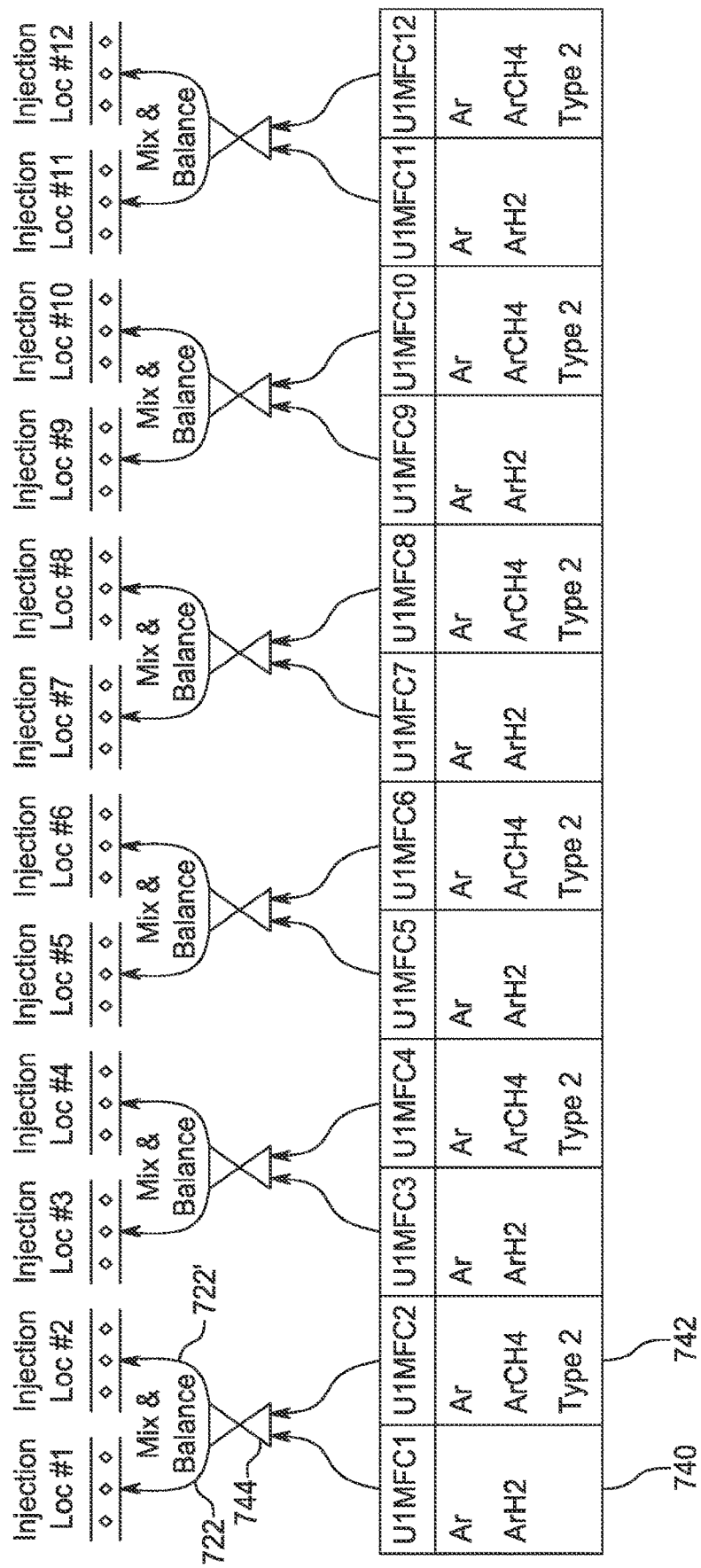

FIG. 7 shows a block diagram of a portion of multiple gas distribution systems that include mass flow controllers and control valves that deliver appropriate amounts of component processing gases and/or one or more hydrocarbons (that are not necessarily gaseous) at various locations inside the enclosure of FIG. 4A.

Figure 8A:
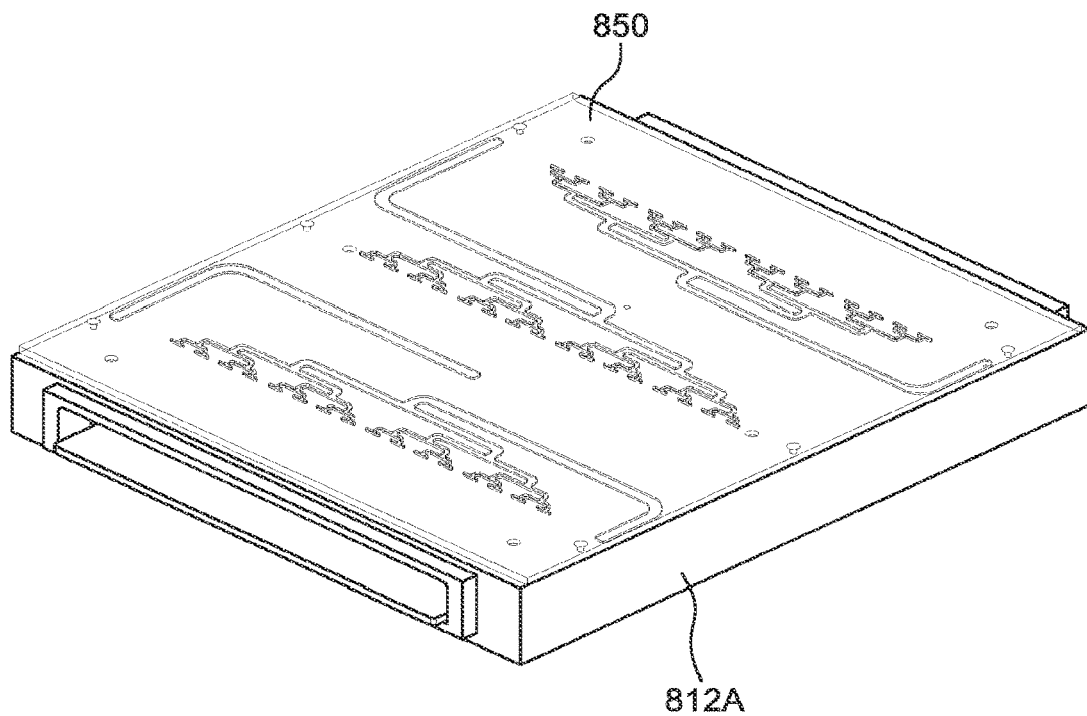

FIG. 8A shows a perspective, cutaway view of a gas injection plate disposed above the sub-enclosure of FIG. 6B and represents a portion of a processing material flow path from one or more gas or non-gaseous reservoirs to the interior of the sub-enclosure of FIG. 6B.

Figure 8B:
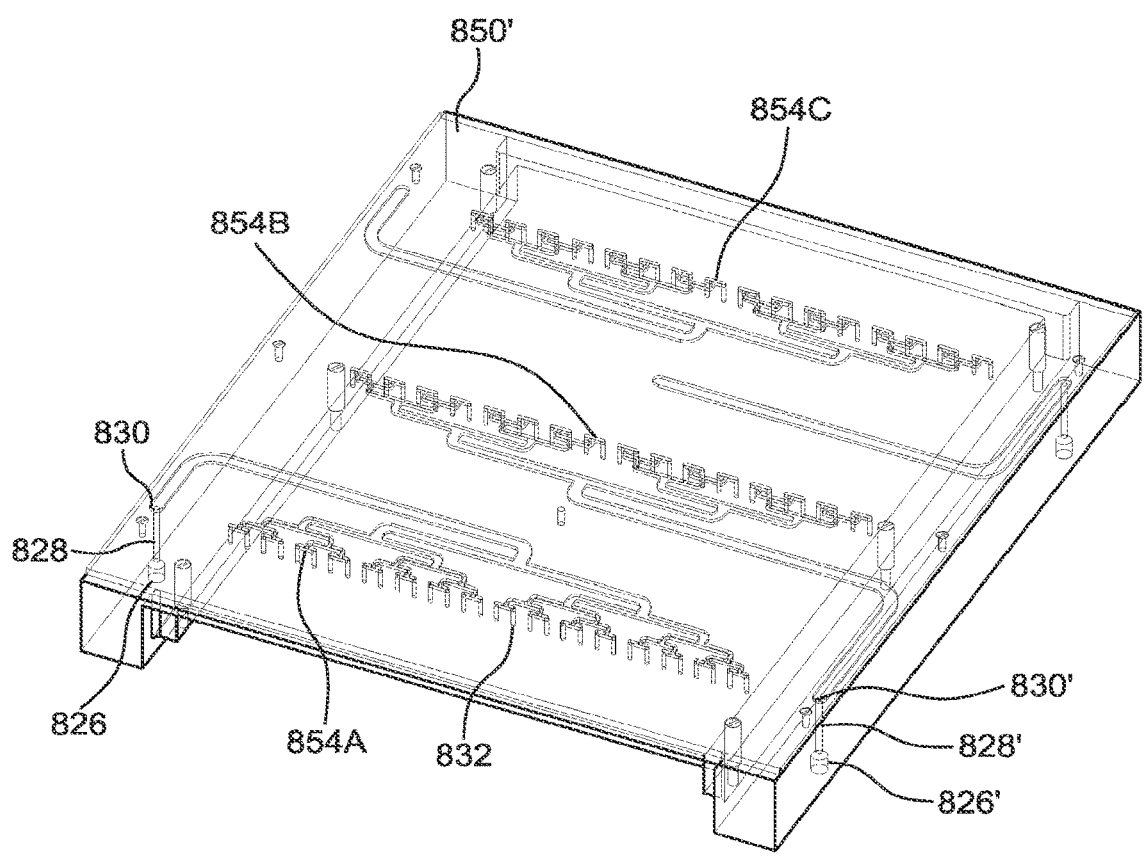

FIG. 8B shows a perspective, cutaway view of the glass injection plate of FIG. 8A having defined therein multiple gas flow networks and shows a portion of the sub-enclosure of FIG. 6B that includes a gas dispensing surface.

Figure 9:
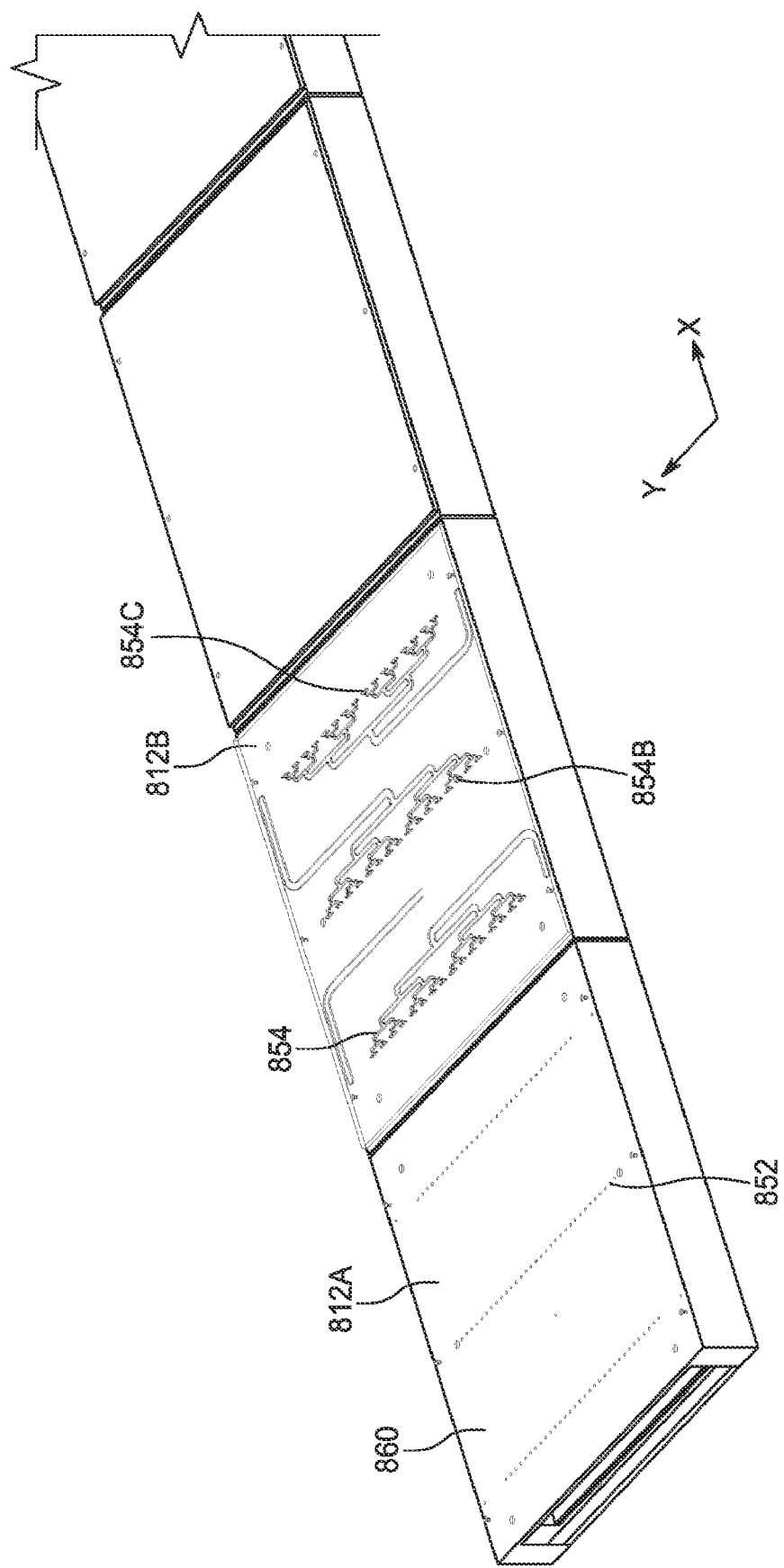

FIG. 9 shows a perspective view of multiple sub-enclosures assembled in series, wherein a first cutaway view of the first sub-enclosure reveals multiple sets of gas dispensing apertures defined on a gas dispensing surface of the first sub-enclosure and a second cutaway view of the second sub-enclosure reveals the processing gas flow networks that are disposed above and communicatively coupled to the adjacent gas dispensing apertures, wherein both the gas dispensing apertures and the gas flow networks combine to form a portion of the processing material flow path from one or more gas or non-gaseous reservoirs to the interior of the sub-enclosure of FIG. 6B.

Figure 10B:
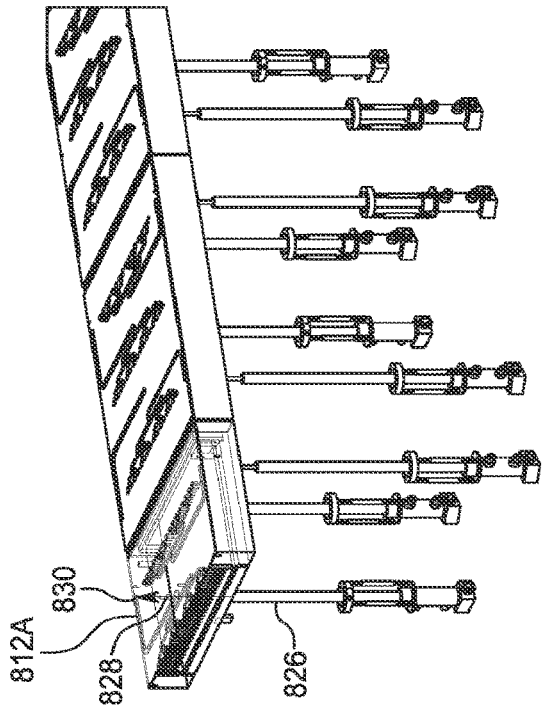
Figure 10C:
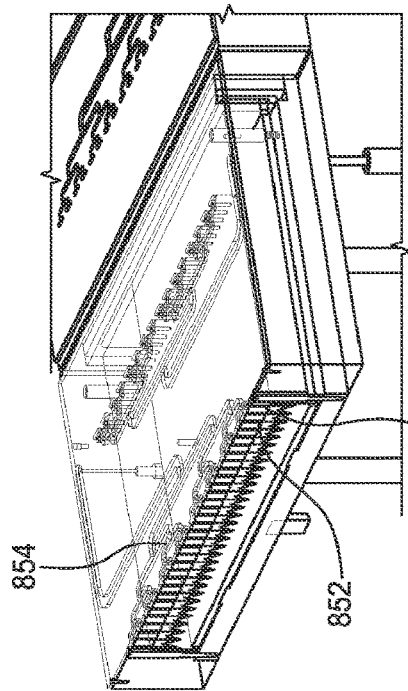
Figure 10A:
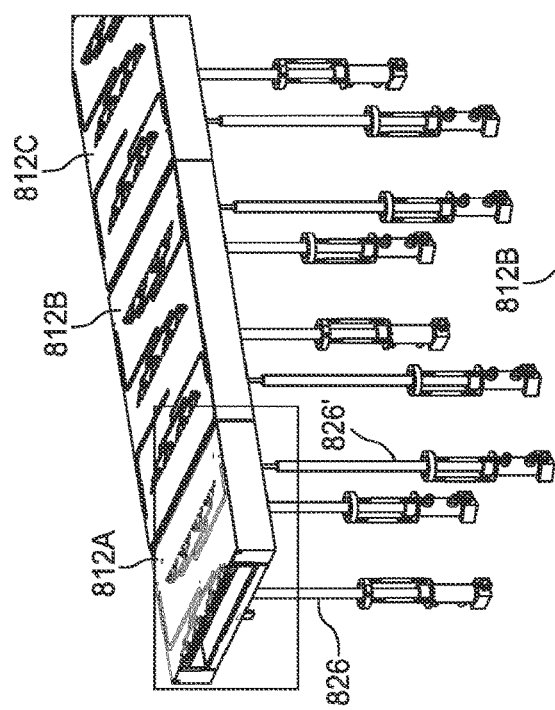

FIG. 10A shows a perspective view of the assembly of multiple sub-enclosures of FIG. 9 and that each sub-enclosure is fitted with multiple gas nozzles as conveyed by FIG. 6B.

FIG. 10B shows a perspective view of the assembly of multiple sub-enclosures of FIG. 9 and a portion of the processing material flow path defined inside the sub-enclosure, through an associated gas injection plate and ultimately to the interior of the sub-enclosure of FIG. 6B.

FIG. 10C shows in greater detail the portion of the processing material flow path shown in FIG. 10B.

Figure 11:
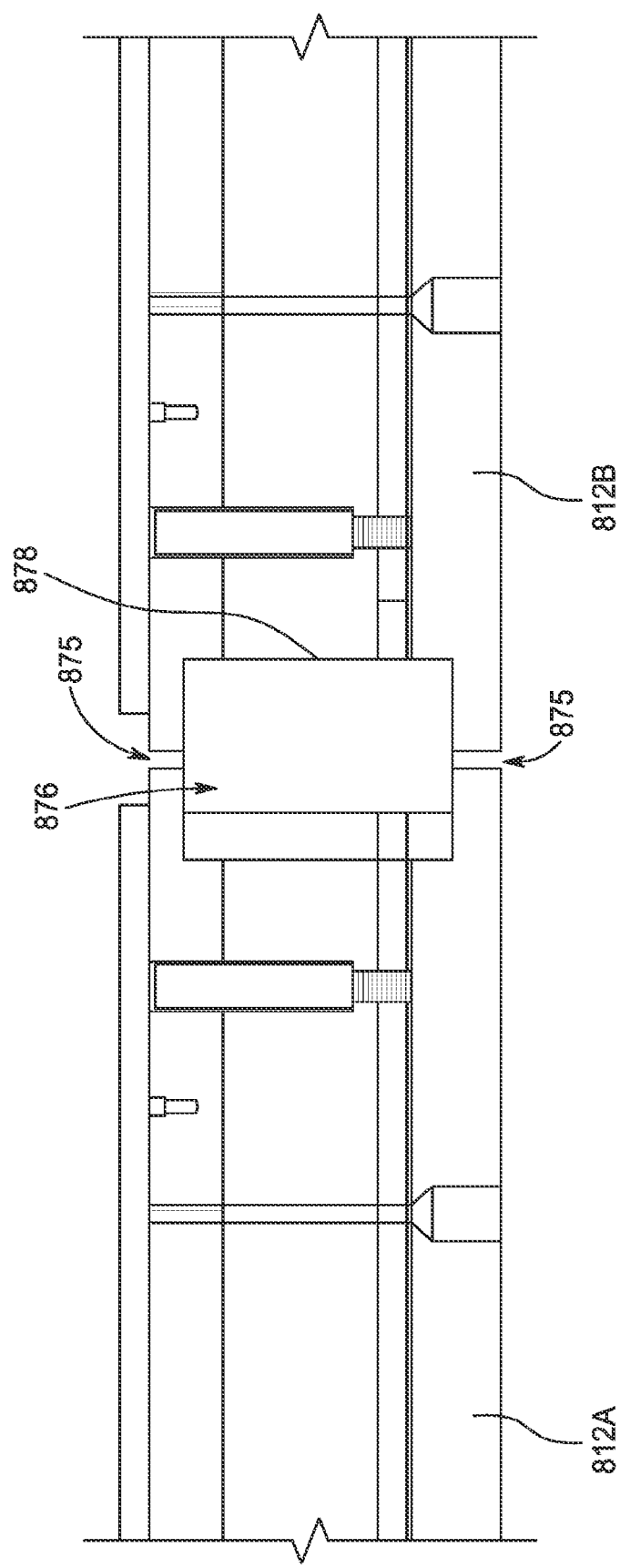

FIG. 11 shows a side view of a connecting location between two sub-enclosures and the connecting components involved for coupling multiple sub-enclosures in series to form the enclosure disposed inside the furnace shown in FIG. 4A.

Figure 12:
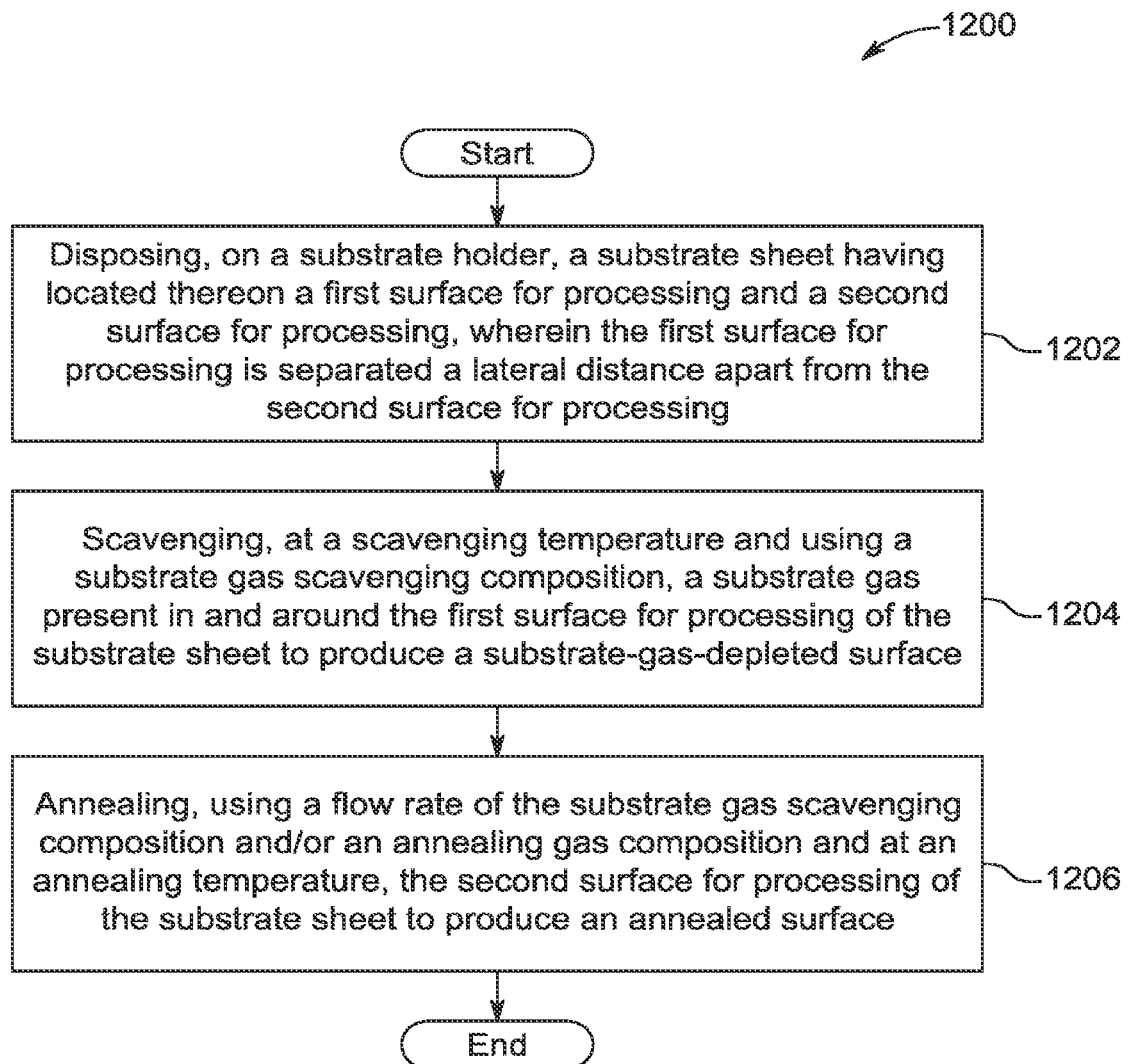

FIG. 12 shows a flowchart of a method for processing, according to one embodiment of the present teachings, a substrate for graphene formation including scavenging substrate gases on a first surface of the substrate and annealing a second surface of the substrate.

Figure 13:
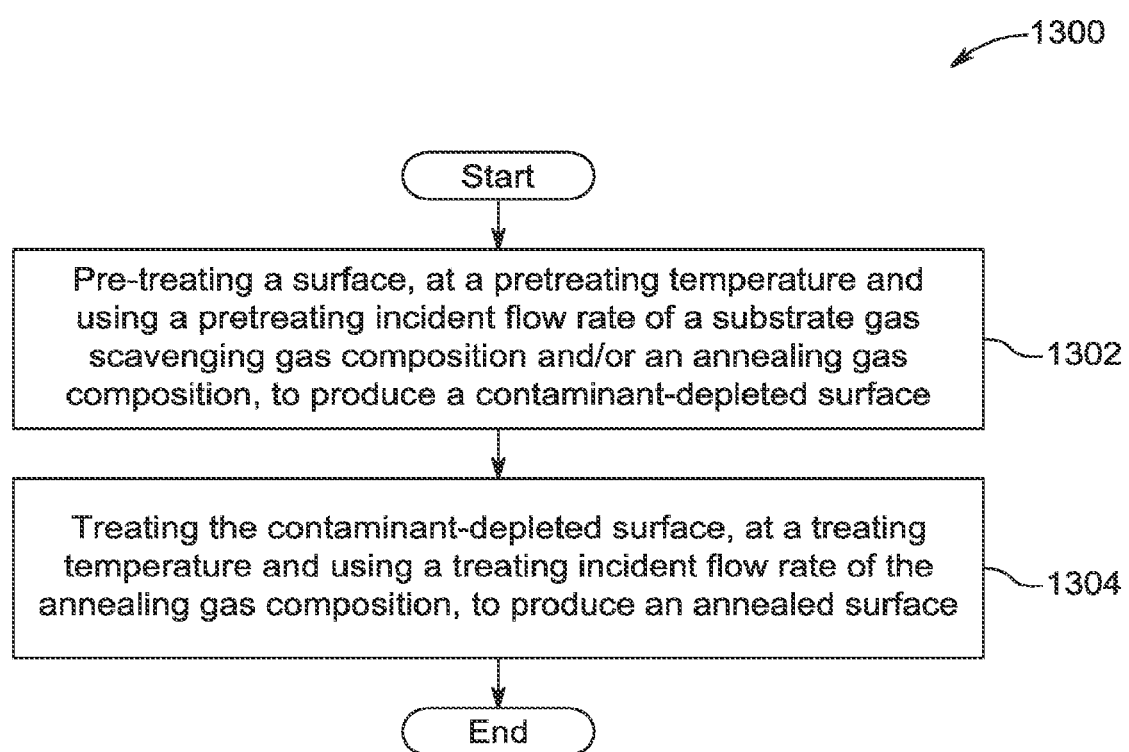

FIG. 13 shows a flowchart of a method for annealing, according to one embodiment of the present teachings, including pretreating and treating the second surface.

Figure 14:
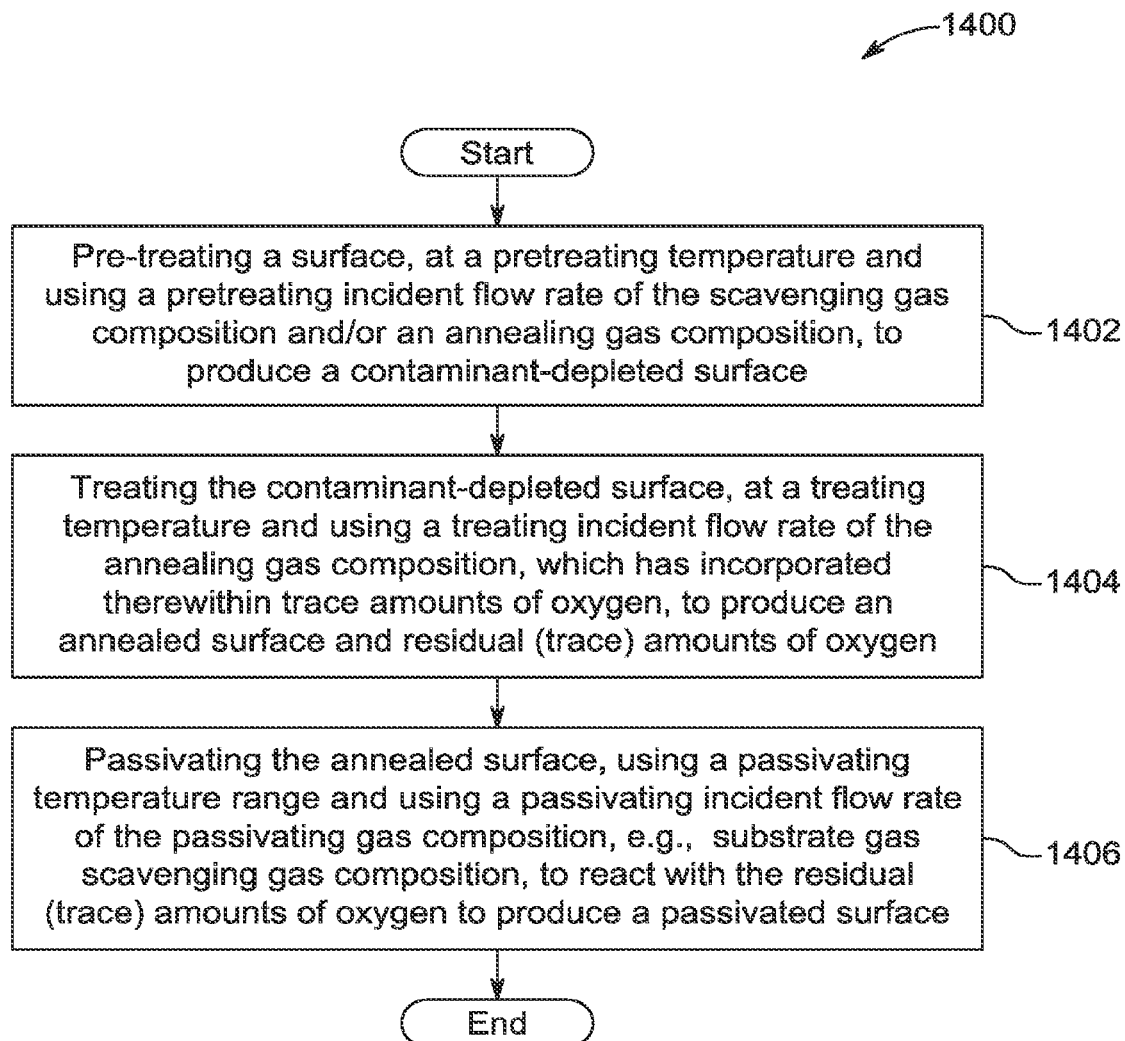

FIG. 14 shows another flowchart of another method for annealing, according to an alternate embodiment of the present teachings, including pretreating, treating, and passivating the second surface.

Figure 15:
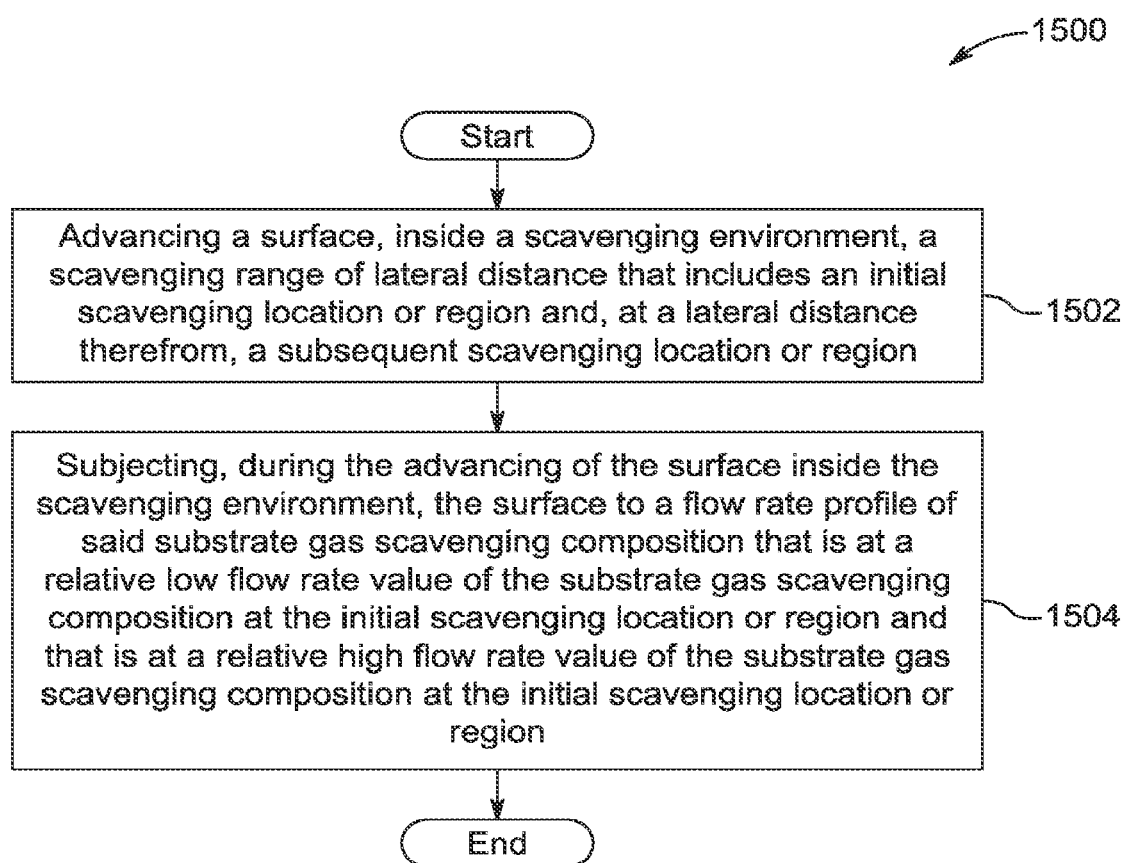

FIG. 15 shows a flowchart of a method for scavenging, according to one embodiment of the present teachings, including advancing the first surface of the substrate a certain lateral distance and scavenging the first surface, during the advancing step, using a substrate gas scavenging composition.

Figure 16:
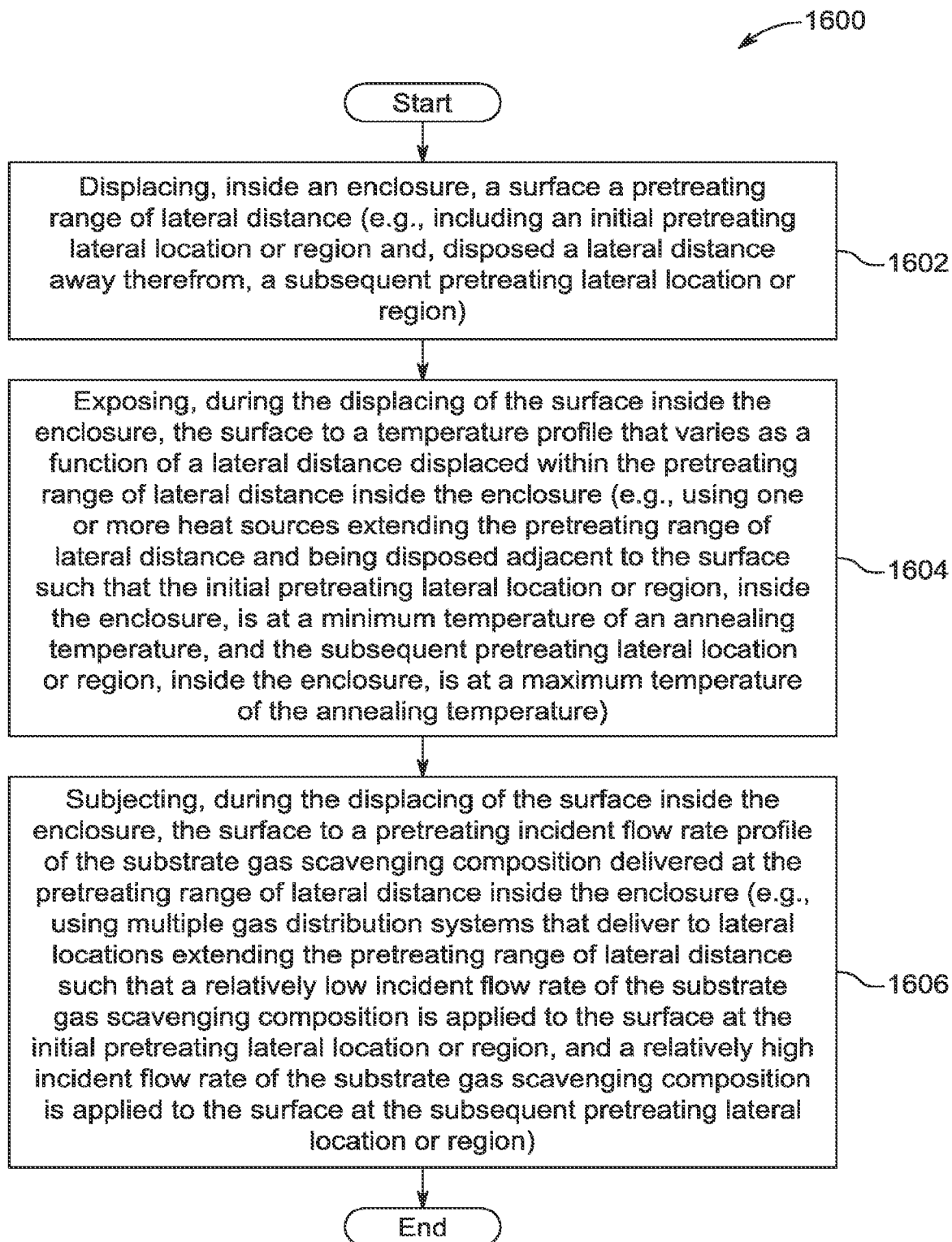

FIG. 16 shows a flowchart of a method for pretreating, according to one embodiment of the present teachings.

Figure 17:
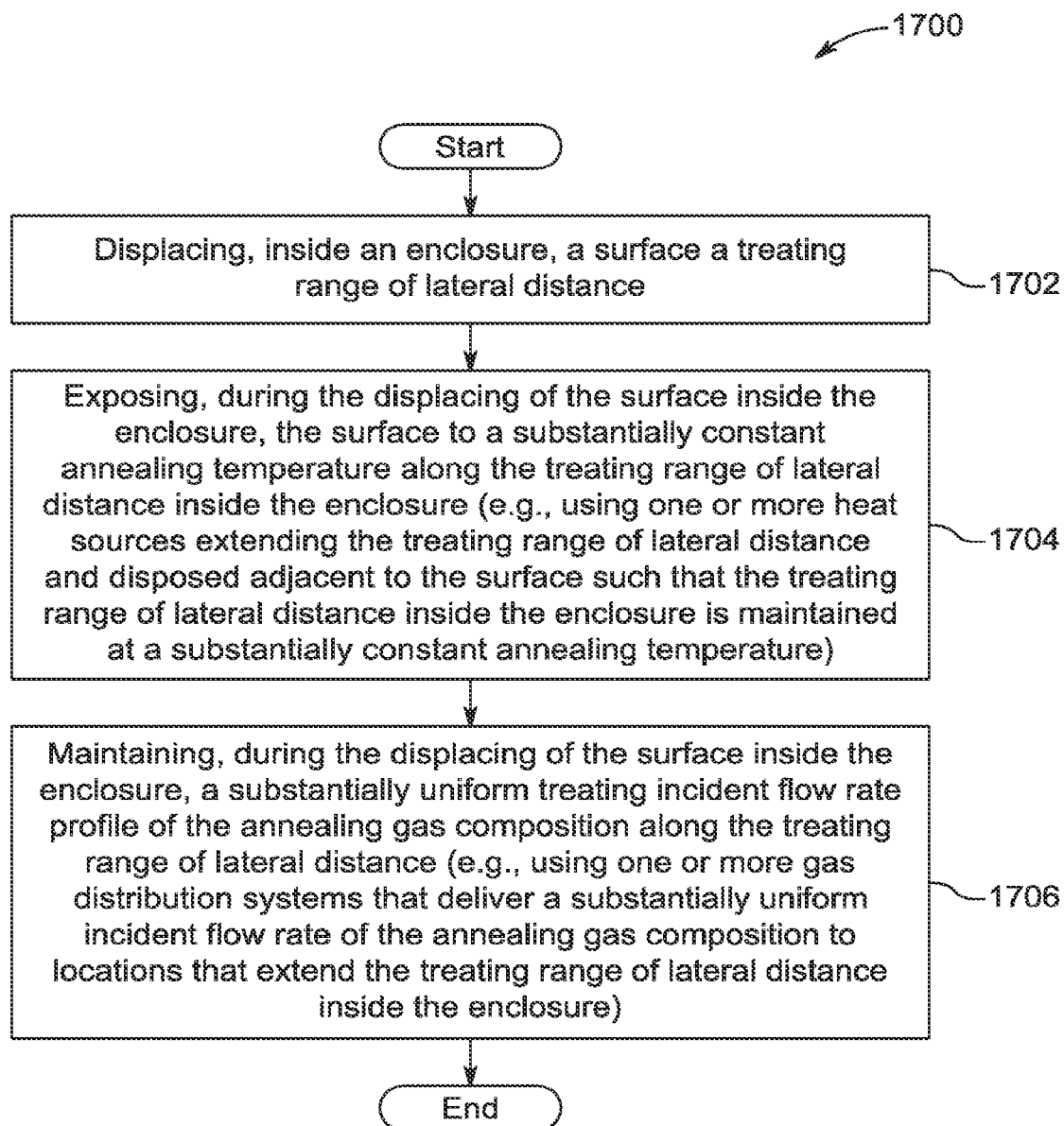

FIG. 17 shows a flowchart of a method for treating, according to one embodiment of the present teachings.

Figure 18:
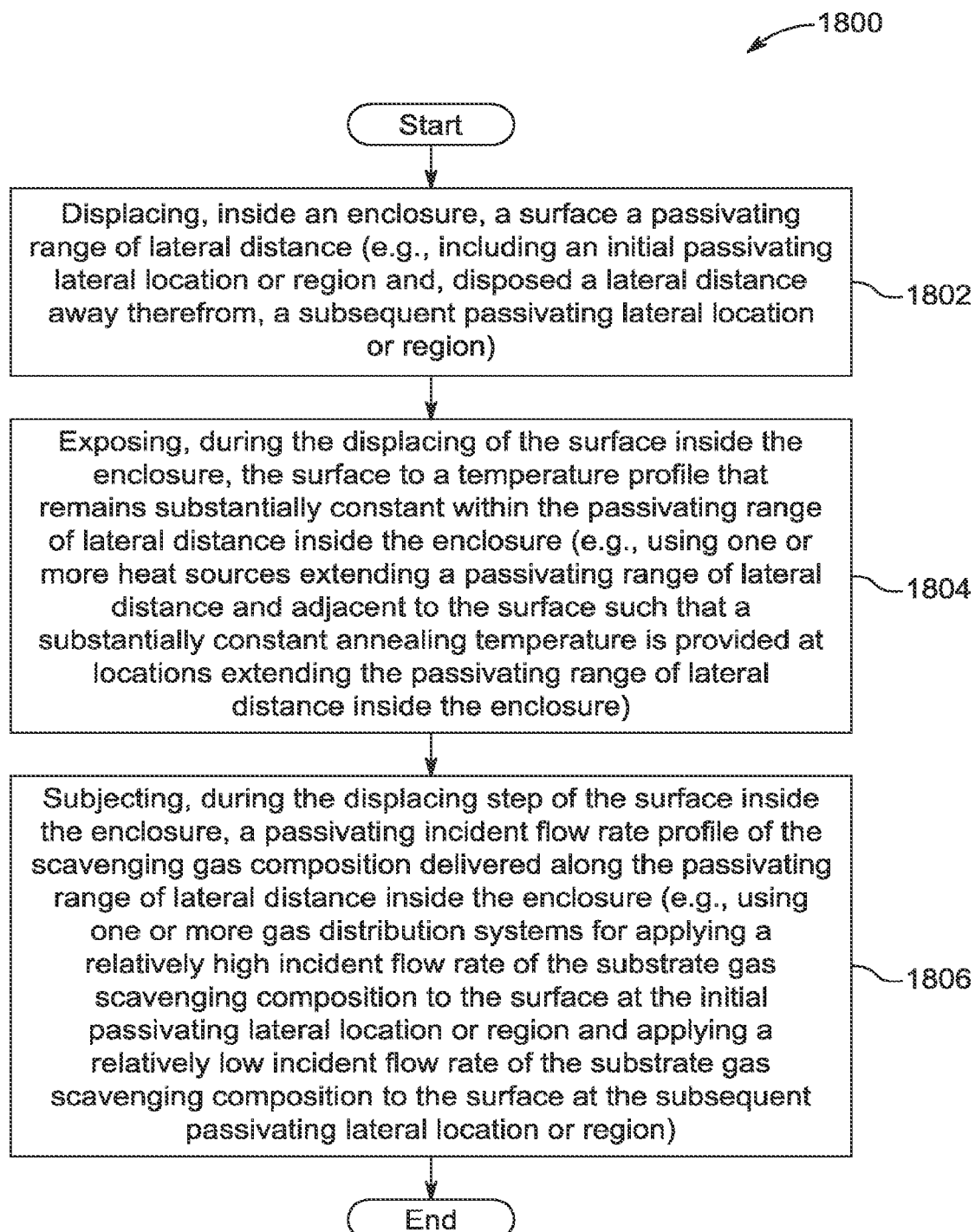

FIG. 18 shows a flowchart of a method for passivating, according to one embodiment of the present teachings.

Figure 19:
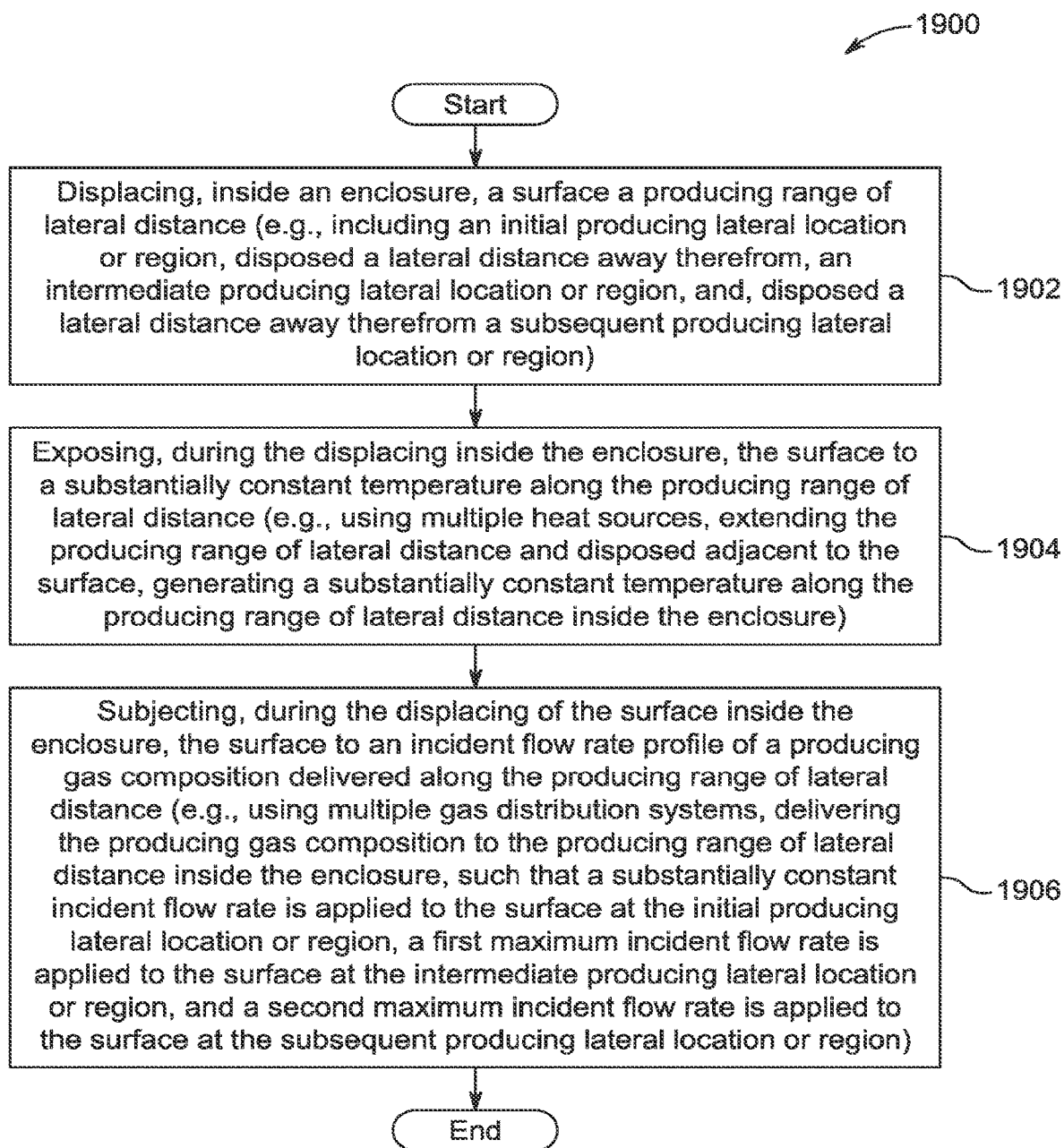

FIG. 19 shows a flowchart of a method for producing, according to one embodiment of the present teachings, graphene on a substrate surface.

Figure 20:
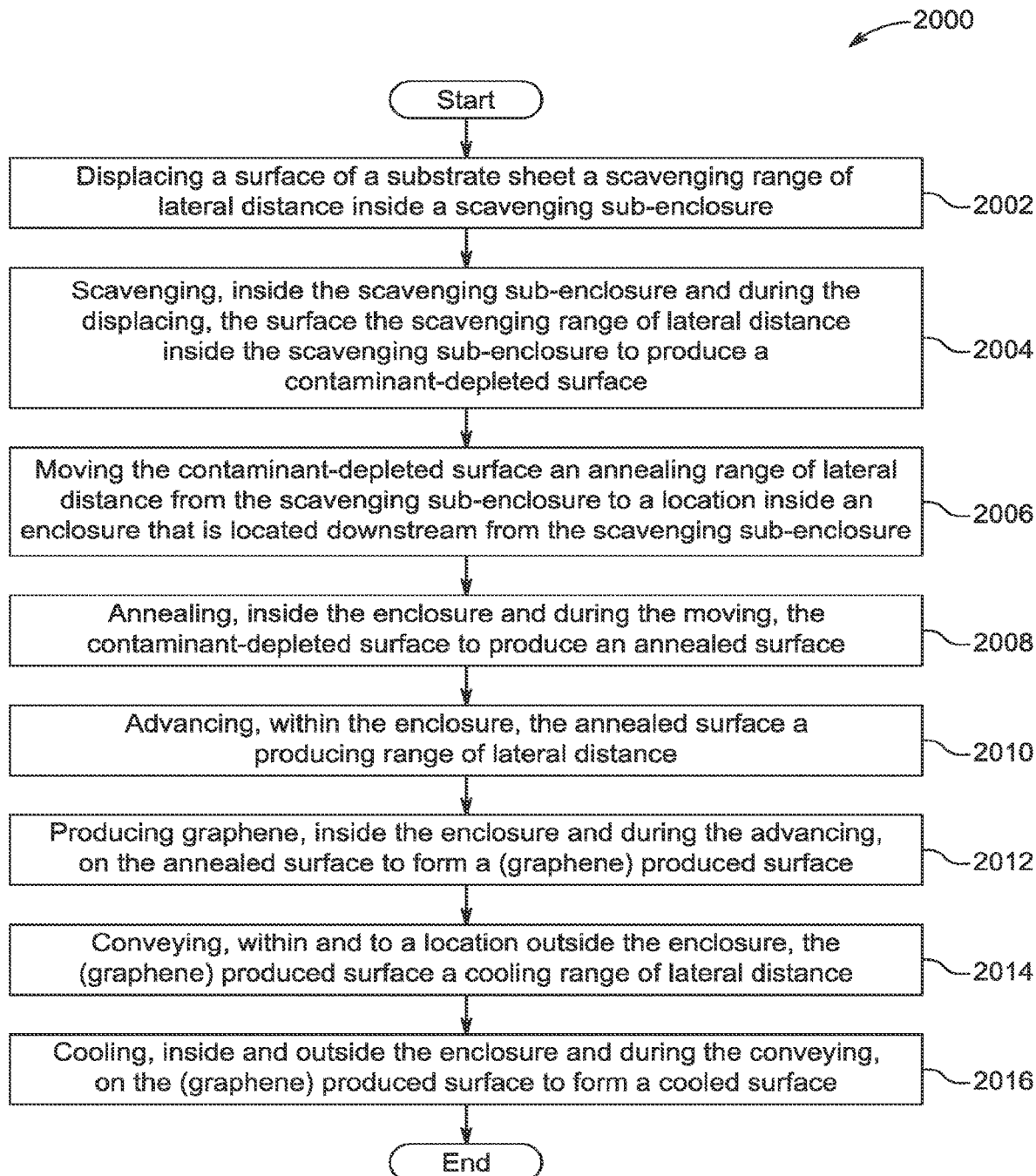

FIG. 20 shows a flowchart of a method for processing, according to one embodiment of the present teachings, a substrate surface for effectively producing graphene thereon.

DETAILED DESCRIPTION

In the following description numerous specific details are set forth to provide a thorough understanding of the present invention. It will be apparent, however, to one skilled in the art that the present invention may be practiced without limitation to some or all these specific details. By way of example, advantages of high throughput and high yield offered by the present arrangements and present teachings are realized in a batchwise approach to graphene formation and are not limited to the different embodiments of the continuous approach described herein. As another example, certain embodiments are described in terms of processing gases, but the present teachings recognize that reservoirs, gas nozzles, gas dispensing apertures or flow paths may have stored therein and/or convey non-gaseous processing materials that transform into a gaseous state during processing. In other instances, well known process steps have not been described in detail to not unnecessarily obscure the invention.

As explained above, a conventional approach of graphene formation that relies upon multiple isolated treatment units suffers from several drawbacks. The present teachings recognize that one such drawback is that the entire substrate surface undergoing processing inside a single treatment unit is subjected to a single set of operating conditions. Under this approach, even if a conveyor displaces the substrate surface from one treatment unit to another, the outcome is undesirable. i.e., the entire substrate surface is subjected to a single set of operating conditions. The present teachings recognize that another conventional approach that changes operating conditions, inside a single treatment unit, one condition at a time also suffers from the same drawback as the substrate surface is subjected to a single set of operating conditions.

Against this backdrop, the present arrangements and present teachings are not so limited as they offer numerous embodiments that provide structural provisions for implementing and/or implement multiple sets of operating conditions inside the same treatment unit and/or simultaneously inside different treatment units. Accordingly, the present systems and methods offer high yields and high throughputs for graphene formation that are not realized by conventional approaches of graphene formation.

Figure 1:
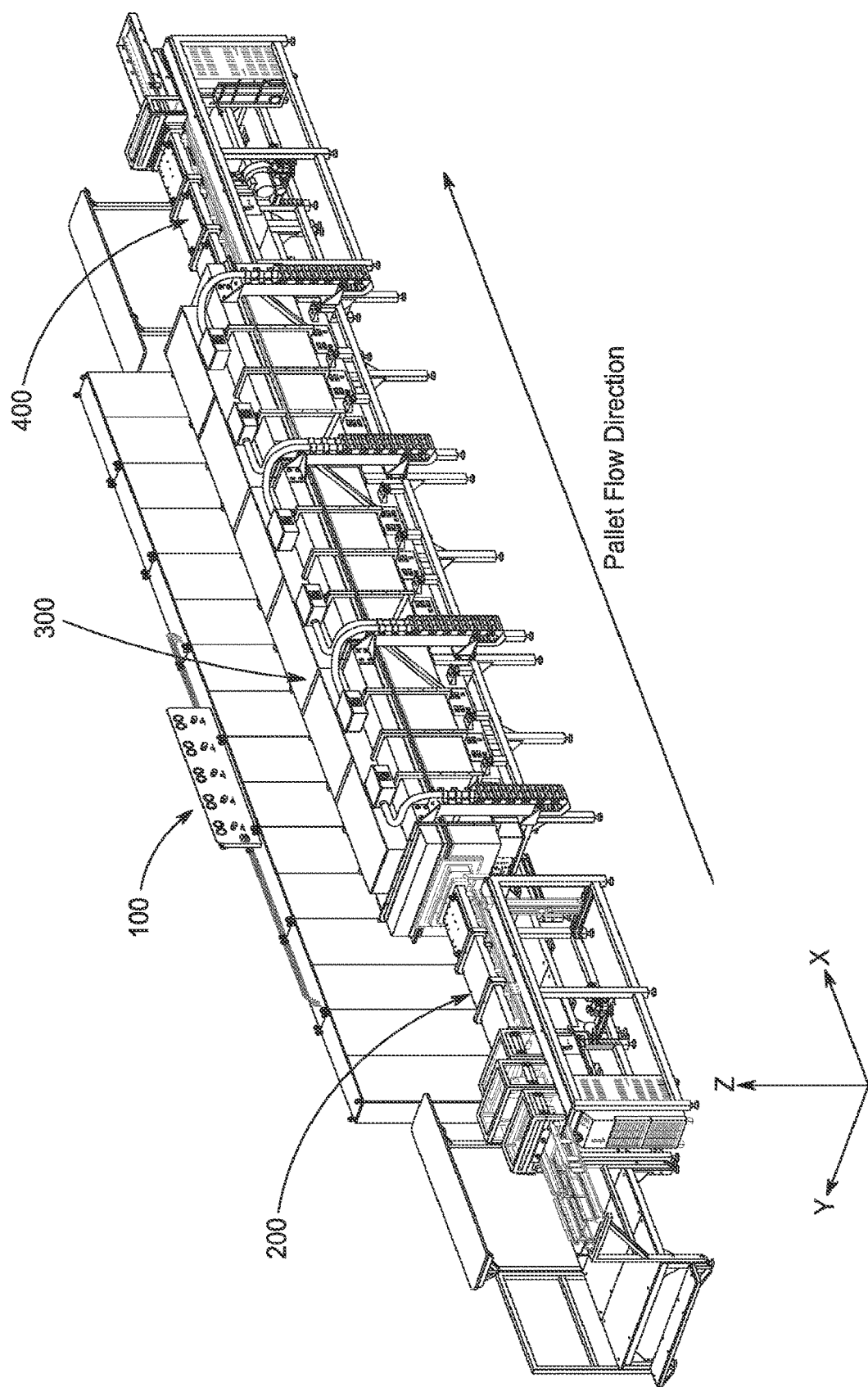
FIG. 1 shows a perspective view of a continuous graphene formation system, according to one embodiment of the present arrangements, including an infeed portion, a furnace, and an outfeed portion.

FIG. 1 shows a continuous graphene formation system 100, according to one embodiment of the present arrangements, including an infeed portion 200, a furnace 300, and an outfeed portion 400. Each of infeed portion 200, furnace 300 and outfeed portion 400 extends a certain lateral distance, i.e., a certain distance along the X-axis as shown in FIG. 1. In this embodiment, continuous graphene formation system 100, accordingly, extends a total lateral distance, which is a sum of the lateral distances that its component subsystems extend. As explained below, as a substrate, upon which graphene is produced, travels this total lateral distance it undergoes different types of processing at different lateral locations, e.g., different distance values on the X-axis. Stated another way, certain structural provisions and/or processing features provided by the present arrangements and teachings are a function of (or depend upon) the lateral location, e.g., distance value on the X-axis.

In one embodiment, a substrate is fed through infeed portion 200. As the substrate travels a lateral distance of infeed portion 200, it encounters certain localized processing conditions, e.g., scavenging conditions. The present arrangements and teachings provide certain structural provisions and processing features, along the lateral distance of infeed portion 200, to effectively prepare the substrate, prior to downstream processing, by removing or scavenging contaminants (e.g., gas contaminants present in or around the substrate).

Upon the substrate's arrival inside or after a small amount of lateral distance inside one end of furnace 300, it is subjected to high temperatures (e.g., about 500° C. and above) for additional processing to create a substantially clean substrate surface, i.e., a contaminant-depleted substrate surface. The present teachings recognize that creating a contaminant-depleted substrate surface, prior to producing graphene on the substrate surface, provides a high yield graphene producing systems and methods. Building on this recognition, the present arrangements and the present methods of graphene formation continue to provide certain laterally disposed structural provisions and processing features inside furnace 300 and outfeed portion 400 to realize significantly high yields and high throughput of graphene formation. Conventional graphene producing systems and methods fail to recognize these advantages of the present teachings, much less offer such structural provisions and processing features.

By way of example, as the contaminant-depleted substrate surface displaces another lateral distance inside the same furnace 300, it undergoes, at certain lateral locations, certain novel processing steps, according to the present teachings, associated with annealing to produce an annealed surface.

Further, the annealed surface is laterally conveyed yet another lateral distance inside the same furnace, for production, thereon, of graphene having the desired characteristics for its intended commercial application. Again, structural provisions and processing features of the present arrangements and the present teachings implement, at certain lateral locations, certain novel processing steps associated with production of the requisite quality of graphene. After production of graphene has concluded, cooling of the substrate surface begins.

Preferably, cooling of the substrate surface, with graphene deposited thereon, commences when the substrate is still present inside the same furnace and near outfeed 400 and concludes near or at the end of outfeed 400. Thus, the substrate surface with graphene deposited thereon is conveyed yet another lateral distance that starts from inside furnace 300 and extends to the end of outfeed 400. Novel structural provisions and processing features, at certain lateral locations within this lateral distance from furnace 300 to outfeed 400, provided by the present arrangements and the present teachings implement cooling of the substrate surface immediately, e.g., on the order of a few seconds, after graphene is deposited thereon. Rapid cooling, after production, of graphene allows for effective downstream recovery of the adhering graphene from the adjacent substrate surface to realize a high yield and high throughput for graphene formation.

Further, structural provisions and processing features of the present arrangements and the present teachings do more than offer high yield and high throughput for graphene formation. In the absence of a gas or a mechanical barrier within and between the different component subsystems, the present arrangements and the present teachings prevent or minimize both cross-contamination and cross-interference between the different types of processing of the substrate being carried out inside continuous graphene formation system 100. To facilitate a detailed description, FIGS. 2, 3A, 3B, 4A, 4B, 5, 6A, 6B, 7, 8A, 8B, 9, 10A, 10B and 11 show the salient structural provisions offered by the present arrangements and FIGS. 12-20 describe the major steps involved in the processing features of the present teachings.

Figure 2:
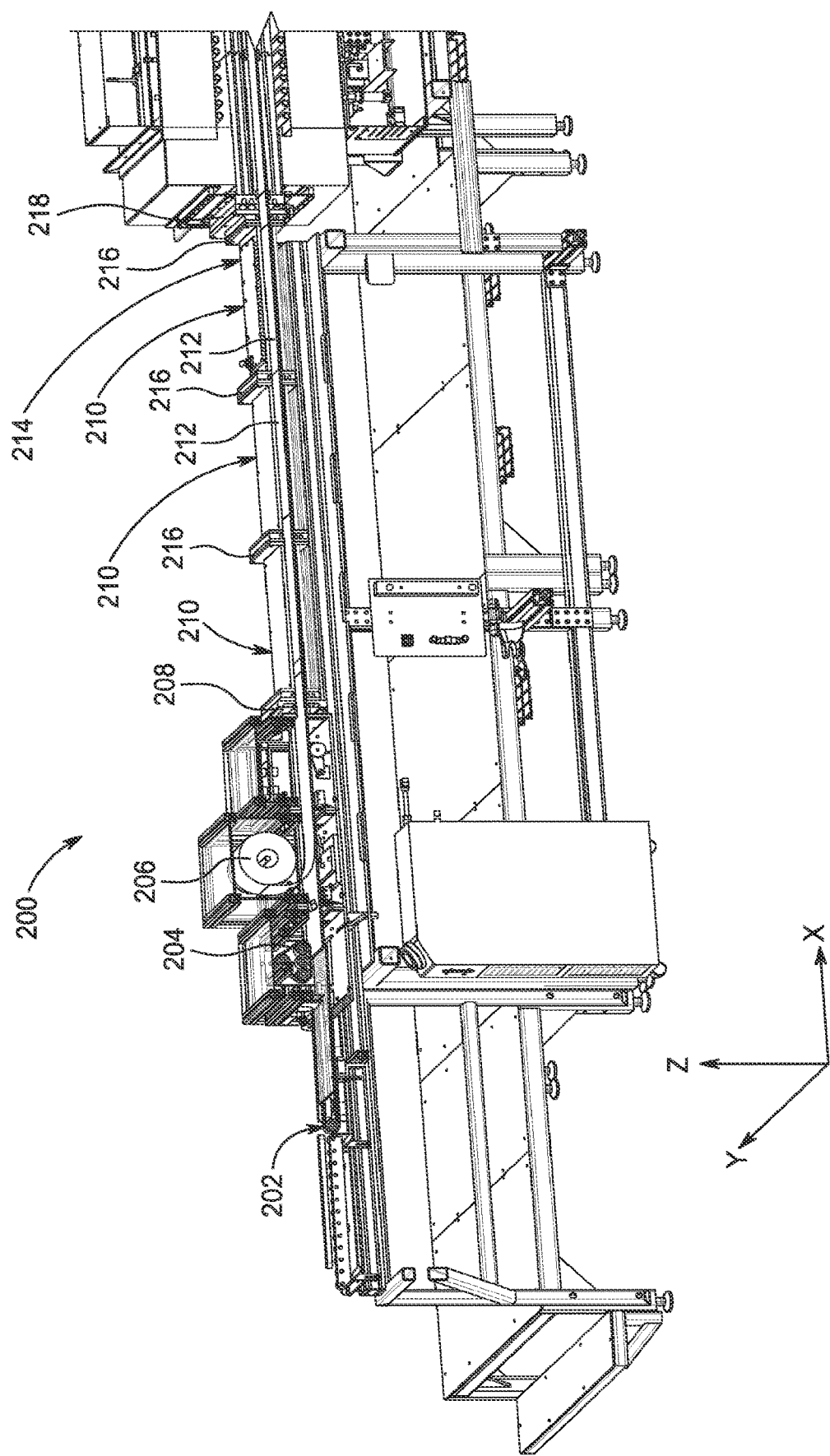
FIG. 2 shows a perspective, cutaway view of the infeed portion of the continuous graphene formation system of FIG. 1.

FIG. 2 shows certain salient components inside infeed portion 200 including rollers 202, a belt drive system 204, a substrate roll 206, a flexible bellows joint 208, tunnels 210, multiple pallets 212, a chiller plate 214, gas curtains 216, and a chiller block 218.

During an operational state of graphene formation system 100, rollers 202, operating under a gravitational force, advance a substrate holder comprising multiple pallets 212 towards a location underneath a substrate roll 206. In certain embodiments, a continuous drive system of the present arrangements, e.g., belt drive system 204, direct push drive system, rack and pinion system or chain drive system, preferably, drives or rotates a subassembly of multiple rollers, e.g., rollers 202, to advance pallets 212 towards a location underneath a substrate roll 206. In one embodiment, rollers 202 of the present arrangements are cogs that fit into a complementary structure on pallets 212, which are preferably made from graphite to withstand high levels of heat present inside an enclosure within furnace 300.

In this operational state, substrate roll 206, that may be controlled by a servo motor and an ultrasonic sensor detecting slack loop, dispenses an appropriate length of a substrate sheet that is disposed on and laterally extends (i.e., extends in the X-direction) upon pallets 212. In one embodiment, the substrate holder in the present arrangements is a single continuous belt that preferably laterally extends the total lateral distance of continuous graphene formation system 100.

Regardless of whether pallets 212 or a continuous belt are/is used as a substrate holder, the present teachings recognize that the roll out motion of substrate roll 206 is not always dictated by a continuous motion of the advancing pallets 212 but that the forward movement of the laterally extending substrate sheet is dictated by the supporting, advancing pallets. In an alternative design of infeed portion 200 of the present arrangements, a speed matching system is employed for matching forward substrate holder speed with a linear amount of the substrate sheet unrolled per unit time.

In certain embodiments of the present arrangements, the pallets (e.g., substantially similar in form to pallets 212 of FIG. 2) are stationary and are not in motion as mentioned above in connection with FIG. 2. In these "stationary" embodiments of the substrate holder of the present arrangements, the supported substrate sheet is unrolled from substrate roll 206 and displaced above the stationary pallets. In preferred implementations of these arrangements, substrate roll 206 may rely on at least one of the above-described components, e.g., servo motor, sensor for slack loop detection and speed matching, for an effective roll out of the substrate sheet.

Inside infeed portion 200, the advancing substrate sheet is protected from ambient conditions and contaminants by tunnels 210 positioned above and around a linear rail system. Approximate a location of a first tunnel, i.e., the tunnel closest to substrate roll 206 and furthest from furnace 300, flexible bellows joint 208 is provided to allow for expansion of tunnel 210 when high levels of heat escapes, as explained below, from furnace 300 of FIG. 2 towards tunnels 210. On the last tunnel, i.e., the tunnel furthest from substrate roll 206 and closest to furnace 300, preferably, chiller plate 214 is disposed to remove the heat escaping in the negative lateral direction, i.e., in the negative X-direction, from furnace 300 and thereby prevent melting or degrading of upstream components, e.g., substrate holder, linear track, tunnels, and the substrate.

In the present arrangements of an infeed portion 200, multiple tunnels 210 are arranged in series on and around a supporting linear rail system to create an enclosed environment. Pallets 212 are arranged adjacent to the linear rail system, which allows for expansion of the tunnel withstand the high levels of heat escaping from furnace 300 of FIG. 1. Further, each tunnel 210 is flanked by a gas curtain 216. In this configuration, multiple repeating structural units, each including tunnel 210 and gas curtain 216, are contiguously arranged to form infeed portion 200. Each such repeating structural unit is referred herein to as a "scavenging sub-enclosure" because of the gas scavenging conditions present therein. Specifically, the surface of substrate sheet (hereinafter referred to as the "substrate surface") includes or has disposed around it "substrate gas" and the scavenging sub-enclosure has conditions to scavenge the substrate gas. The present teachings recognize that, to those skilled in the art, certain present arrangements of the scavenging sub-enclosure may be seen as a degassing subsystem that creates a degassing environment for the substrate.

To this end, gas curtain 216 is disposed on scavenging sub-enclosures and specifically, between two infeed tunnels 210, disposed in series and that isolate contents inside infeed tunnels 210 from the ambient environment. One or more gas curtains 216 may be part of one or more scavenging gas distribution systems that provide a substrate gas scavenging composition, from one or more reservoirs containing the substrate gas scavenging composition, to locations inside one or more tunnels 210. In this configuration, gas curtain 216 includes one or more directional scavenging gas outlets that are oriented to direct at least some portion of the stream of substrate gas scavenging composition to flow inside infeed tunnels 210 in one or more different directions. By way of example, directional scavenging gas outlets may be one or more laterally-oriented gas outlets and one or more angularly-oriented gas outlets. The multiple laterally-oriented gas outlets are oriented in a direction that is parallel to the substrate holder and the multiple angularly-oriented gas outlets are oriented in a direction that is at an angle to an axis perpendicular to the substrate holder. The laterally-oriented gas outlet, in an operational state, protects the substrate sheet from contaminants present around the substrate sheet by generating a laterally flowing stream of the substrate gas scavenging composition. The angularly-oriented gas outlet, in an operational state, generates and directs an angularly flowing stream of the substrate gas scavenging composition to contact the substrate sheet.

Further, one or more of the directional curtain outlets generate one or more streams of substrate gas scavenging composition to direct the substrate gas scavenging composition and the annealing gas composition, flowing from furnace 300 into the infeed tunnels, towards an exit of infeed portion 200, i.e., an opening in infeed portion that is away from furnace 300. The gas streams and the outflowing gases prevent or minimize flow of ambient gases inside infeed tunnels 210. As a result, not only do scavenging sub-enclosures scavenge the substrate gas composition, but also prevent contaminants from settling on or reacting with the substrate surface.

In preferred embodiments, infeed portion 200 of the present arrangements includes one or more scavenging gas stream generating subsystems, each of which provides a substrate gas scavenging composition at appropriate flow rates (which dictates the scavenging composition's pressure inside) to multiple scavenging gas outlets. In this configuration, at least one scavenging gas outlet is arranged at a first corresponding location inside the different scavenging sub-enclosures. A collection of the scavenging gas outlets arranged at the first corresponding location inside each of the different scavenging sub-enclosures comprise a first set of scavenging gas outlets. The substrate gas scavenging composition streams produced from the first set of scavenging gas outlets are combined to form a first continuously flowing substrate gas scavenging composition stream that spans across multiple scavenging sub-enclosures. The present teachings recognize that inside each of the different scavenging sub-enclosures, there are present multiple sets of such corresponding locations (e.g., a top left corner location inside multiple tunnels 210, or a top right corner location inside multiple tunnels 210) where scavenging gas outlets may be arranged to form multiple sets of correspondingly located scavenging gas outlets. In preferred embodiments of the present teachings, multiple sets of correspondingly located scavenging gas outlets, accordingly, produce multiple continuously flowing substrate gas scavenging composition streams across multiple scavenging sub-enclosures.

Multiple continuously flowing scavenging gas streams of the present teachings effectively strip the substrate gas from the substrate surface and evacuate contents, such as argon gas and degassed material from the substrate surface, present inside infeed tunnels 210 and the scavenging sub-enclosures. Moreover, these multiple continuously flowing scavenging gas streams serve as an even more of a protective barrier, preventing surrounding contaminants from contacting the substrate surface, and serve as an even more of a scavenger of the substrate gas to produce a substrate-gas-depleted surface than a single scavenging gas stream. The present teachings recognize, however, that a scavenging sub-enclosure of the present arrangements is not limited to the configuration shown in FIG. 2 and may be of many include different components in different configurations.

Regardless of the configuration of the scavenging sub-enclosure, an appropriate value for a feed rate of the substrate sheet ensures that, if not all, at least appreciable amounts of oxygen present in and around the substrate surface is depleted from the substrate surface such that oxygen concertation in and around the substrate surface inside the last tunnel, before entering furnace 300, ranges from between about 5 ppm to about 100 ppm. Depending on the length of tunnels 210, and to facilitate presence of such low levels of oxygen in and around the substrate surface, pallets 212 are, preferably, advancing at a rate that ranges from about 1 mm/second to about many tens of mm/second (e.g., about 15 mm/second, about 20 mm/second, about 30 mm/second). Further, there may be one or more oxygen sensors and preferably, three oxygen sensors, provided at the bottom and/or top of the last tunnel before furnace 300 to ensure that oxygen concentration of the substrate and/or inside the last tunnel is at the requisite low level.

Like infeed portion 200, outfeed portion 400 is made from arranging multiple repeating structural units referred herein to as an "outfeed sub-enclosure." Further, outfeed portion 400 includes one or more inert gas stream generating subsystems, each of which provides an inert gas at an appropriate pressure to multiple outfeed gas outlets. Each outfeed gas outlet, in turn, generates an inert gas stream inside an associated outfeed sub-enclosure. By way of example, outfeed gas outlets may be one or more laterally-oriented outfeed gas outlets and one or more angularly-oriented outfeed gas outlets. The multiple laterally-oriented outfeed gas outlets are oriented in a direction that is parallel to the substrate holder and the multiple angularly-oriented outfeed gas outlets are oriented in a direction that is at an angle to an axis perpendicular to the substrate holder. The laterally-oriented outfeed gas outlet, in an operational state, protects the substrate sheet from contaminants present around the substrate sheet by generating a laterally flowing stream of the substrate gas scavenging composition. The angularly-oriented gas outlet, in an operational state, generates and directs an angularly flowing stream of the substrate gas scavenging composition to contact the substrate sheet.

The present teachings recognize that inside each of the different outfeed sub-enclosures, there are present multiple sets of corresponding locations where outfeed gas outlets may be arranged to form multiple sets of correspondingly located outfeed gas outlets. Each set of corresponding outfeed gas outlets is combined to produce a continuously flowing inert gas stream that spans across multiple scavenging sub-enclosures. In preferred embodiments of the present teachings, multiple sets of correspondingly located outfeed gas outlets produce multiples of such continuously flowing inert gas streams across multiple scavenging sub-enclosures. Further, some of these outfeed gas outlets are oriented to direct at least some portion of the inert gas stream to flow inside infeed tunnels 210, over the substrate surface and in a lateral direction away from furnace 300 and towards an opening in outfeed portion 400. A significant amount of heat is removed from the substrate, as explained below, using heat sinks and the continuously flowing inert gas stream from the outfeed gas outlets further facilitates substrate cooling and prevents contaminants from being introduced on the graphene and the substrate surface.

Figure 3A:
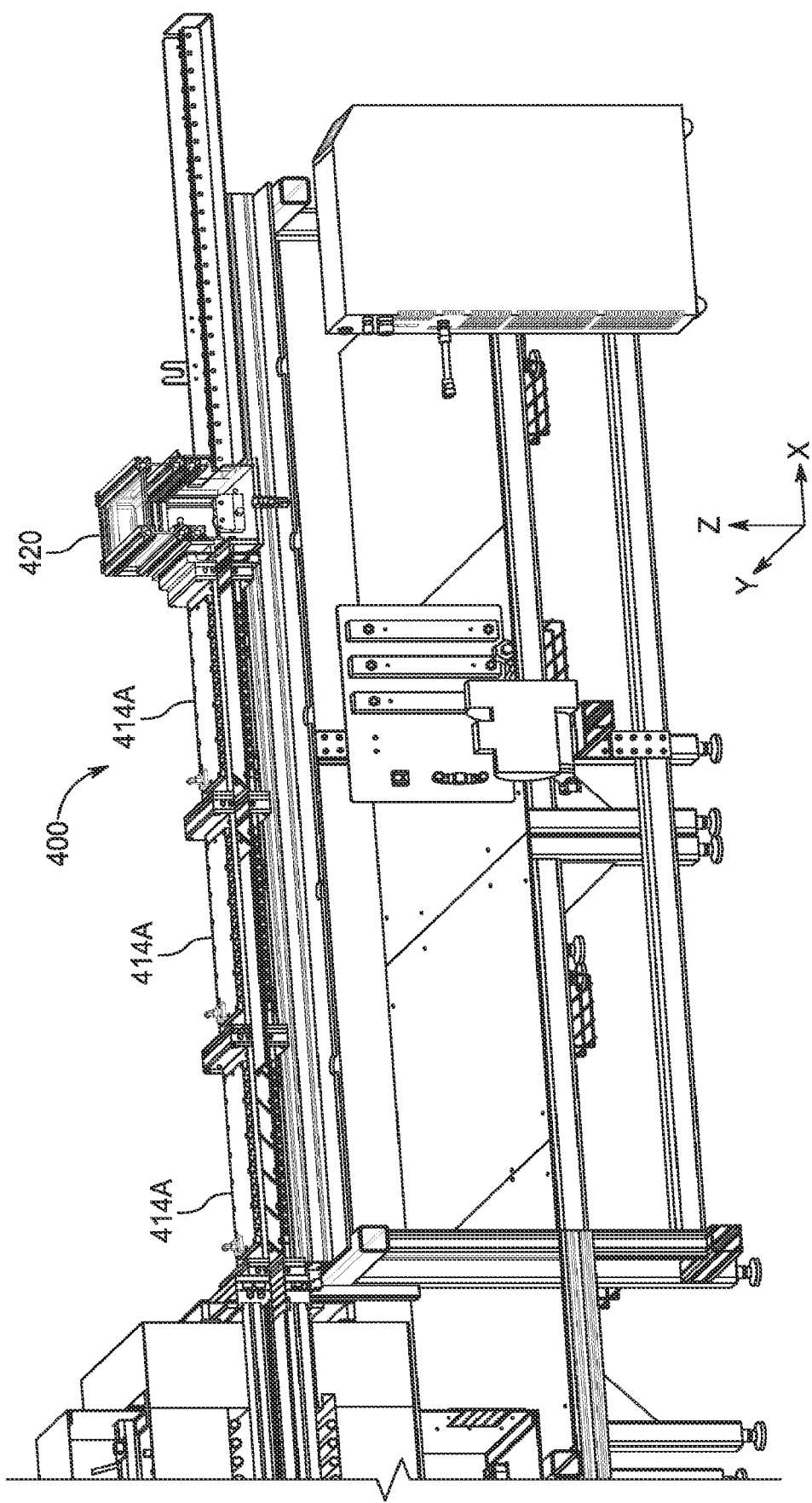
FIG. 3A shows a perspective, cutaway view of the outfeed portion, assembled using certain repeating sub-enclosures, of the continuous graphene formation system of FIG. 1.
Figure 3B:
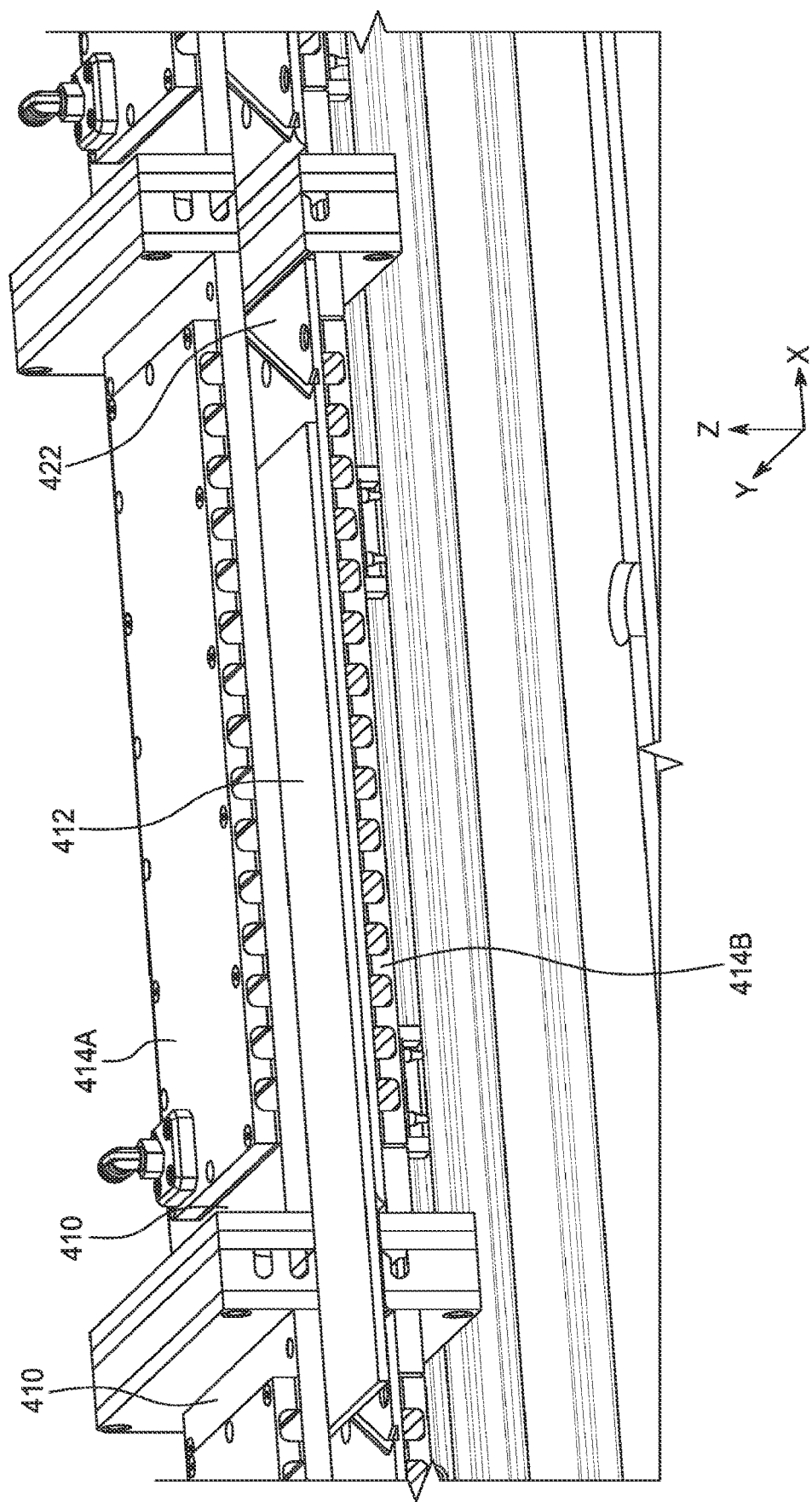
FIG. 3B shows a perspective, cutaway view of the sub-enclosure of the outfeed portion of FIG. 1.

FIGS. 3A and 3B show one preferred embodiment of outfeed portion 400 that includes multiple tunnels 410, which are arranged serially and disposed adjacent to, e.g., on, below and/or around, a linear rail system. Each tunnel 410 has disposed thereon, thereunder and/or therearound chiller plates, e.g., top chiller plates 414A resting on top of each tunnel 410 and bottom chiller plates 314B contacts a bottom portion of the outfeed sub-enclosure. These chiller plates are preferably made from an efficient thermal conductor and are, more preferably, made from aluminum. In this figure, pallets 412 rest on a heat sink 422 (e.g., preferably made from a good thermal conductor and more preferably made from copper) to further remove heat from pallet 412.

Like infeed portion 200, rollers are also present at outfeed portion 400 for taking up the substrate sheet. Furthermore, pressure pads may be used in conjunction with the rollers, present at infeed portion 200 and outfeed portion 400, for controlling the substrate roll out and take up. Further, when a speed matching system is employed at the infeed for matching forward pallet speed with the linear amount unrolled, a final section of the rail system at the outfeed is, preferably, speed controlled to control the tension of the overlying substrate sheet, i.e., ensure that the substrate sheet, extending out of the furnace and into outfeed portion 400, is at a requisite level of tension for proper retrieval of the graphene formed on the substrate sheet. Such speed control features in the present arrangements are desirable for achieving high yields and high throughput for graphene formation.

In certain preferred embodiments of the present arrangements, outfeed portion 400 includes an exhaust pump 420 for pulling scavenging gas that is present inside the outfeed tunnels 410. Although not shown to simplify illustration in FIG. 2, infeed portion 200 may include provisions similar to exhaust pump 420 to scavenge substrate gas.

The above-mentioned provisions provided at outfeed portion 400, for rapidly cooling and the subsequent heat and or gas removal from outfeed tunnels 410, provide for efficient and effective downstream removal of graphene from the substrate surface and therefore offer high throughput and high yield when deploying the present systems and methods for graphene formation.

According to FIG. 4A, a furnace 400, according to preferred embodiment of the present arrangements, spanning a lateral distance "L" is made by contiguously arranging multiple repeating furnace sub-structure units 302 of lateral distance "d," where n*d=L, and n is a whole number. In this configuration, an enclosure 512, disposed inside furnace 300, similarly extends a lateral distance "L" FIG. 4B shows in greater detail furnace sub-structure unit 302 as including heating coils 304, top main purge tube inlets 306A, bottom main purge tube inlets 306B, exterior lid 308, 310 interior lid, sub-enclosure 312, bottom component 314 and 316 thermocouples.

Multiple sub-enclosures 312 are contiguously arranged to form an enclosure 512 inside furnace 300 that extends the lateral distance "L." Depending on the type of processing implemented, different processing gases, e.g., substrate gas scavenging composition, annealing gas composition, producing composition or cooling air or gas, are provided inside one or more different sub-enclosures 312 to create a localized processing environment, e.g., scavenging environment, annealing environment, producing environment or cooling environment, inside the enclosure and the desired type of processing is carried out at a requisite temperature to form or produce graphene on the substrate surface. One or more heat sources, e.g., a plurality of heating coils, are arranged to span the lateral distance "L," and are disposed on top and/or bottom of enclosure 312 to heat certain portions or a particular portion thereof, preferably a middle portion of enclosure 512 or sub-enclosures 312 that are disposed in the middle portion of enclosure 512, to a requisite temperature for carrying out different types of processes therein.

In preferred embodiments of the present arrangements, infeed portion 200, furnace 300 and outfeed portion 400 that include appropriate ones of the above-mentioned localized environments inside them do so in the absence of any physical barriers between and within them. The present teachings consequently recognize that heat, air and/or gas, which may be crucial in creating a desired type of localized processing environment, may undesirably bleed into and interfere with another or an adjacent localized processing environment. As a result, in connection with structural features present in FIGS. 2, 3A, 3B, 4A and 4B and methods presented in FIGS. 12-19, for example, the present teachings describe the manner in which these structural features and carefully selected processing parameters, implemented in creating adjacently disposed localized processing environments inside continuous graphene formation systems 100 of FIG. 1, minimize the effects of any such bleeding or interference, if it was to occur. Thus, the present arrangements and methods represent a low capital cost design that offers significantly high throughput and high yields for graphene formation.

Figure 4B:
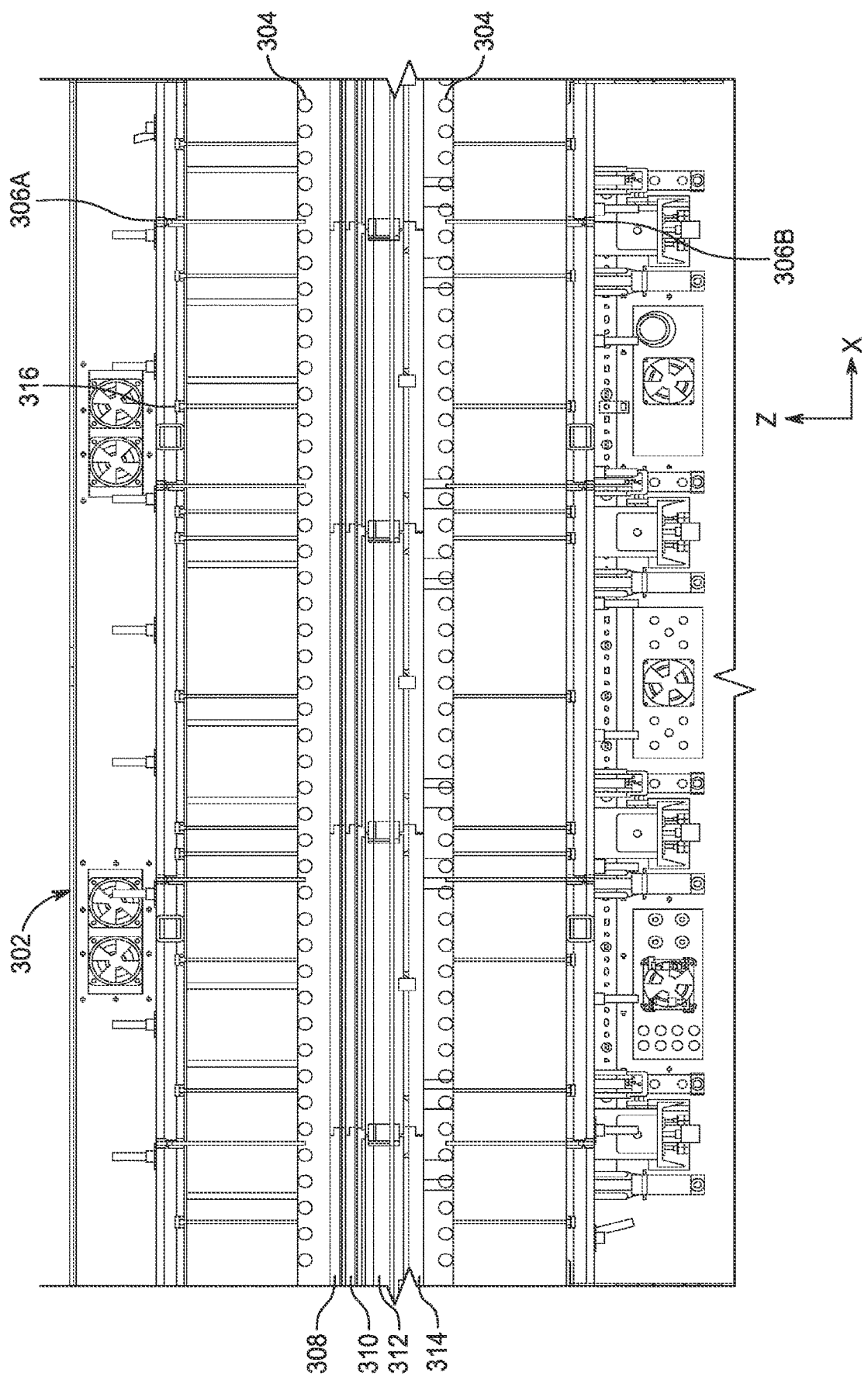
FIG. 4B shows a side-sectional view of a single furnace sub-structure of FIG. 4A.

FIG. 4B shows that each furnace sub-structure 302 includes one or more shields surrounding furnace 300. In the embodiment shown in FIG. 4B, a bottom component 314 is disposed below, i.e., in a negative Z-direction, relative to sub-enclosure 312. The bottom component 314 serves as base and is capable of supporting one or more lids thereon. By way of example, interior lid 310 is disposed on a first leg protruding, i.e., in a positive Z-direction, from bottom component 314 and exterior lid 308 is disposed on a second leg also protruding from bottom component 314. In this configuration, exterior lid 308 is disposed above, i.e., in the positive Z-direction from, interior lid 310. In this configuration, exterior lid 308 and interior lid 310 extend a lateral distance and a combination of bottom component 314 and exterior lid 308/interior lid 310 have defined therein two laterally extending (i.e., in the X-direction) gas purge paths, i.e., an exterior gas purge path defined from the assembly of bottom component 314 and exterior lid 308 and an interior gas purge path defined from the assembly of bottom component 314 and interior lid 310. Inside furnace 300, processing gases that escape from one or more sub-enclosures 312 and collect inside furnace 300 are purged using one or more such gas purge paths.

A purge gas stream made from an inert or reducing gas composition, introduced inside the interior gas purge path, purges processing gases or contaminants that may have escaped from and collected inside the cavity defined by the assembly of bottom component 314 and interior lid 310. This purging prevents the undesired processing gases or contaminants, generated during a particular type of processing, from flowing towards, being reintroduced at another location inside enclosure 512, and interfering with another type of processing being implemented at that location. As another preventive measure, the present arrangements allow for purging processing gases and contaminants escaping from the interior gas purge path into the exterior gas purge path. To achieve effective purging, an inert gas stream is introduced inside the exterior gas purge path created inside a cavity resulting from the assembly of bottom component 314 and exterior lid 308.

Furnace substructure unit 302 may further include top and bottom main purge tube inlets 306A and 306B to keep escaped processing gases and contaminants away from and not collecting around heat sources 304 and thermocouples 316. Thermocouples 316 are used for measuring the temperature proximate heat sources 304 to gain an understanding of the processing temperature values that might be present inside one or more sub-enclosures 312. Further, based on the measurements obtained from thermocouples 316, the present teachings may operate heat sources 304 to provide the desired temperature values inside one or more sub-enclosures 312. Collection of extraneous materials, such as processing gases and contaminants may not only interfere with these objectives but also, over a period of time, degrade heat sources 304 and thermocouples 316, further exacerbating these objectives.

In preferred embodiments, exterior lid 308, interior lid 310 and bottom component 314 of the present arrangements are made from efficient thermally stable materials, e.g., advanced ceramics. Further, these components may be commercially available from Blasch Precision Ceramics Inc. of Menands, N.Y.

Figure 5:
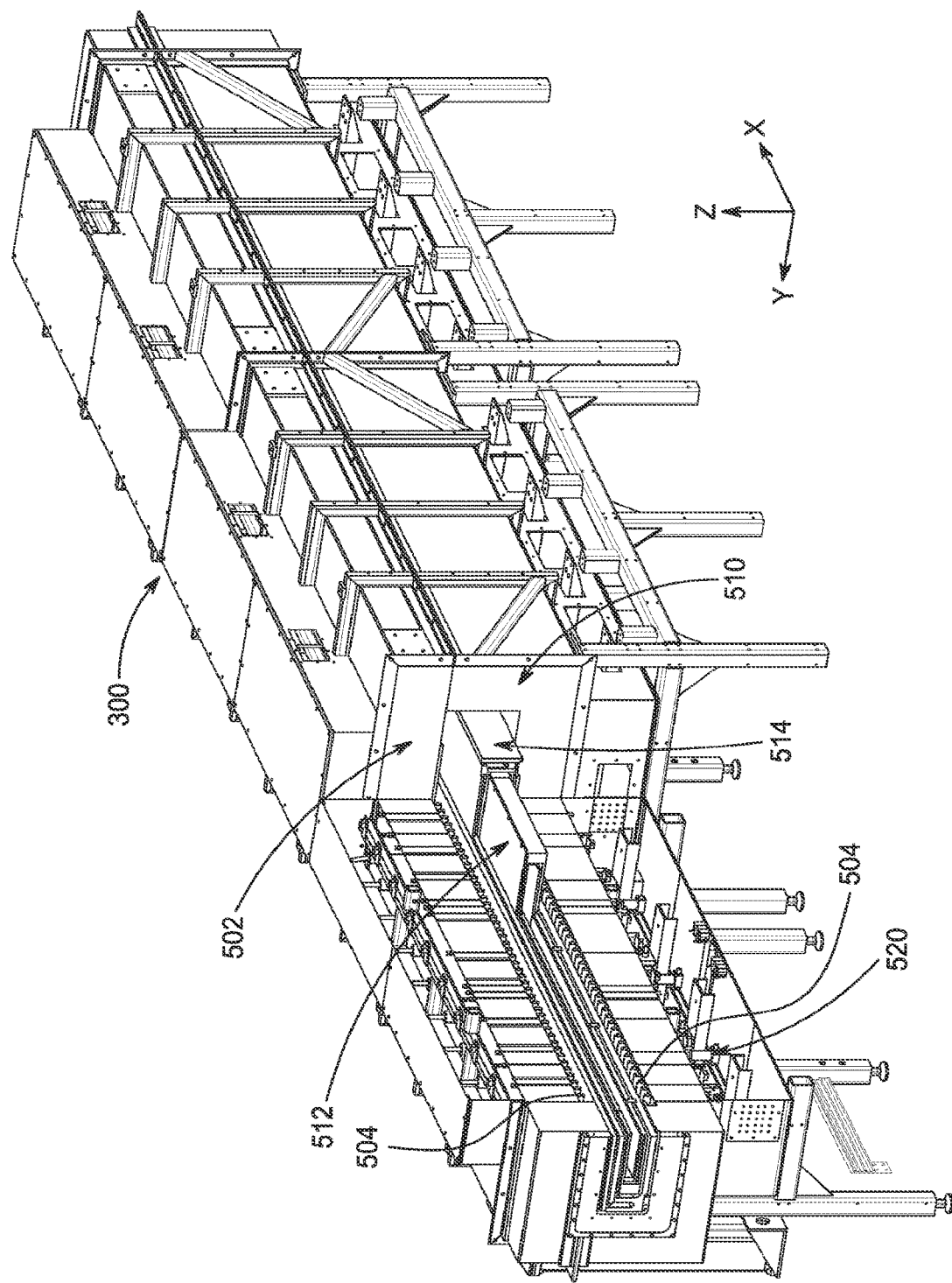
FIG. 5 shows a perspective, cutaway view of the furnace of FIG. 4A and an assembly of different components disposed therewithin.

FIG. 5 shows a cutaway view of furnace 300 of FIG. 4A exposing an assembly of different internal components including an upper insulation 502, heating coils 504, lower insulation 510, enclosure 512 (previously shown in FIG. 4A), bottom component's protruding exterior leg 514, gas injection nozzles 520. In this embodiment, heating coils 504 are serving as heat sources 304 of FIG. 4B. Exterior lid 308 is disposed above bottom component's protruding exterior leg 514 to form an exterior encasing of enclosure 512 and defines the exterior gas flow path described above for purging processing gases and contaminants. Insulation, e.g., upper insulation 502 and lower insulation 510, prevent undesired dissipation of heat generated from heating coils 504 to the environment and ensure that most, it not all, of this heat is used for processing inside enclosure 512.

FIG. 6A shows a side view of furnace 300', which is substantially similar to furnace 300 of FIGS. 1, 3 and 5, except furnace 300' of FIG. 6A is oriented to clearly show the arrangements involved in an enclosure and gas distribution subassembly 600, including an enclosure 612, which is substantially similar to enclosure 512 of FIGS. 4A and 5. FIG. 6B more clearly shows the details surrounding enclosure 612 of FIG. 6A. According to FIG. 6B, a bottom component 614 has two protruding legs, i.e., an exterior protruding leg (substantially similar to exterior protruding leg 514 of FIG. 5) and an interior protruding leg, an exterior lid 608 (which is substantially similar to exterior lid 308 of FIG. 4B) disposed on top of the exterior protruding leg and an interior lid 610 (which is substantially similar to interior lid 310 of FIG. 4B) disposed on top of the interior protruding leg.

FIG. 6B shows enclosure and gas distribution subassembly 600 also include certain provisions inside a single enclosure 612 for gas distribution, such as two or more gas injection nozzles, i.e., a first gas injection nozzle 620 and a second gas injection nozzle 620', and each of them including, at one end, two or more inlets, e.g., a first inlet 622 and a second inlet 624 for first gas injection nozzle 620 and, correspondingly, a first inlet 622' and a second inlet 624' for second gas injection nozzle 620'. Preferably, first inlets 622 and 622' are configured to provide one type of processing composition and second inlets 624 and 624' are configured to provide another type of processing composition. At another end, a tip of each of gas injection nozzles 620 and 620' is coupled to their respective nozzle-receiving inlets, e.g., a first nozzle-receiving inlet 626 and a second nozzle-receiving inlet 626', respectively. In the embodiment of FIG. 6B, single enclosure 612 has disposed thereon a gas injection plate (e.g., a gas injection plate 850 or 850' shown in FIGS. 8A and 8B, respectively) that has defined therein two or more nozzle-receiving inlets, e.g., nozzle-receiving inlets 626 and 626', communicatively coupled to two or more gas conduits, e.g., a first gas conduit 628 and a second gas conduit 628', respectively. Two or more gas conduit outlets, e.g., a first gas conduit outlet 630 and a second gas conduit outlet 630', are defined at or near the opposite end (i.e., opposite to the end that has defined therein nozzle-receiving inlet) of first gas conduit 628 and second gas conduit 628', respectively. The structure of gas injection plate 850 or 850' having defined therein multiple nozzle-receiving inlets disposed at one end of multiple gas conduits, which has disposed at the opposite end multiple gas conduit outlets, is described below in greater detail in the discussion of FIGS. 8A and 8B.

FIG. 7 shows additional components, which are part of the single gas distribution system, coupling to first inlets 622 and 622' and second inlets 624 and 624' and FIGS. 8A, 8B, 9, 10A and 10B show components relevant to defining multiple material flow paths from two or more gas conduit outlets, e.g., first gas conduit outlet 630 and second gas conduit outlet 630', to gas dispensing apertures defined on gas dispensing surface and deliver processing gases inside the enclosure (e.g., enclosure 612 of FIG. 6B).

FIG. 7 shows multiple single gas distribution systems, according to one embodiment of the present arrangements, for a single unit (e.g., unit 1 is hereinafter referred to as "U1"). In this arrangement, multiple mass flow controllers (hereinafter "MFC") set flow rates of component processing gases drawn from their respective gas reservoirs (e.g., $H_2$ reservoir, Ar reservoir and $CH_4$ reservoir) and/or reservoirs that do not contain gaseous hydrocarbon material to produce a producing composition, which is described below. Each MFC associated with U1 is identified by sequential numbering. i.e., U1MFC1, U1MFC2, U1MFC3 . . . U1MFC12. Two or more mass flow controllers 740 and 742, e.g., U1MFC1 and U1MFC2, are communicatively coupled to single control valve 744, which in turn mixes and balances the component processing gas flowrates, received from U1MFC1 and U1MFC2, to form a pure gas and/or mixtures of processing compositions, such as $ArH_2$ and $ArCH_4$. Alternately, two or more mass flow controllers 740 and 742, e.g., U1MFC1 and U1MFC2, are communicatively coupled to single control valve 744, which in turn mixes and balances a mixture of component processing gas and/or processing non-gaseous flowrates to form processing compositions, such as $ArCH_4$. Control valve 744 delivers substantially the same processing composition through at least two gas lines, e.g., a first gas line 722 and a second gas line 722', to at least two injection nozzles, e.g., first gas injection nozzle 620 and second gas injection nozzle 620' shown in FIG. 6B, respectively. These lines may not gas lines if non-gaseous processing compositions are used. As explained above with respect to FIG. 6B, the same processing composition received at gas injection nozzles 620 and 620' is conveyed to their respective nozzle-receiving inlets 626 and 626'.

FIG. 8A shows a cutaway view of a gas injection plate 850 disposed above sub-enclosure 812A (which is substantially similar to sub-enclosure 612 of FIG. 6B) and represents a portion of a processing gas or processing composition flow path from one or more gas reservoirs to an interior of the sub-enclosure.

FIG. 8B shows a gas injection plate 850', which is substantially similar to gas injection plate 850 except gas injection plate 850' of FIG. 8B is shown in a disassembled state, having the underlying sub-enclosure 812A removed therefrom. Gas injection plate 850' has defined therein multiple gas flow networks, e.g., a first gas flow network 854A, a second gas flow network 854B and a third gas flow network 854C.

Further, gas injection plate 850' includes certain structural features previously presented in connection with the description of FIG. 6B. Consistent with that description, gas injection plate 850' has defined therein a first gas flow path extending from nozzle-receiving inlet 826 (which is substantially similar to nozzle-receiving inlet 626 of FIG. 6B) through gas conduit 828 (which is substantially similar to nozzle-receiving inlet 628 of FIG. 6B) to gas conduit outlet 830 (which is substantially similar to gas conduit outlet 630 of FIG. 6B). Gas conduit outlet 830 also represents a network inlet because that is a point of entry for the processing composition to make its way to first gas flow network 854A. After traversing the various branches of first gas flow network 850A, the processing gas exits this network from multiple network outlet apertures 832. By way of example, a processing composition entering first gas flow network 854A at gas conduit outlet 830, travels through the network and exits from 32 network outlet apertures 832. Preferably, the exiting processing composition from each network outlet apertures 832 has substantially the same pressure.

Moreover, a second gas flow path, in gas injection plate 850', extends from nozzle-receiving inlet 826' through gas conduit 828' to gas conduit outlet 830'. After this stage, the processing composition continues to travel the second gas flow path as it enters second gas flow network 854B and exits from network outlet apertures 832'. Preferably, the exiting processing composition from each network outlet apertures 832' has substantially the same pressure. The same gas injection plate 850' has a third gas flow path defined by structural components including a third gas flow network 854C that are similar to those described in connection with the description of the first and the second material flow paths.

FIG. 9 shows two multiple sub-enclosures 812A and 812B arranged in series to define a portion of an enclosure. In this figure, first sub-enclosure 812A is shown in a disassembled state, without the underlying gas injection plate and second sub-enclosure 812B is shown (to simplify illustration) with a cutaway view of the gas injection plate (e.g., gas injection plate 850' of FIG. 8B) having defined therein first and second gas flow networks 854A, 854B and 854C. First sub-enclosure 812A is shown to have a gas dispensing surface 860 having defined thereon a first set of gas dispensing apertures 852, which align, in one-to-one corresponding fashion, with the network outlet apertures (e.g., network outlet apertures 832 of FIG. 8B) defined on the gas injection plate (e.g., gas injection plate 850' of FIG. 8B). As a result, each of the multiple material flow paths described on a single sub-enclosure 812A terminate at multiple associated sets of network outlet apertures 852.

To this end FIG. 10A shows, sub-enclosures 812A, 812B and 812C and similar others are continuously arranged to form the ultimately resulting enclosure 512 of FIG. 4A. Each of these sub-enclosures are fitted with multiple gas injection nozzles. By way of example, sub-enclosure 812A is fitted with gas injection nozzles 826 and 826'. As another example, each sub-enclosure 812B and 812C are fitted with multiple, e.g., three different gas injection nozzles. As explained below, this combination of multiple gas injection nozzles along with their associated ones of gas flow networks, e.g., gas flow networks 854A, 854B and 854C, form at least parts of multiple material flow paths in a single sub-enclosure.

FIG. 10B shows a portion of gas flow path created when a single gas injection nozzle 826 is coupled to sub-enclosure 812A. According to this figure, the processing composition travels from gas injection nozzle 826 to a gas conduit 828 and a gas conduit outlet 830. Gas conduit 828 and gas conduit outlet 830 are substantially similar to gas conduit 628 and gas conduit outlet 630 shown in FIG. 6B. Further, as explained in connection with the description of FIG. 8B, gas conduit 828 and gas conduit outlet 830 are features that are defined in sub-enclosure 812A (. As a result, FIG. 10B conveys that flow of processing composition flow from gas injection nozzle 826, which is coupled to sub-enclosure 812A, enters a gas injection plate 850' disposed above sub-enclosure 812A.

FIG. 10C shows another portion of a gas flow path created when gas injection nozzle 826 is coupled to sub-enclosure 812A and specifically flow of processing composition through gas injection plate 850' and then ultimately inside the underlying sub-enclosure 812A. According to this figure, inside the gas injection plate, the processing composition flows through first gas flow network 854A (also shown in FIG. 8B) and out of network outlet apertures (e.g., network outlet apertures 832 of FIG. 8B) associated with gas flow network 854A. These network outlet apertures align with a first set of gas dispensing apertures (e.g., gas dispensing apertures 852 of FIG. 9) such that the processing composition is dispensed through the first set of gas dispensing apertures inside sub-enclosure 812A. As a result, the processing composition delivered by each of the multiple gas injection nozzles coupled to a single sub-enclosure 812A, as shown in FIG. 10A, travels the gas flow path shown in FIGS. 10B and 10C and is delivered inside sub-enclosure 812A. When at least two gas injection nozzles receive a substantially same processing composition from a control valve (e.g., control valve 744) and are dispensed through two sets of gas dispensing apertures, which are a lateral separating distance apart from each other, inside sub-enclosure 812A to diffuse the processing composition at least the lateral separating distance inside sub-enclosure 812A. The present teachings recognize that, in this manner, by strategically providing the substantially same processing composition inside one or more sub-enclosures (e.g., sub-enclosure 812A and 812B of FIG. 9), and each sub-enclosure using two or more gas injection nozzles, creates a substantially uniform processing gas environment inside sub-enclosure 812A.

If the processing gas is any one of a substrate gas scavenging composition, an annealing gas composition or a producing composition, FIGS. 10A, 10B and 10C convey that a substantially uniform scavenging environment, annealing environment, or producing environment, respectively, is formed inside one or more sub-enclosure e.g., 812A, 812B and/or 812C.

FIG. 11 shows two sub-enclosures 812A and 812B assembled in series which are disposed inside a furnace sub-structure (e.g., furnace sub-structure 302 of FIG. 4B). At a location of assembly of two sub-enclosures 812A and 812B, an expansion gap 875 is defined therebetween to allow either or both of sub-enclosures 812A and 812B to expand into expansion gap 875. To allow for the assembly of sub-enclosures 812A and 812B, each of sub-enclosures 812A and 812B include, on one side, a slidable component 876, and have defined, on an opposite side, a cavity 878 that accepts the slidable component. To effect the assembly, slidable component 876 of sub-enclosures 812A slides into cavity 878 of 812B as shown in FIG. 11. The other sides of sub-enclosures 812A and 812B mate with complementary ends of other sub-enclosures to form at least a portion of enclosure (e.g., enclosure 512 of FIG. 4A). The present teachings therefore recognize that in this manner an entire enclosure is constructed and disposed inside furnace sub-structure (e.g., furnace sub-structure 302 of FIG. 4B).

The present teachings offer many methods for processing the substrate surface for graphene formation. In certain implementations of a graphene formation method, the substrate sheet undergoes electropolishing to clean the substrate sheet before subjecting the substrate sheet to a graphene growing process as described below. The different types of processing, according to preferred embodiments of the present teachings, may use: (1) one or more laterally arranged heat sources (e.g., multiple laterally arranged heating coils 504 inside furnace 300 that provide different amounts of heat at different ranges of lateral distances inside enclosure 512 as shown in FIGS. 4A and 5), except during scavenging, cooling and post-cooling processing; and (2) multiple gas distribution systems (e.g., one or more scavenging gas distribution systems that provide substrate gas scavenging composition inside a laterally extending infeed portion 200 of FIG. 2 and laterally extending one or more processing gas distribution systems and/or laterally delivering one or more processing gas distribution systems, such as components and features shown in FIGS. 6A, 6B, 7, 8A, 8B, 9, 10A, 10B and 10C that both laterally extend and provide different types of processing gases at different ranges of lateral distances inside enclosure 512 of FIGS. 4A and 5).

FIG. 12 shows a flowchart of a method for processing, according to one embodiment of the present teachings, a substrate for graphene formation 1200 (hereinafter "method 1200") that, preferably, begins with a step of disposing 1202. Step 1202 involves disposing a substrate sheet on a substrate holder (e.g., pallets 212 of FIG. 12). In disposing step 1202, the substrate sheet has located thereon a first surface for processing (e.g., a first surface area or region on the substrate that undergoes processing) and a second surface for processing (e.g., a second surface area or region on the substrate that undergoes processing) such that the first surface for processing is separated a lateral distance (e.g., a distance in the positive X-direction) apart from the second surface for processing. By way of example, the substrate sheet may be made from copper or nickel and may be disposed on a substrate roll (e.g., substrate roll 206 of FIG. 2). In one embodiment of the present teachings, step of disposing 1202 involves using a servo motor and an ultrasonic sensor detecting slack loop to dispose the substrate on the substrate holder. If graphite pallets are used, as a substrate holder, they may be about 600 mm long (e.g., in the X-direction), about 400 mm wide (e.g., in the Y-direction) and about 6 mm thick (e.g., in the Z-direction) for effectively facilitating conveyance of the substrate sheet through a graphene formation system of the present arrangements (e.g., continuous graphene formation system 100 of FIG. 1).

In one preferred embodiment, method 1200 of the present teachings include continuously advancing the substrate sheet in a lateral direction (i.e., in the X-direction) using a linear track that is advanced by a substrate holder advancing mechanism (e.g., continuous belt drive system 204 that drives pallets 212 in the lateral direction as shown in FIG. 2). As explained below, in preferred embodiments of the present teachings, the substrate sheet is continuously laterally advancing as its surface undergoes different types of processing, e.g., scavenging, annealing, producing and cooling, and different processing conditions (e.g., passivating after cooling), applied on the substrate, may vary as a function of the lateral distance (i.e., a distance value in the X-direction) inside the continuous graphene formation system (e.g., continuous graphene formation system 100 of FIG. 1).

Regardless of whether the step of advancing is carried out, after disposing step 1202, method 1200 proceeds to a scavenging step 1204. This step includes scavenging, at a scavenging temperature and using a substrate gas scavenging composition (e.g., an Ar and $H_2$ gas mixture), a substrate gas (e.g., including oxygen) present in and around the first surface for processing of the substrate sheet to produce a substrate-gas-depleted surface. Step 1204 may use an angularly flowing stream and/or a laterally flowing stream of a substrate gas scavenging composition. Preferably, disposed inside infeed portion (e.g., one or more of tunnels 210) are multiple scavenging gas outlets, at least some of which are angularly-oriented scavenging gas outlets and laterally-oriented scavenging gas outlets. The angularly-oriented scavenging gas outlets are oriented at an angle with respect to an axis that is perpendicular to the substrate holder. As a result, the angularly-oriented scavenging gas outlets, in an operational state during step 1204, provide an angular stream of a substrate gas scavenging composition incident upon the substrate sheet to effectively scavenge substrate gas in and around the substrate sheet.

Multiple laterally-oriented scavenging gas outlets are designed to generate multiple continuously flowing streams of substrate gas scavenging composition and, preferably, spanning across multiple scavenging sub-enclosures and flowing in an opposite direction to the direction of laterally advancing substrate sheet. In preferred embodiments of step 1204, the multiple continuously flowing streams of substrate gas scavenging composition flow over and in a direction opposite to the direction of laterally advancing substrate to evacuate undesired contents, such as heat and different type of contaminants, that may be present inside the tunnels. As a result, the present teachings recognize that multiple streams of such laterally flowing substrate gas scavenging composition may be more effective for contaminant removal. Although not necessary, step 1204 may be implemented using one or more scavenging gas stream generating subsystems, which include the above-mentioned angularly-oriented scavenging gas outlets and laterally-oriented scavenging gas outlets.

Step 1204 is, preferably, carried out in absence of an active heating source positioned adjacent to the first surface for processing. As explained below-, in this embodiment, some of the heat flowing towards the first surface for processing provides the requisite temperature treatment and may range from about 50° C. to about 100° C.

Method 1200 also includes an annealing step 1206 that involves annealing, using a flow rate of the substrate gas scavenging composition and/or an annealing gas composition and at an annealing temperature, the second surface for processing of the substrate sheet. Regardless of the gas composition, the processing gas(es) used during annealing may be delivered using a gas distribution system (e.g., components and features shown in FIGS. 6A, 6B, 7, 8A, 8B, 9, 10A, 10B and 10C) that are coupled to multiple processing sub-enclosures, e.g., multiples of sub-enclosure 302 of FIG. 4B, that may be thought of as annealing sub-enclosures.

Annealing step 1206 using multiple annealing sub-enclosures at the appropriate annealing temperature produces an annealed surface. Further, in step 1206, the annealing temperature is higher than the scavenging temperature and is produced using one or more heat sources (e.g., one or more laterally arranged heating coils 504 of FIG. 5) that are disposed adjacent to the second surface for processing.

Some of the heat, resulting from the annealing temperature and the annealing gas composition and/or the substrate gas scavenging composition in step 1206, flows towards the first surface for processing and facilitates formation of the substrate gas depleted surface. The annealing gas composition and/or the substrate gas scavenging composition resulting from step 1206, preferably, flows backwards (e.g., a negative distance along the X-axis) because the second surface for processing is located, in preferred embodiments of the present arrangement, a positive lateral distance (e.g., a positive distance along the X-axis) from the first surface for processing.

Further, step 1204 and a subsystem used for carrying out step 1204 (e.g., infeed portion 200 of FIG. 2) preferably does not include certain structural features shown in a subsystem used for carrying out step 1206 (e.g., furnace 300 of FIG. 4A). By way of example, step 1204 is carried out without using a gas injection plate (e.g., gas injection plate 850 of FIG. 8A and gas injection plate 850' of FIG. 8B) operating in conjunction with a gas dispensing surface (e.g., gas dispensing surface 860 having defined thereon a first set of gas dispensing apertures 852 shown in FIGS. 9 and 10B) of a sub-enclosure (e.g., 812A of FIG. 10B).

The annealing temperature is a temperature inside one or more annealing sub-enclosures and ranges from about 150° C. to about 1100° C. Further, in the absence of a physical barrier between two adjacently disposed scavenging sub-enclosure and annealing sub-enclosure, some of the residual heat (i.e., heat remaining after a significant amount of it is removed from chiller block 218 and chiller plate 214 to prevent melting of tunnels 210 and other components related to scavenging sub-enclosures in infeed portion 200 of FIG. 2), flows in a lateral direction (e.g., a distance in the negative X-direction) into scavenging sub-enclosures in infeed portion 200 of FIG. 2. This residual heat further facilitates scavenging of the substrate gases including removal of moisture trapped in the substrate.

Preferably, annealing step 1206 is carried out contemporaneously to scavenging step 1204, i.e., the second surface for processing is undergoing annealing at the same time the first surface for processing is undergoing scavenging. The present teachings, however, recognize that step 1206 may be carried out sequentially and after the conclusion of step 1204.

More preferably, annealing step 1206 of the present teachings is carried out when the second surface for processing of the substrate is present inside an annealing environment, e.g., annealing sub-enclosures inside furnace 300 of FIGS. 1 and 4A, and scavenging step 1204 is carried out when the first surface for processing is present inside a scavenging environment, e.g., scavenging sub-enclosures of infeed portion 200 shown in FIG. 2 or a location inside enclosure 512 of FIGS. 4A and 5. In even more preferred embodiments of the present teachings, the second surface for processing is subject to annealing step 1206 inside an annealing environment, e.g., enclosure 512 of FIGS. 4A and 5, at the same time as the first surface for processing is subject to scavenging step 1204 inside the scavenging environment, e.g., inside scavenging sub-enclosures of infeed portion 200 of FIG. 2 or inside enclosure 512 of FIGS. 4A and 5.

FIG. 15 shows a flowchart of a method for scavenging 1500, according to one embodiment of the present teachings and that may be implemented as step 1204 of FIG. 12. Method 1500 includes an advancing step 1502. This step involves advancing, inside a scavenging environment (e.g., infeed portion 200 of FIG. 2), a surface (e.g., first surface for processing mentioned in step 1202 of FIG. 12) a scavenging range of lateral distance. Step 1502 may be carried out by advancing the substrate sheet in a lateral direction (i.e., in the X-direction) using a linear track that is advanced by a substrate holder advancing mechanism (e.g., continuous belt drive system 204 that drives pallets 212 in the lateral direction as shown in FIG. 2).

The scavenging range of lateral distance of step 1502 includes an initial scavenging location or region and a subsequent scavenging lateral distance or region such that the subsequent scavenging location or region is a lateral distance away from the initial scavenging location or region. The subsequent scavenging location or region is proximate to an annealing environment, e.g., enclosure 512 of FIGS. 4B and 5, and the initial scavenging location or region is proximate to an exit opening defined at one end of the scavenging environment that is opposite to the other end (of the scavenging environment), which is proximate to the annealing environment.

Method 1500 also includes a step 1504, which involves subjecting, during step 1502, i.e., the advancing of the surface inside the scavenging environment, the surface to a flow rate profile of the substrate gas scavenging composition that increases from a relatively low flow rate value of the substrate gas scavenging composition at the initial scavenging location or region to a relatively high flow rate value of the substrate gas scavenging composition at the subsequent scavenging location or region. In other words, steps 1502 and 1504 are carried out contemporaneously. Further, step 1504 is, preferably, implemented using one or more scavenging gas distribution systems that deliver, using multiple scavenging gas outlets associated with gas curtains 216 shown in FIG. 2, the substrate gas scavenging composition inside one or more tunnels 210 of FIG. 2.

By way of example, one or more scavenging gas outlets associated with a gas curtain that is located proximate to the exit of the scavenging environment deliver the relative low flow rate value of said substrate gas scavenging composition at the initial scavenging location. As another example, one or more scavenging gas outlets associated with a gas curtain that is located proximate to the annealing environment, e.g., enclosure 512 of FIGS. 4B and 5, deliver the relative high flow rate value of said substrate gas scavenging composition at the subsequent scavenging location or region.

The relatively low flow rate value of the substrate gas scavenging composition, preferably, ranges from 1 about liters/minute to 4.5 about liters/minute, and the relatively high flow rate value of the substrate gas scavenging composition, ranges from about 0.5 liters/minute to about 100 liters/minute and in a more preferred embodiment from about 5 liters/minute to about 20 liters/minute.

The relatively high flow rate value of the substrate gas scavenging composition near the end of the scavenging environment (e.g., scavenging sub-enclosure of infeed portion 200 of FIG. 2) not only accomplishes aggressive scavenging of substrate gases before a next phase of processing commences, but also contributes to removing the heat escaping from the annealing environment (e.g., enclosure 512 of FIGS. 4A and 5).

Moreover, the relatively high flow rate value of the streams of substrate gas scavenging composition, applied inside the end of the scavenging environment proximate to the annealing environment and flowing outward, away from the annealing environment and towards an opening of the infeed portion, where relatively low flow rate value of the streams of substrate gas scavenging composition are applied, represent preferred embodiments of the present teachings. The flow rate differential creates a significant pressure drop near an entrance of the annealing environment. Further, this significant the pressure drop causes certain incident processing gases, e.g., substrate gas scavenging composition and annealing gas composition, to laterally flow from inside the annealing environment, (e.g., annealing sub-enclosures of enclosure 512 of FIGS. 4A and 5) in an outward direction (e.g., negative lateral direction), towards the exit opening of the scavenging environment that is disposed a negative lateral distance away from the annealing environment. Such outward flow of the incident processing gases does more than—to facilitate scavenging of the substrate gas present in and around the substrate in the scavenging environment. This outward flow of the incident processing gases, present inside an enclosure having disposed therein the annealing environment, prevents these processing gases to undesirably flow into and interfere with a downstream localized (graphene) producing environment inside the same enclosure.

FIG. 13 shows a flowchart of a method for annealing 1300, according to one embodiment of the present teachings and that may be implemented as step 1206 of FIG. 12. In this embodiment, method 1300 includes a step 1302 of pretreating a surface, at a pretreating temperature and using a pretreating incident flow rate of a substrate gas scavenging composition and/or an annealing gas composition, to produce a contaminant-depleted surface.

In step 1302, it is preferable to use a substrate gas scavenging composition, e.g., a gas mixture of Ar and $H_2$. While not wishing to be bound by theory, the presence of $H_2$, during pretreating, removes metals and carbon-based surface contaminants and thereby prevents undesirable melting of the (metallic, e.g., copper and/or nickel) substrate. Melting of the substrate, prior to undergoing high temperature annealing, degrades the substrate quality and as such, the substrate no longer lends itself for effective graphene formation thereon. As a result, pretreatment in step 1302 allows the present methods to realize high yields and high throughput for graphene formation.

Method 1300 also includes a step 1304, which includes treating the contaminant-depleted surface, at a treating temperature and using a treating incident flow rate of the annealing gas composition, to produce an annealed surface. In certain embodiments of the present teachings, step 1304 is carried out after the conclusion of step 1302. In alternate embodiments of the present teachings, steps 1302 and 1304 are carried out contemporaneously. Method 1300 may be implemented in a batchwise approach of forming graphene. Using a continuous approach (e.g., continuous graphene forming system 100 of FIG. 1) represents a preferred approach of the present teachings for realizing high yield and high throughput for graphene formation.

Regardless of the approach, treatment of the substrate surface in step 1304 is carried out using an annealing gas composition, preferably, in the absence of a substrate gas scavenging composition. Further, the annealing gas composition may be Ar gas that includes trace amounts of oxygen. While not wishing to be bound by theory, the presence oxygen in trace amounts serves an important function of reacting with removing certain types of surface contaminants that are not removed during pretreatment of the substrate surface using $H_2$ in step 1302. However, the present teachings recognize that residual amounts of oxygen, which may remain on the substrate surface are undesirable to form graphene used in certain applications. By way of example, to obtain graphene for use in those applications that require large crystalline structures, residual (trace) amounts of oxygen remaining on the substrate surface serve as a nucleation site to undesirably form graphene crystals of relatively small sizes. To this end, alternate methods of annealing described in connection with FIGS. 14 and 18 are presented below. Further, in this context, the present teachings recognize that if other applications of graphene desire small crystalline structures, then certain embodiments described in connection with FIGS. 12, 13, 15, 16, 17, 19 and 20 provide high yields and high throughput for graphene formation.

FIG. 14 shows another flowchart of another method for annealing 1400, according to alternate embodiments of the present teachings and that may be implemented as part of step 1206 of FIG. 12. Method for annealing 1400 includes a pretreating step 1402 and treating step 1404, both of which are substantially similar to pretreating step 1302 and treating step 1304 described in connection with the description of FIG. 13.

Method for annealing 1400, however, includes an additional step, a passivating step 1406 for passivating the annealed surface. Step 1406 including passivating an annealed surface (e.g., obtained from steps 1304 or 1404 of FIGS. 13 and 14, respectively), at a passivating temperature range and using the substrate gas scavenging composition to react with oxygen to produce a passivated surface. As explained above, the substrate gas scavenging composition, preferably, reacts with the residual (trace) amounts of oxygen remaining on the substrate surface after annealing has concluded. Method 1400 is susceptible to being implemented under either the batchwise approach or the continuous approach of graphene formation, but the continuous approach represents a preferred embodiment as it provides high yields and high throughputs for graphene formation.

The present teachings offer certain preferred embodiments for forming graphene, including annealing, that comprise: (1) displacing a surface, a pretreating range of lateral distance inside an enclosure; and (2) exposing, during the displacing of the surface inside the enclosure, to the surface a temperature profile that varies as a function of a lateral distance displaced within the pretreating range of lateral distance inside the enclosure; and (3) subjecting, during the displacing of the surface inside the enclosure, the surface to a pretreating incident flow rate profile of a substrate gas scavenging composition that varies as a function of a lateral distance displaced within the pretreating range of lateral distance inside the enclosure. These steps (1), (2) and (3), connected to pretreating of the substrate surface, are carried out contemporaneously.

FIG. 16 shows a flowchart of a method for pretreating 1600, according to certain preferred embodiment of the present teachings and that may be implemented as step 1302 or step 1402 of FIGS. 13 and 14, respectively. Method 1600 includes a displacing step 1602 for displacing a surface (e.g., second surface for processing of step 1206 of FIG. 12, or the surface of steps 1302 or 1402 of FIGS. 13 and 14, respectively) a pretreating range of lateral distance inside an enclosure (e.g., enclosure 512 of FIGS. 4B and 5). A substrate surface undergoes annealing inside an annealing environment, which may extend an annealing range of lateral distance that subsumes the pretreating range of lateral distance. In certain embodiments, the pretreating range of lateral distance of the present teachings is a distance value that ranges from about 700 mm from an end of a scavenging environment (e.g., infeed portion 200 of FIG. 2) or beginning of an annealing environment (e.g., enclosure 512 of FIGS. 4A and 5) to about 1200 mm from the end of the scavenging environment or beginning of the annealing environment.

A relatively large pretreating range of lateral distance of about 400 mm or larger, from a location at or near the beginning of an annealing environment, represents a preferred embodiment of the present arrangement because by holding the adjacently disposed (to the substrate surface) one or more heat sources (e.g., laterally arranged heating coils 504 of FIG. 5 that provide heat inside, but are located outside of, enclosure 512 of FIG. 5) at low temperature conditions or in a deactivated (i.e., turned off) state, avoids forming high heat conditions that flow back into the scavenging environment (e.g., one or more sub-enclosures of infeed portion 200 of FIG. 2) and cause damage to the substrate surface and/or the structure responsible for creating the scavenging environment.

The pretreating range of lateral distance includes an initial pretreating location or region and, disposed a lateral distance away therefrom, a subsequent pretreating location or region. In this context, method 1600 further includes a step of exposing 1604, during displacing step 1602 inside the enclosure, to heat generated from one or more pretreating heat sources, e.g., heating coils 504 disposed outside enclosure 512 of FIG. 5, but that provide heat inside the pretreating range of lateral distance inside the enclosure. In this configuration and in exposing step 1604, one or more pretreating heat sources are disposed adjacent to the surface undergoing pretreatment.

Further, one or more pretreating heat sources present at the initial pretreatment location or region, provide a minimum value of the annealing temperature at a corresponding location inside the enclosure. Further still, one or more pretreating heat sources present at the at the subsequent pretreatment location or region, provide a maximum value of the annealing temperature at a corresponding location inside the enclosure. In certain implementations of the present teachings, the minimum temperature value ranges from about 100° C. to about 200° C. and the maximum value of the annealing temperature is a value that ranges from about 1000° C. to about 1100° C.

Method 1600 further still includes a step 1606 that involves, during the displacing (of step 1602) of the surface and inside the enclosure, subjecting the surface to an incident flow rate profile of the substrate gas scavenging composition that increases as a function of lateral distance displaced within the pretreating range of lateral distance. Under one approach, incident flow rate value of the substrate gas scavenging composition linearly increases as the gas delivery location that, the surface is subjected to, laterally advances from one delivery location to another along the pretreating range of lateral distance. The present teachings recognize, however, that under an alternate approach, these incident flow rates increase non-linearly as the surface laterally advances along the pretreating range of lateral distance.

Regardless of the approach, portions of the processing gas distribution systems, which may laterally extend the pretreating range of lateral distance, deliver at the initial pretreating location or region a relatively low flow rate value of the substrate gas scavenging composition, and deliver at the subsequent pretreating location or region a relatively high flow rate value of the substrate gas scavenging composition. The relatively low flow rate value of the substrate gas scavenging composition, preferably, ranges from about 0.5 liters/minute to 20 liters/minute and more preferably range from about 0.5 liters/minute to 4.5 liters/minute, and the relative high incident flow rate value of the substrate gas scavenging composition ranges from about 5 liters/minute to 100 liters/minute and more preferably ranges from about 5 liters/minute to 20 liters/minute. The present teachings recognize that steps 1602, 1604 and 1606 are carried out contemporaneously.

After the conclusion of pretreatment, annealing of a substrate surface may advance to treating of the substrate surface as explained below. The present teachings offer methods of forming graphene, including treating, that comprise: (1) displacing a surface, a treating range of lateral distance inside an enclosure; and (2) exposing, during the displacing of the surface inside the enclosure, to the surface a temperature profile that remains substantially constant within the treating range of lateral distance inside the enclosure; and (3) subjecting, during the displacing of the surface inside the enclosure, the surface to a treating incident flow rate profile of a substrate gas scavenging composition that varies as a function of a lateral distance displaced within the pretreating range of lateral distance inside the enclosure. These steps (1), (2) and (3), connected to treating of the substrate surface, are carried out contemporaneously.

FIG. 17 shows a flowchart of a method for treating 1700, according to preferred embodiments of the present teachings, and that may be implemented as step 1304 or step 1404 of FIGS. 13 and 14, respectively. Method 1700 includes a step 1702 that involves displacing a surface a treating range of lateral distance (e.g., treating range of lateral distance of steps 1304 or 1404 of FIGS. 13 and 14, respectively) inside the enclosure (e.g., enclosure 512 of FIG. 3). A substrate surface undergoes annealing inside an annealing environment, which may extend an annealing range of lateral distance that subsumes the pretreating range of lateral distance and the treating range of lateral distance. The treating range of lateral distance beings after an end of the pretreating range of lateral distance. The treating range of lateral distance is, preferably, a distance value that ranges about 100 mm after an end of the pretreating range of lateral distance to about 3000 mm after the end of the pretreating range of lateral distance.

A starting location of the treating range of lateral distance ranges from about 300 mm from a location at or near beginning of the annealing environment to about 5000 mm from the location at or near beginning of the annealing environment and spans a distance that ranges from about 300 mm to about 3000 mm. By way of example, a location at the beginning of the annealing environment is at 0 mm of enclosure 512 of FIG. 5 and the term "near beginning of the annealing environment" refers to a distance ranging from 0.01 mm from the beginning of the enclosure to 5 mm from the beginning of the enclosure.

Method 1700 further includes an exposing step 1704 of exposing, during step 1702, the surface to heat generated from one or more laterally extending treating heat sources disposed (e.g., heating coils 504 of FIG. 5 that extend a treating range of lateral distance) adjacent to the surface. As shown in FIG. 5, heating coils 504 are adjacent to the surface as they provide heat inside, but are located outside of, enclosure 512. In this configuration and in exposing step 1704, one or more of the "treating" heat sources are maintained at a treating temperature to generate a substantially constant annealing temperature (e.g., allowing a fluctuation of up to about ±5% of the annealing temperature) along the treating range of lateral distance inside the enclosure. The treating temperature may be a temperature value that ranges from about 500° C. to about 1100° C.

Further, method 1700 further still includes a step 1706 that involves maintaining, during displacing step 1702 of the surface and inside the enclosure, a substantially uniform incident flow rate of the annealing gas composition along the treating range of lateral distance. Although not necessary, processing gas distribution systems, which laterally extend the treating range of lateral distance, preferably deliver the annealing gas composition along that range of lateral distance. In preferred embodiments, these gas distribution systems of the present arrangements, which extend the treating range of lateral distance or deliver annealing gas compositions to the treating range of lateral distance, do not provide substrate gas scavenging compositions inside the annealing sub-enclosures. Exemplar values of the substantially uniform incident flow rate of the annealing gas composition ranges from about 3 liters/minute to about 5 liters/minute. The present teachings allow a fluctuation of up to about ±5% in the flow rates of the annealing gas composition from one lateral location to another. The present teachings recognize that steps 1702, 1704 and 1706 are carried out contemporaneously.

The present teachings offer further still other methods of forming graphene, including passivating, that comprise: (1) displacing a surface, a passivating range of lateral distance inside an enclosure; (2) exposing, during the displacing of the surface inside the enclosure, to the surface a temperature profile that remains substantially constant within the passivating range of lateral distance inside the enclosure; and (3) subjecting, during the displacing of the surface inside the enclosure, the surface to a passivating incident flow rate profile of a substrate gas scavenging composition that varies as a function of a lateral distance displaced within the passivating range of lateral distance inside the enclosure. These steps (1), (2) and (3), connected to passivating of the substrate surface, are carried out contemporaneously.

FIG. 18 shows a flowchart of a method for forming graphene 1800, according to preferred embodiments of the present teachings, including passivating and that may be implemented as step 1406 of FIG. 14. Method for annealing including passivating 1800 includes a step 1802 of displacing, inside an enclosure, a surface along a passivating range of lateral distance that includes an initial passivating lateral distance or region and, disposed a lateral distance away therefrom, a subsequent passivating lateral distance or region. A starting location of the passivating range of lateral distance ranges from about 1700 mm from at or near the beginning of the annealing environment to about 7000 mm from at or near the beginning of the annealing environment and spans a distance that ranges from about 500 mm to about 2000 mm. A substrate surface undergoes annealing inside an annealing environment, which may extend an annealing range of lateral distance that subsumes the pretreating range of lateral distance, the treating range of lateral distance and the passivating range of lateral distance. The passivating range of lateral distance starts after the end of the treating range of lateral distance.

Method 1800 further includes a step 1804 of exposing, during step 1802, the surface to heat generated from one or more heat sources. By way of example, one or more heating coils 304 of FIG. 4B that extend a passivating range of lateral distance provide heat inside, but are located outside, of enclosure 512 of FIGS. 4B and 5 are adjacent to the surface undergoing passivation. In this configuration and in exposing step 1804, one or more passivating heat sources generate a substantially constant annealing temperature inside the enclosure, e.g., annealing sub-enclosures that span the passivating range of lateral distance and implement step 1804.

Further, method 1800 further still includes a step 1806 of subjecting, during step 1802, the surface inside the enclosure to a decreasing incident flow rate profile of the passivating gas composition, e.g., substrate gas scavenging composition, that varies as function of the lateral distance within the passivating range of lateral distance. In certain embodiments, step 1806 is carried out using multiple gas distribution systems that extend a passivating range of lateral distance or deliver the substrate gas scavenging composition to the passivating range of lateral distance. One or more of the gas distribution systems, which may be disposed at or deliver to the initial passivating lateral distance or region inside furnace 300 of FIG. 5, apply a relatively high flow rate of the substrate gas scavenging composition to the surface, when it is positioned at, the initial passivating lateral distance or region inside the enclosure. Further, one or more of the gas distribution systems, which may be disposed at or deliver to the subsequent passivating lateral distance or region inside furnace 300 of FIG. 5, apply a relatively low flow rate of the passivating gas composition, e.g., substrate gas scavenging composition, to the surface, when it is positioned, at the subsequent passivating lateral distance or region inside the enclosure. The relatively high flow rate of the passivating gas composition ranges from 5 liters/minute to about 100 liters/minute and in a more preferred embodiment ranges from about 5 liters per minute to about 20 liters per minute. The relatively low flow rate of the passivating gas composition ranges from about 0.5 liters/minute to about 20 liters/minute and in a more preferred embodiment ranges from about 0.5 liters/minute to about 4.5 liters/minute. The present teachings recognize that steps 1802, 1804 and 1806 are carried out contemporaneously.

In one preferred embodiment of the present teachings for formation of graphene on the substrate surface, the process begins by displacing disposing, on a substrate holder, a substrate sheet having located thereon a first surface for processing and a second surface for processing. The first surface for processing is separated by a positive lateral distance apart from said second surface for processing.

This embodiment of the method of producing graphene further includes annealing, in the presence of an annealing gas composition and at an annealing temperature, the first surface for processing of the substrate sheet to produce an annealed surface. In one implementation of this step, the annealing temperature is produced using one or more laterally extending heat sources disposed adjacent to the first surface for processing.

Further still, this method of forming graphene includes producing, in presence of a producing composition, graphene on the second surface to produce a graphene deposited surface. In more preferred embodiments, the incident flow rates of producing composition inside the producing sub-enclosures, i.e., sub-enclosures dedicated to carrying out graphene formation, that are in proximate distance to the annealing sub-enclosures, are relatively low and the incident flow rates of annealing gas composition inside the annealing sub-enclosures, which are in proximate distance to the producing sub-enclosures, are also similarly relatively low.

More preferred embodiments of the present methods do not, therefore, allow an appreciable amount of the annealing gas composition from the annealing step or location to flow a positive lateral distance towards the location of producing on the second surface for processing and, therefore, does not interfere with the formation of graphene. More preferred embodiments of this method also do not allow the producing composition to flow a negative lateral distance toward the annealing location of the first surface for processing and, therefore, does not interfere with the annealing of the first surface for processing. The present teachings recognize that the above-mentioned steps of annealing and producing graphene are carried out contemporaneously.

In alternate embodiments that implement passivating of the annealed surface, prior to graphene formation, the present teachings recognize that relatively high incident flow rates of substrate gas scavenging composition and/or annealing gas composition are delivered inside the annealing sub-enclosures that are positioned relatively further away from the producing sub-enclosures and, similarly, relatively high flow rates of producing composition are delivered inside the producing sub-enclosures that are positioned relatively further away from the annealing sub-enclosure and/or cooling sub-enclosures. Such processing conditions of the present teachings prevents or minimizes cross-contamination between two different types of processing, adjacently implemented, inside the same enclosure.

The present teachings offer preferred embodiments for producing graphene on a substrate surface. An exemplar of these embodiments comprises: (1) displacing a surface, a producing range of lateral distance inside an enclosure; (2) exposing, during the displacing of the surface inside the enclosure, a temperature profile that varies as a function of a lateral distance displaced within the producing range of lateral distance inside the enclosure; and (3) subjecting, during the displacing of the surface inside the enclosure, the surface to a producing incident flow rate profile of a substrate gas scavenging composition that varies as a function of a lateral distance displaced within the producing range of lateral distance inside the enclosure. These steps (1), (2) and (3), connected to producing of graphene on the substrate surface, are carried out contemporaneously.

FIG. 19 shows a flowchart of a preferred method for producing 1900, according to one embodiment of the present teachings, graphene on a substrate surface. Method for producing 1900 may begin with a displacing step 1902 and that includes displacing a surface (e.g., a first or a second surface for processing) a producing range of lateral distance inside the enclosure. By way of example, a starting location of the producing range of lateral distance inside the enclosure ranges from about 250 mm from the beginning of the enclosure to about 9000 mm from the beginning of the enclosure and spans a distance that ranges from about 500 mm to about 10000 mm inside the enclosure.

The producing range of lateral distance includes an initial producing location or region, an intermediate producing lateral distance or region and a subsequent producing location or region. The subsequent producing location or region is disposed a lateral distance apart from the intermediate producing lateral distance or region, which, in turn, is disposed a lateral distance apart from the initial producing location or region. In other words, the intermediate producing lateral distance or region is disposed between the initial producing location or region and the subsequent producing location or region.

Method for producing 1900 further includes an exposing step 1904, which involves exposing the surface to heat generated from one or more heat sources (e.g., laterally arranged heating coils 304 or 504 of FIGS. 3 and 5, respectively) that extends the producing range of lateral distance and are disposed adjacent to the surface. Step 1904 may be carried out as the surface travels a portion, e.g., at least half, of the producing range of lateral distance inside the enclosure. The temperature of one or more of these heat sources, extending at least a portion of the producing range of lateral distance, generate a requisite amount of heat in corresponding locations inside the enclosure to have a relatively constant temperature that ranges from about 500° C. to about 1100° C. and in a more preferred embodiment ranges from about 900° C. to about 1100° C.

Method for producing 1900 may further still include a step 1906 of subjecting, during step 1902, the surface to an incident flow rate profile of a producing composition. In this step, a constant relatively low flow rate of the producing composition is applied to the surface at the initial producing location or region. Further, a first maximum flow rate of the producing composition is applied to the surface at the intermediate producing lateral distance or region. Further still, a second maximum flow rate of the producing composition is applied to the surface at the subsequent producing location or region. The second maximum flow rate is, preferably, higher than the first maximum flow rate to realize high yield and high throughput for graphene formation.

In a preferred implementation of this incident flow rate profile of the producing gas, the second maximum flow rate is almost twice as higher than the first maximum flow rate. The second maximum value of the flow rate of the producing gas is a flow rate value that ranges from about 5 liters/minute to about 100 liters/minute and in a more preferred embodiment ranges from about 5 liters/minute to about 20 liters/minute and the first maximum value of the flow rate of the producing gas is a flow rate value that ranges from about 0.5 liters/minute to about 20 liters/minute and in a more preferred embodiment ranges from about 0.5 liters liters/minute to about 4.5 liters/minute. The present teachings recognize that steps 1902, 1904 and 1906 are carried out contemporaneously.

After formation of graphene as described in connection with FIG. 19, the substrate surface with graphene begins cooling, preferably, inside the same enclosure used for graphene formation. In more preferred embodiments, outside the enclosure and in a cooling environment, e.g., outfeed portion 400 shown in 3A and 3B, the substrate surface with graphene undergoes further cooling to a greater extent than the enclosure. In this embodiment of the present teachings, laterally-oriented outfeed gas outlets generate laterally flowing substrate gas scavenging streams towards an exit end of the outfeed tunnels for removing contents, e.g., heat, producing composition and substrate gas scavenging composition, present inside one or more of the outfeed tunnels to form a protective layer above the substrate surface undergoing cooling.

Moreover, these outfeed gas outlets provide, preferably, a relatively high flow rate of the substrate gas scavenging composition inside outfeed tunnels 410 near an interface between the enclosure and outfeed portion 400 of FIGS. 3A and 3B. The outfeed gas outlets also, preferably, provide a relatively low flow rate value of substrate gas scavenging composition at or near an exit end of outfeed tunnels 410 or outfeed portion 400 of FIGS. 3A and 3B. As a result, contents inside outfeed tunnels proximate to the producing/cooling environment inside the enclosure are flowing outward, away from the producing/cooling environment and towards an opening of the outfeed portion for evacuation. This creates flow rate differential creates a significant pressure drop near an exit of the producing/cooling environment, e.g., enclosure 512 of FIGS. 4A and 5. Further, this significant the pressure drop causes certain incident processing gases, e.g., substrate gas scavenging composition and producing composition, to laterally flow from inside the producing/cooling environment, (e.g., producing/cooling sub-enclosures of enclosure 512 of FIGS. 4A and 5) in an outward direction, towards the exit opening of the cooling environment that is disposed a positive lateral distance away from the producing/cooling environment. Such outward flow of the incident processing gases, e.g., producing gas and substrate gas scavenging composition, prevents these processing gases to undesirably flow into and interfere with the upstream localized (graphene) annealing environment inside the same enclosure or further upstream scavenging environment inside the infeed portion 200 shown in FIG. 2.

FIG. 20 shows a flowchart of a method for processing 2000, according to one embodiment of the present teachings, a substrate surface for effectively forming graphene thereon. In one embodiment, method for processing 2000 of the present teachings begins with a displacing step 2002, which includes displacing a surface of a substrate sheet a scavenging range of lateral distance inside a scavenging sub-enclosure (e.g., a lateral distance spanning the infeed portion 200 of FIG. 2). By way of example, a continuous belt drive system 204 pushes pallets 212 disposed on a linear track of infeed portion 200, as shown in FIG. 2. Further in this example, the substrate sheet is rolled out from substrate roll 206 and disposed upon pallets 212 as shown in FIG. 2 prior to the pallets 212 advancing in a positive lateral direction.

Method 2000 also includes a step of scavenging 2004 that is carried out during step of displacing step 2002 and inside the scavenging sub-enclosure (e.g., sub-enclosures that make up infeed portion 200 of FIG. 2). According to step 2004, the surface undergoes scavenging (e.g., scavenging step 1204 of FIG. 12 and method for scavenging 1500 of FIG. 15) to remove substrate gas (e.g., oxygen) from the surface, as the surface travels the scavenging range of lateral distance inside a sub-scavenging enclosure to produce a contaminant-depleted surface.

In preferred embodiments, method for processing 2000 of the present teachings includes a step 2006, which involves moving the contaminant-depleted surface an annealing range of lateral distance inside an enclosure (e.g., furnace 200 of FIG. 2) that is located downstream from the scavenging sub-enclosure (e.g., sub-enclosures that make up infeed portion 200 of FIG. 2). Moving step 2006 moves the contaminant-depleted surface, preferably, from a location at or near an end of the scavenging range of lateral distance (e.g., where the infeed portion 200 ends or near an ending location of the lateral distance spanning the infeed portion 200 of FIG. 2). At this stage, preferably the contaminant-depleted surface is a certain distance inside the enclosure (e.g., a certain distance inside furnace 200 of FIG. 2). In other words, the annealing range of lateral distance is a lateral distance that begins from a location at or near the end of the scavenging range of lateral distance.

Method for processing 2000 includes a step of annealing 2008 to produce an annealed surface. In this step, during step 2006 and inside the enclosure, the contaminant-depleted surface undergoes annealing (e.g., annealing step 1206 of FIG. 12, method for annealing 1300 of FIG. 13 and steps related to annealing described in methods 1400, 1600, 1700 and 1800 of FIGS. 14, 16, 17 and 18).

Method for processing 2000 may also carry out an advancing step 2010. This step includes advancing, within the enclosure, the annealed surface a producing range of lateral distance. The annealed surface travels the annealed range of lateral distance from a location at or near the end of the annealing range of lateral distance.

Preferably, after the conclusion of annealing step 2008 to produce the annealed surface, method for processing 2000 includes a step of producing 2012. According to this step, during advancing step 2010 and inside the enclosure, graphene is produced on the annealed surface to produce a (graphene) produced surface. In other words, in producing step 2012, graphene is produced on the substrate surface inside the same enclosure where annealing step 2008 is carried out. By way of example, method for processing 1900 of FIG. 19 describes various steps for implementing producing step 2012.

The present teachings, however, recognize that high throughput and high yield graphene systems and methods preferably implement further processing that facilitates downstream efficient recovery of graphene from the substrate sheet, without destroying the yielded graphene structure and the substrate sheet.

To this end, method 2000 contemplates carrying out a conveying step 2014. In this step, within and at a location outside the enclosure, the (graphene) produced surface is conveyed a cooling range of lateral distance. The producing surface travels the cooling range of lateral distance from a location at or near the end of the producing range of lateral distance. By way of example, the cooling range of lateral distance begins at a location near the end of furnace 200 and extends to a location at or near an end of outfeed portion 400 of FIG. 4A.

Method 2000 also includes a cooling step 2016 for cooling, during conveying step 2014 and inside and outside the enclosure, the (graphene) produced surface to form a cooled surface. Although a substantially significant amount of cooling of the (graphene) produced surface takes place in outfeed portion 300 shown in FIGS. 3A and 3B, cooling, preferably, begins inside cooling sub-enclosures, i.e., sub-enclosures 302 of FIG. 4A dedicated to cooling the substrate surface, that are positioned after producing sub-enclosures. The outfeed sub-enclosures which are contiguously arranged to form outfeed portion 300 are separated by gas curtains 216, which have strategically placed outfeed gas outlets to apply an inert gas stream on the (graphene) produced surface. Other provisions for effective cooling of the substrate surface include heat sink 322 and top and bottom chiller plates 314A and 314B shown in FIGS. 3A and 3B, respectively.

In more preferred embodiments, method 2000 includes a passivating step, which involves passivating the cooled surface using an inert or reducing gas to produce a cooled, passivated surface that is ready for recovery of graphene from the substrate sheet it was produced on.

Method 2000 is described in terms of a single region on a surface of the substrate sheet undergoing processing, e.g., scavenging of the substrate gas, annealing, producing of graphene, and cooling off the graphene produced on a region of the substrate surface. The present teachings, however, recognize that the advantages of the present systems and method for producing graphene are not so limited. By way of example, at the same time when a first region of the substrate surface (a "first surface for processing") is subject to scavenging step 2004, a second region of the substrate surface (a "second surface for processing") is subject to annealing step 2008, a third region of the substrate surface (a "third surface for processing") is subject to producing step 2012 and a fourth region of the substrate surface (a "fourth surface for processing") is subject to cooling step 2016. As another example, at the same time when a surface area or region is subject to annealing step 2008, another surface area or region is subject to producing step 2012. In certain implementations of this example, yet another surface area or region is subject to cooling step 2016 at the same time the other surface areas or regions are undergoing different types of processing. The present teachings recognize that different type of processing on different surface areas or regions of the same substrate surface are carried out at the same time to realize a high throughput for the graphene producing systems and methods.

The present teachings also recognize that it is not necessary to carry out displacing step 2002, moving step 2006, advancing step 2010, and conveying step 2014 to realize the benefits of the present teachings. Further, the advantages of the present teachings are also realized when the substrate sheet is processed for graphene formation using a batchwise process, and not a continuous process, implemented in one or more discrete processing chambers, each dedicated to carrying out one or more different types of processes. Further still, in certain embodiments of the present teachings, annealing (e.g., pretreating, treating and passivating) are not required for producing graphene. In these embodiments, after scavenging, the structural provisions of the present arrangements and processing conditions of the present teachings provide for producing graphene on the substrate and then cooling the substrate with graphene formed thereon.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. By way of example, there is no reason why the advantages and implementations of the present teachings are not realized in batchwise graphene deposition systems and methods. Accordingly, it is appropriate that the appended claims be construed broadly, and in a manner consistent with the scope of the invention, as set forth in the following claims.

What is claimed is:

1. A system for forming graphene, said system comprising:
    a substrate holder designed to hold a substrate sheet;
    one or more tunnels disposed adjacent to said substrate holder;
    multiple processing sub-enclosures disposed laterally adjacent to one or more said tunnels such that said substrate holder continuously laterally extends from inside one or more said tunnels into said multiple processing sub-enclosures;
    multiple scavenging gas outlets disposed inside one or more said tunnels, wherein at least some of said scavenging gas outlets are oriented at an angle with respect to an axis that is perpendicular to said substrate holder and designed to provide an angular stream of a substrate gas scavenging composition to contact and scavenge substrate gas in and around said substrate sheet;
    multiple gas distribution subsystems communicatively coupled, at one end, to one or more reservoirs having stored therein same type of component gases that form an annealing gas composition and communicatively coupled, at another end, to at least one said processing sub-enclosure and designed to dispense therein said annealing gas composition, and wherein multiple said gas distribution subsystems designed to dispense said annealing gas composition inside at least one said processing sub-enclosure;
    one or more heat sources disposed laterally adjacent to at least one said processing sub-enclosure and designed to provide heat therein; and
    wherein, in absence of an effective gas or a mechanical barrier within and between one or more said tunnels and at least one said processing sub-enclosure, said system for forming graphene is designed to allow heat and said annealing gas composition present inside at least one said processing sub-enclosure to flow into and facilitate scavenging inside one or more said tunnels.

2. The system for forming graphene of claim 1, further comprising one or more scavenging gas stream generating subsystems, each of which includes multiple said scavenging gas outlets and some of said gas scavenging outlets are oriented in a direction that is parallel to said substrate holder and designed to generate a laterally flowing substrate gas scavenging composition, and
    wherein a collection of some of said multiple scavenging gas outlets are arranged at corresponding locations inside one or more said tunnels to form multiple sets of correspondingly located said scavenging gas outlets having an orientation designed to generate multiple continuously longitudinally flowing substrate gas scavenging compositions in said direction that is parallel to said substrate holder and are designed to span across and evacuate contents inside multiple said tunnels and for effectively serving as a protective barrier preventing contaminants present inside multiple said tunnels from contacting said substrate sheet.

3. The system for forming graphene of claim 1, wherein each said processing sub-enclosure having defined therein or integrated with multiple nozzle-receiving inlets, each of which is coupled to one said gas nozzle,
    wherein a first set of multiple said gas nozzles are communicatively coupled, at one end, to one or more reservoirs having stored therein same type of one or more component gases that comprise said annealing gas composition and communicatively coupled, at another end, to at least one said processing sub-enclosure serving as at least one annealing sub-enclosure,
    wherein a second set of multiple said gas nozzles are communicatively coupled, at one end, to one or more reservoirs having stored therein same type of one or more component gases that comprise said substrate gas scavenging composition, and communicatively, coupled, at another end, to at least another said annealing sub-enclosure, and
    wherein at least one said annealing sub-enclosure is communicatively coupled with at least another said annealing enclosure to laterally extend and form a part of multiple said processing sub-enclosures.

4. The system for forming graphene of claim 3, wherein said gas distribution subsystem further comprising:
    multiple gas conduits defined inside each of said processing sub-enclosures, and each of said gas conduit includes said nozzle-receiving inlet and a conduit outlet;
    multiple sets of a plurality of gas dispensing apertures defined on a gas dispensing surface of each said processing sub-enclosures, wherein said gas dispensing surface is disposed adjacent to said substrate holder;
    a gas injection plate disposed adjacent to each of said processing sub-enclosures, wherein each said gas injection plate having defined therein multiple gas flow networks, each of which includes a network inlet and a set of a plurality of network outlet apertures, wherein said network inlet is coupled to said conduit outlet and each said set of plurality of said network outlet apertures align with and are coupled to one said set of plurality of said gas dispensing apertures to define multiple material flow paths inside each of said processing sub-enclosures.

5. The system for forming graphene of claim 4, wherein said gas injection plate is not disposed adjacent to said tunnels.

6. The system for forming graphene of claim 4, wherein said gas distribution subsystem further comprising:
    a mass flow control communicatively coupled to one or more reservoirs having stored therein one or more types of component gases that comprise said annealing gas composition and/or said substrate gas scavenging composition and are designed to control incident flow rates of one or more types of said component gas from one or more said reservoirs;
    a control valve communicatively coupled, at one end, to one or more said mass flow controls and communicatively coupled, at another end, to multiple said gas nozzles that are laterally adjacent to each other and communicatively coupled to at least one said processing sub-enclosure,
    wherein, during an operational state of one or more said mass flow controls and one or more said control valves, one or more types of said component gases are conveyed from one or more said reservoirs through multiple said gas nozzles to at least one said processing sub-enclosure that is serving as said annealing sub-enclosure.

7. The system for forming graphene of claim 1, further comprising a linear track for laterally displacing an adjacently disposed said substrate holder comprising a plurality of pallets disposed in series or a continuous belt, wherein one or more said tunnels are disposed adjacent to and around said linear track forming a protective cover around said pallets or said continuous belt.

8. The system for forming graphene of claim 1, further comprising a chiller disposed between one said processing sub-enclosure and one said tunnel, which is proximate to one said processing sub-enclosure, and wherein said chiller is designed to remove a certain amount of heat present inside said processing sub-enclosure that flows towards one or more said tunnels.

9. The system for forming graphene of claim 1, further comprising:
    a chilling plate disposed adjacent to one side of at least one of said tunnel that is positioned proximate to one said processing sub-enclosure; and
    an oxygen concentration detecting sensor disposed at one or more locations inside one or more said tunnels.

10. The system for forming graphene of claim 1, further comprising multiple processing sub-enclosures are contiguously arranged to form a laterally extending enclosure, and
    wherein an annealing range of lateral distance extends a lateral distance of at least one and/or a portion of said processing sub-enclosure serving as an annealing sub-enclosure that is communicatively coupled to one or more said reservoirs having stored therein one or more said component gases of same type and that comprise said annealing gas composition.

11. The system for forming graphene of claim 10, wherein each of said processing sub-enclosures comprising, on a first side, a slidable component and, having defined on a second side that is opposite to said first side, a cavity for receiving said slidable component, such that, in an assembled state of said enclosure, said slidable component of one said processing sub-enclosures engages, at a coupling location, with said cavity for receiving said slidable component of another of said processing sub-enclosures to couple and contiguously arrange said processing sub-enclosures in series.

12. The system for forming graphene of claim 11, wherein, in said assembled state of said enclosure, said coupling location has defined therein an expansion gap that is at least partially occupied by said slidable component extending into said cavity for receiving said slidable component and an unfilled portion of said expansion gap is designed to allow one or more said tunnels to slide upon expansion of said contiguously arranged processing sub-enclosures.

13. The system for forming graphene of claim 1, further comprising multiple furnace sub-structures contiguously arranged to form a laterally extending furnace that has disposed therein said enclosure and one or more laterally extending said heat sources comprising one or more laterally extending heating coils that are positioned outside said enclosure.

14. The system for forming graphene of claim 13, further comprising one or more temperature sensors disposed inside said furnace and designed to measure temperature generated by one or more said heat sources in an operational state.

15. The system for forming graphene of claim 1, further comprising multiple scavenging sub-enclosures contiguously arranged to form a laterally extending infeed portion that includes one or more said tunnels.

16. The system for forming graphene of claim 15, said infeed portion comprising:
    a substrate roll designed to laterally roll out said substrate sheet; and
    a speed matching system designed to match speed of said substrate holder, in a laterally advancing state, with a linear amount of an unrolled portion of said substrate sheet around said substrate roll.

17. The system for forming graphene of claim 15, said infeed portion comprising:
    a substrate roll designed to laterally roll out said substrate sheet; and
    a servo motor communicatively coupled to said substrate roll and designed to facilitate lateral roll out of said substrate roll.

18. The system for forming graphene of claim 17, said infeed portion further comprising a slack loop sensor that is coupled to said servo motor and designed to detect a slack loop of said substrate sheet resulting from said unrolling motion of said substrate roll, wherein said slack loop sensor is designed to control operation of said servo motor and said unrolling motion of said substrate roll to dispense an appropriate amount of said substrate sheet and minimize or prevent said slack loop.

19. The system for forming graphene of claim 15, wherein one or more said heat sources do not laterally extend adjacent to laterally extending said infeed portion or one or more said heat sources that laterally extend adjacent to laterally extending said infeed portion are not active, during an operational state of said infeed portion, to heat said infeed portion.

20. The system for forming graphene of claim 15, said infeed portion comprising:
    a drive system designed to continuously laterally advance said substrate holder, comprising multiple pallets, through at least a substantial portion of said system for forming graphene; and
    one or more rollers designed to feed said multiple pallets towards said drive system.

* * * * *